(12) United States Patent
Hirai et al.

(10) Patent No.: US 8,293,575 B2
(45) Date of Patent: Oct. 23, 2012

(54) MANUFACTURING METHOD OF SEMICONDUCTOR DEVICE

(75) Inventors: Tatsuya Hirai, Kanagawa (JP);
Tomoaki Hashimoto, Kanagawa (JP);
Takashi Kikuchi, Kanagawa (JP);
Masatoshi Yasunaga, Kanagawa (JP);
Michiaki Sugiyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 283 days.

(21) Appl. No.: 12/834,937

(22) Filed: Jul. 13, 2010

(65) Prior Publication Data
US 2011/0076800 A1 Mar. 31, 2011

(30) Foreign Application Priority Data
Sep. 30, 2009 (JP) .................................. 2009-226679

(51) Int. Cl.
*H01L 23/28* (2006.01)
(52) U.S. Cl. ................. 438/107; 438/128; 257/E21.504
(58) Field of Classification Search .................. 438/107, 438/128; 257/E21.504
See application file for complete search history.

(56) References Cited

U.S. PATENT DOCUMENTS

| 6,800,507 B2 * | 10/2004 | Kasuga et al. ................ 438/112 |
| 2004/0175865 A1 * | 9/2004 | Matsunami ................... 438/112 |
| 2005/0196908 A1 * | 9/2005 | Takahashi ..................... 438/127 |
| 2008/0293236 A1 | 11/2008 | Kobayashi | |

FOREIGN PATENT DOCUMENTS
JP 2008-288490 A 11/2008
* cited by examiner

*Primary Examiner* — Mary Wilczewski
*Assistant Examiner* — Toniae Thomas
(74) *Attorney, Agent, or Firm* — Mattingly & Malur, PC

(57) ABSTRACT

The reliability of a semiconductor device is improved. A sealing resin (sealed body) is formed between a sub-substrate (first base member) and a base substrate (second base member) that are provided individually and distinctly to be integrated therewith, and then, the sub-substrate is electrically coupled to the second base member. As a means for electrically coupling the sub-substrate to the base substrate, lands (first lands) formed on the sub-substrate and lands (second lands) formed on the base substrate are disposed such that the respective positions thereof are aligned. After through holes are formed from the lands of the sub-substrate toward the lands of the base substrate, a solder member (conductive member) is formed in each of the through holes.

11 Claims, 37 Drawing Sheets

MANUFACTURING METHOD OF SEMICONDUCTOR DEVICE

CROSS-REFERENCE TO RELATED APPLICATIONS

The disclosure of Japanese Patent Application No. 2009-226679 filed on Sep. 30, 2009 including the specification, drawings and abstract is incorporated herein by reference in its entirety.

BACKGROUND OF THE INVENTION

The present invention relates to a technology for manufacturing an electronic device such as a semiconductor device, and particularly to a technology which is effective when applied to an electronic device (semiconductor device) in which, over the main surface of a base member having an electronic component such as a semiconductor chip mounted thereon, another wiring substrate is further stacked.

In recent years, demand for the miniaturization of an electronic device such as a semiconductor device has increasingly grown stronger. Accordingly, it is assumed that forming each of a plurality of electronic components from one semiconductor device is effective in reducing a mounting region for a semiconductor device, chip components, and the like to be mounted over a mounting substrate (motherboard).

Examples of a structure of such a semiconductor device include one as shown in Japanese Unexamined Patent Publication No. 2008-288490 (Patent Document 1 (FIG. 2D)) in which a second substrate is stacked over a first substrate having chip components mounted thereon, and electronic components are mounted over the second substrate.

PRIOR ART DOCUMENT

Patent Document

[Patent Document 1]
Japanese Unexamined Patent Publication No. 2008-288490

SUMMARY OF THE INVENTION

As a result of studying a manufacturing method of a semiconductor device as shown in Patent Document 1 described above, the present inventors have found that there is the following problem.

In the manufacturing method of Patent Document 1 described above, the second substrate having electrodes for inter-substrate coupling provided on the surface thereof facing to the first substrate is stacked first over the first substrate having the chip components mounted thereon, the electrodes and pads for coupling electrodes formed on the first substrate are bonded to each other, and then a portion separating the individual substrates is filled with a sealing resin.

However, as the semiconductor device becomes higher in functionality and integration, the number of the electrode pads of the electronic components (including a semiconductor chip and the chip components) mounted on the second substrate or the number of the electronic components mounted on the second substrate tends to increase. Accordingly, the number of the electrodes for electrically coupling the second substrate to the first substrate also tends to increase. As a result, electrodes disposed between the individual substrates act as an impediment and narrow a supply path for the sealing resin so that air tends to be easily contained in the supplied sealing resin, and may remain in a sealed body formed by the sealing step. If air remains in the sealed body, the reliability of the manufactured semiconductor device may deteriorate.

The present invention has been achieved in view of the foregoing problem, and an object of the present invention is to provide a technology which can improve the reliability of a semiconductor device.

Another object of the present invention is to provide a technology which allows miniaturization or higher integration of a semiconductor device.

The above and other objects and novel features of the present invention will become apparent from the description of the present specification and the accompanying drawings.

As shown below, a brief description will be given of representative aspects of the invention disclosed in the present application.

That is, in a manufacturing method of a semiconductor device in an embodiment of the present invention, a sealed body is formed between a first base member and a second base member that are provided individually and distinctly to be integrated therewith, and then the first base member is electrically coupled to the second base member. As a means for electrically coupling the first base member to the second base member, first lands formed on the first base member and second lands formed on the second base member are disposed such that the respective positions thereof are aligned. After through holes are formed from the first lands toward the second lands, a conductive member is formed in each of the through holes.

The following is a brief description of effects obtained by the representative aspects of the invention disclosed in the present application.

That is, the reliability of a semiconductor device can be improved.

DETAILED DESCRIPTION OF THE PREFERRED EMBODIMENTS

Figure 1:
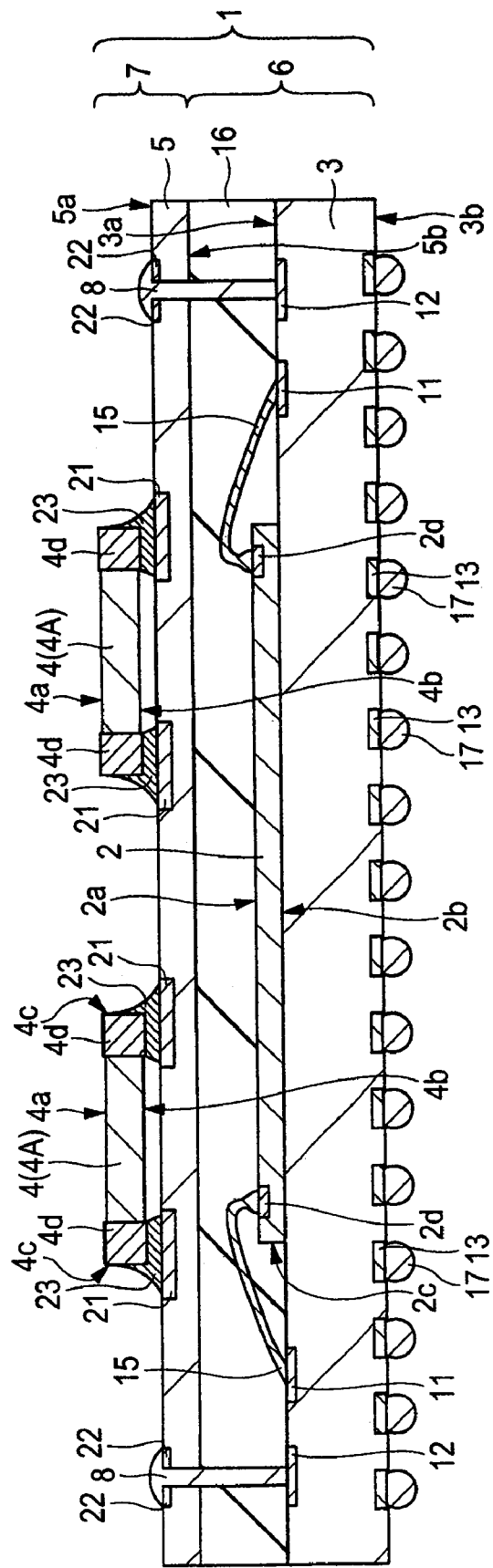
FIG. 1 is a cross-sectional view showing an overall structure of a semiconductor device as an embodiment of the present invention.

Explanation of Description Form, Basic Terminology, and Use Thereof in Present Invention In the present invention, if necessary for the sake of convenience, the description of an embodiment is such that the embodiment is divided into a plurality of sections or the like in the description thereof. However, they are by no means independent of or distinct from each other unless particularly explicitly described otherwise, and one of the individual parts of a single example is details, variations, and so forth of part or the whole of the others irrespective of the order thereof in the description. In principle, a repeated description of like parts will be omitted. Each constituent element in the embodiment is not indispensable unless particularly explicitly described otherwise, unless the constituent element is theoretically limited to a specific number, or unless it is obvious from the context that the constituent element is indispensable.

Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise, or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a silicon germanium (SiGe) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be either more or less than the specific numerical value unless particularly explicitly described otherwise, unless the numerical value or numerical amount is theoretically limited to the number, or unless it is obvious from the context that the numeral value or numerical amount is limited to the number.

Embodiment 1

General Description of Semiconductor Device

In the present embodiment, a Package-On-Package (POP) semiconductor device (hereinafter simply referred to as a POP) in which, over a wiring substrate (base member) having a semiconductor chip mounted thereon, another wiring substrate (base member) having an electronic component mounted thereon is stacked will be described as an example of a semiconductor device in which a plurality of wiring substrates each having an electronic component mounted thereon are stacked.

The POP includes, e.g., a lower-level wiring substrate having an electronic component such as a semiconductor chip mounted thereon, and an upper-level wiring substrate having an electronic component such as another semiconductor chip mounted thereon. By electrically coupling the upper-level wiring substrate to the lower-level wiring substrate via a conductive member, the upper-level electronic component is electrically coupled to the lower-level electronic component to form a system. The POP is mounted on a motherboard (mounting substrate) for external electronic equipment or the like via, e.g., an external terminal provided at the lower surface of the lower-level wiring substrate.

On the other hand, as a semiconductor package in a form different from that of the POP, there is a System-In-Package (SIP) semiconductor device (hereinafter simply referred to as a SIP) in which a plurality of different types of semiconductor chips (e.g., a controller-type chip and a memory-type chip) are mounted over a single wiring substrate to form a system in a single semiconductor package.

Since the POP includes the plurality of wiring substrates, even when the number of the input/output terminals of the semiconductor chip increases as the system increases in multifunctionality, the POP is advantageous in that an amount of signal wiring can be increased compared with that in a SIP occupying the same mounting area. In addition, compared with the SIP, the POP can flexibly respond to small-quantity multi-product manufacturing of the system.

FIG. 1 is a cross-sectional view showing an overall structure of the semiconductor device according to the present embodiment. In FIG. 1, a POP (semiconductor device) 1 is a laminate package having a two-layer structure in which, over a base substrate (wiring substrate, base member, or lower-level base member) 3 having a semiconductor chip 2 mounted thereon, a sub-substrate (wiring substrate, base member, or upper-level base member) 5 having chip components (electronic components, semiconductor chips, or semiconductor devices) 4 mounted thereon is laminated. That is, the POP 1 has a base package (lower-level package) 6 in which the semiconductor chip 2 is mounted on the main surface (top surface or upper surface) 3a of the base substrate 3 and a sub-package (upper-level package) in which the chip components 4 are mounted on the main surface (top surface or upper surface) 5a of the sub-substrate 5. By electrically coupling these plurality of packages to each other via solder members 8 as conductive members, the system is formed.

Note that, in the present embodiment, a description will be given under the definition that a range extending from the back surface 3b of the base substrate 3 to the upper surface of a sealing resin 16 is the base package 6, as shown in FIG. 1.

However, the definition of the base package is not limited thereto. For example, it is also possible to consider a range extending from the back surface 3b of the base substrate 3 to the main surface 5a of the sub-substrate 5 shown in FIG. 1 as the base package. In this case, the base package is a semiconductor device having the embedded semiconductor chip 2 between the plurality of stacked wiring substrates (base substrate 3 and sub-substrate 5). It is also possible for, e.g., solder balls 17 serving as external terminals to be included in the base package.

<Base Package>

Figure 2:
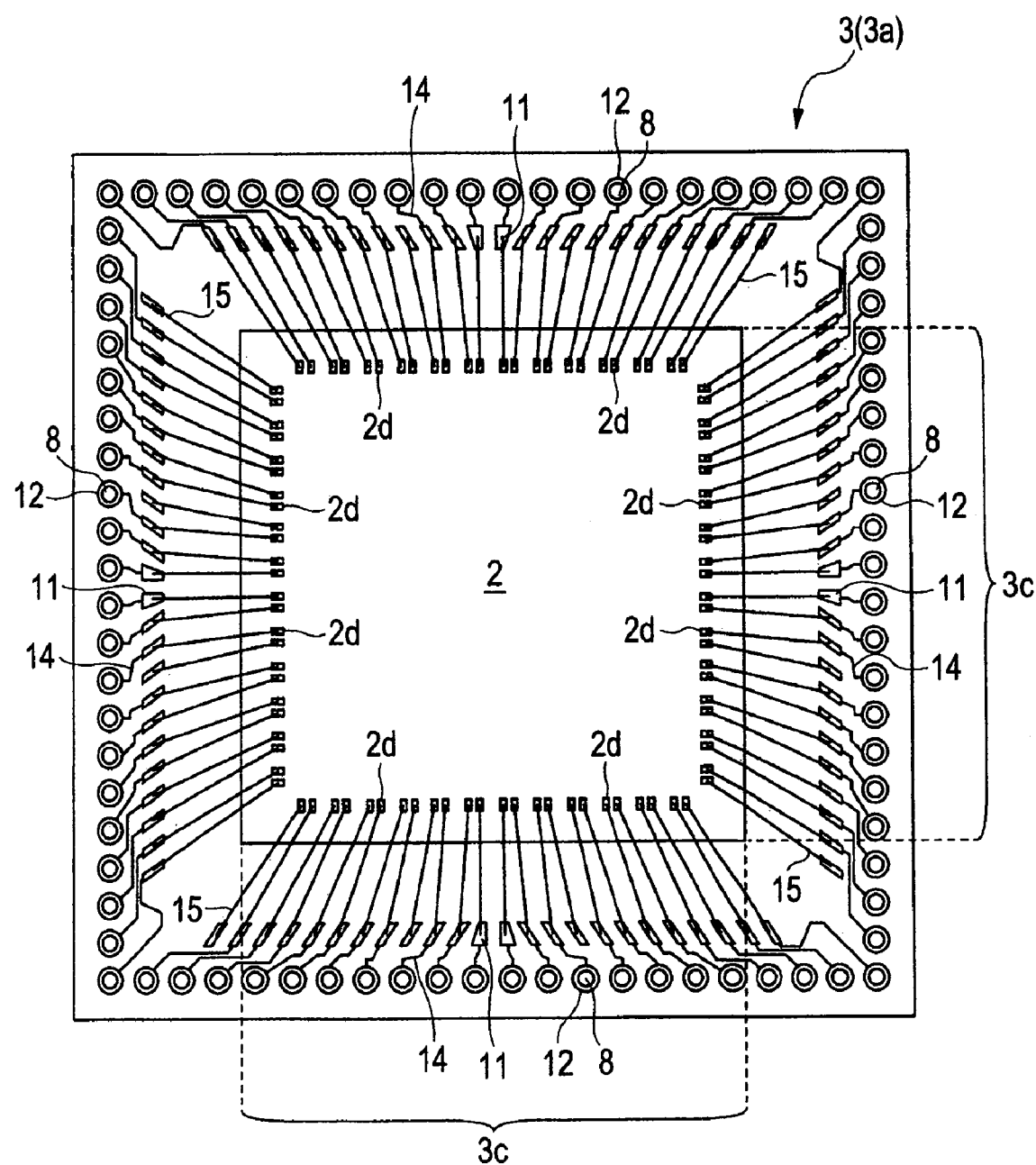
FIG. 2 is a perspective plan view showing an internal configuration of the upper-surface side of the base package shown in FIG. 1.

Next, a description will be given to a structure of the base package 6 shown in FIG. 1. FIG. 2 is a perspective plan view showing an internal configuration of the upper-surface side of the base package shown in FIG. 1. Note that, in the state shown in FIG. 2, the sealing resin 16 shown in FIG. 1 has been removed to show the respective locations of the individual members at the main surface.

The base substrate 3 included in the base package 6 is a multilayer wiring substrate having four wiring layers (top-surface wiring layer, back-surface wiring layer, and two inner wiring layers) manufactured by, e.g., a build-up process. Insulating layers electrically insulating the individual wiring layers from each other are each formed of, e.g., a pre-preg in which a glass fiber or carbon fiber is impregnated with a resin. The four-layer wiring is formed of a conductive film made mainly of, e.g., copper (Cu). In FIG. 1, the depiction of these wiring layers is omitted, and only terminals (electrode pads or bonding leads) 11 and lands (terminals or inter-substrate coupling terminals) 12 each formed at the main surface 3a of the base substrate 3, and external input/output lands (terminals or electrode pads) 13 formed at the lower surface (back surface) 3b of the base substrate 3 are shown.

As shown in FIG. 2, the main surface 3a of the base substrate 3 has a quadrilateral two-dimensional shape, which is a square in the present embodiment. At the main surface 3a of the base substrate 3, formed are the plurality of terminals (electrode pads or bonding leads) 11, a plurality of wires 14 electrically coupled individually to the terminals 11, and the plurality of lands 12 electrically coupled to the terminals 11 via the plurality of wires 14. The terminals 11 are disposed around a chip mounting region 3c (i.e., around the semiconductor chip 2) of the main surface 3a. In the present embodiment, the plurality of terminals 11 are formed along each of the sides of the semiconductor chip 2 having the quadrilateral two-dimensional shape. The plurality of lands 12 are disposed closer to the peripheral portion of the main surface 3a than the terminals 11, i.e., outwardly of the semiconductor chip 2. In the present embodiment, the lands 12 are arranged along each of the sides of the main surface 3a of the base substrate 3 having the quadrilateral two-dimensional shape. To the plurality of lands 12, the plurality of solder members 8 are bonded individually so that the base substrate 3 is electrically coupled to the sub-substrate 5 via the solder members 8. Note that the details of the solder members 8 will be described later.

On the other hand, the lower surface (back surface) 3b of the base substrate 3 shown in FIG. 1 has a quadrilateral two-dimensional shape, which is, e.g., a square of the same size as that of the main surface 3a in the present embodiment. At the back surface 3b, formed are the plurality of lands 13 electrically coupled to the terminals 11 or the lands 12 formed at the main surface 3a via the wiring layers of the base substrate 3, though not shown. On (or to) the plurality of lands 13, the plurality of solder balls 17 serving as bonding members when the POP 1 is mounted on a mounting substrate not shown are placed (or bonded) individually.

The solder balls 17 are each made of a so-called lead-free solder which does not substantially contain lead (Pb), and contains only tin (Sn), a tin (Sn)-bismuth (Bi) alloy, a tin (Sn)-silver (Ag)-copper (Cu) alloy, or the like. Here, the lead-free solder indicates a solder in which the content of lead (Pb) is not more than 0.1 wt %. The content is determined as a standard in Restriction of Hazardous Substances (RoHs) Directive. In the present embodiment, when a solder or solder ball is described, it indicates a lead-free solder unless particularly explicitly described otherwise.

On the chip mounting region 3c of the main surface 3a of the base substrate 3, the semiconductor chip 2 is mounted as a chip component. As shown in FIG. 1, the semiconductor chip 2 has a main surface 2a, a back surface 2b located on the opposite side of the main surface 2a, and side surfaces 2c located between the main surface 2a and the back surface 2b. Each of the main surface 2a and the back surface 2b has a quadrilateral two-dimensional shape, which is, e.g., a square in the present embodiment.

At the main surface 2a of the semiconductor chip 2, formed are a plurality of semiconductor elements such as a transistor and a diode. The individual semiconductor elements are electrically coupled to each other via wiring (in-chip wiring) not shown to form an integrated circuit. Also at the main surface 2a, formed are a plurality of pads (electrode pads) 2d electrically coupled to the integrated circuit along each of the sides forming the outer periphery of the main surface 2a. The pads 2d are arranged so as to surround a circuit formation region where the integrated circuit is formed, and electrically coupled to the integrated circuit via the in-chip wiring mentioned above.

As shown in FIG. 1, the semiconductor chip 2 is mounted over the base substrate 3 by a so-called face-up mounting method which fixes the semiconductor chip 2 onto the base substrate 3 via an adhesive material not shown such that the back surface 2b faces to the main surface 3a of the base substrate 3.

The plurality of pads 2d formed at the main surface 2a of the semiconductor chip 2 are electrically coupled individually to the plurality of terminals 11 formed at the main surface 3a of the base substrate 3 via a plurality of wires (conductive members) 15 made of, e.g., gold (Au).

Between the main surface 3a of the base substrate 3 and the back surface 5b of the sub-substrate 5, disposed is the sealing resin (sealed body) 16. The semiconductor chip 2 and the plurality of wires 15 are sealed with the sealing resin 16.

<Sub-Package>

Figure 13:
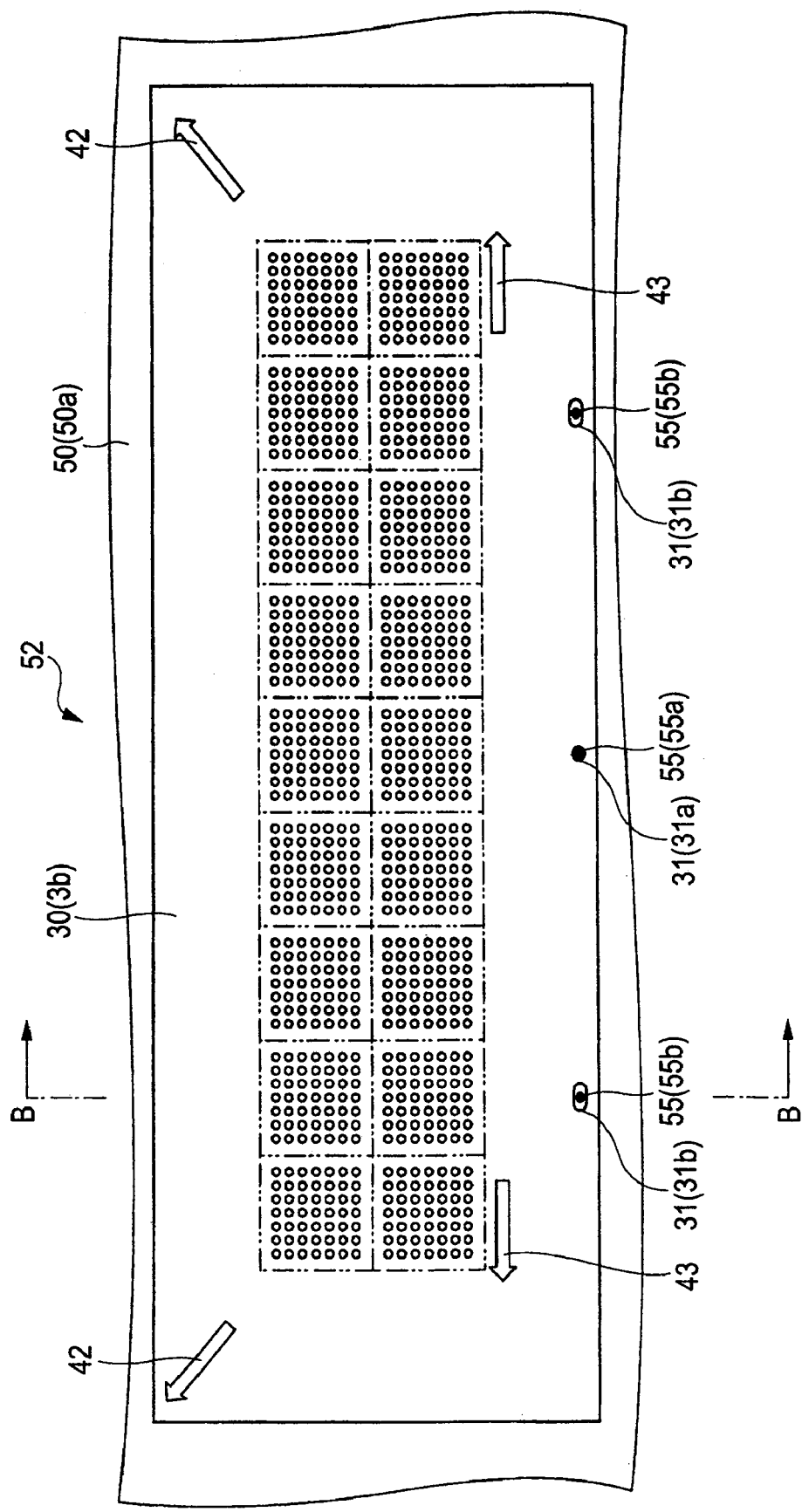
FIG. 13 is a main-portion enlarged plan view showing a state where the wiring substrate shown in FIGS. 4 and 5 is placed in the lower mold of the mold die shown in FIG. 11.

Next, a description will be given to a structure of the sub-package T shown in FIG. 1. FIG. 13 is a plan view showing the upper-surface side of the sub-package shown in FIG. 1.

Figure 3:
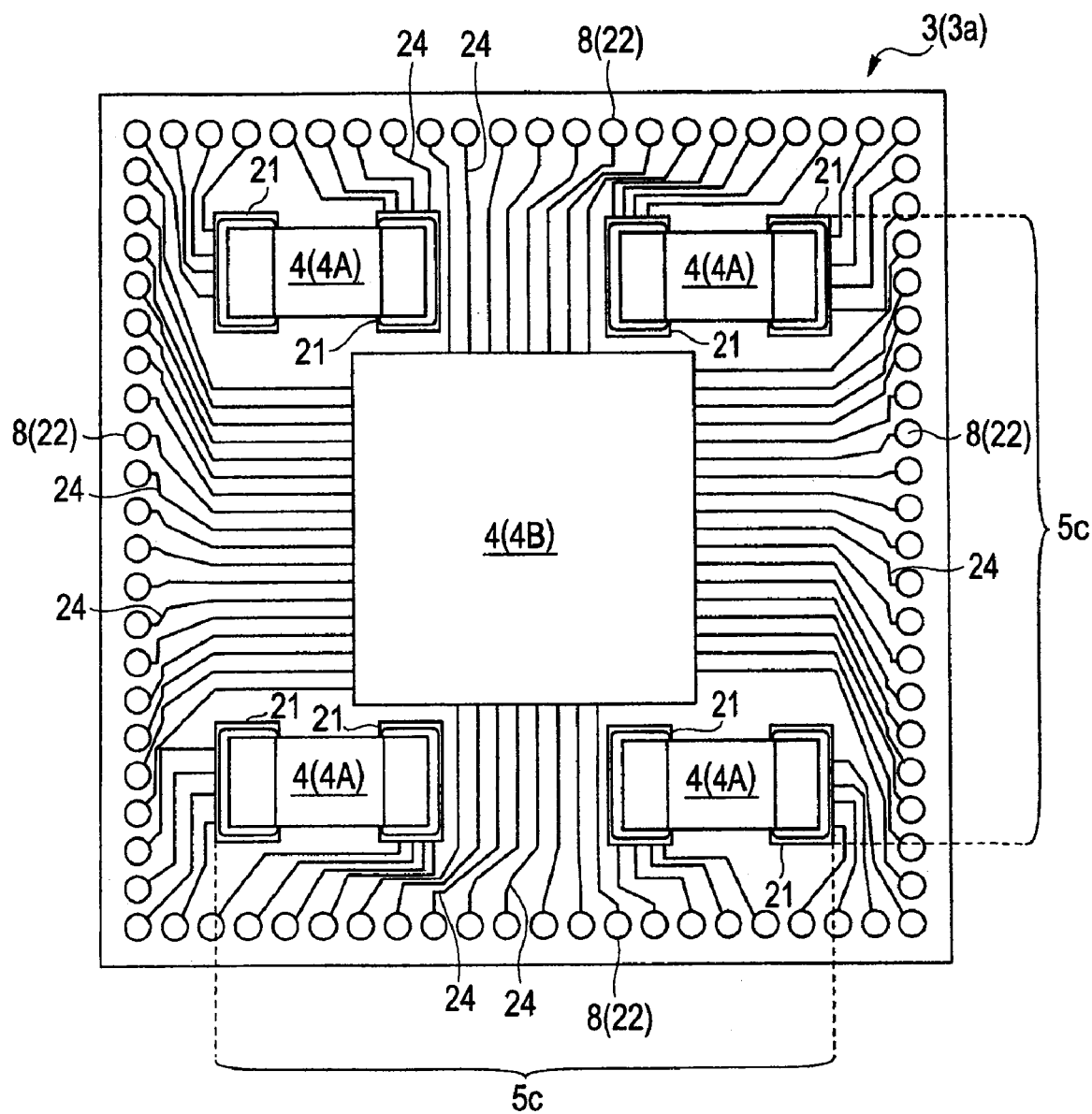
FIG. 3 is a plan view showing the upper-surface side of the sub-package shown in FIG. 1.

The sub-substrate 5 included in the sub-package 7 is comprised of a resin substrate using, e.g., a glass epoxy resin or the like for an insulating layer. As shown in FIG. 3, the main surface 5a of the sub-substrate 5 has a quadrilateral two-dimensional shape of the same size as that of, e.g., the main surface 3a of the base substrate 3 shown in FIG. 2. At the main surface 5a of the sub-substrate 5, formed are a plurality of terminals (bonding leads or electrode pads) 21, a plurality of wires 24 electrically coupled individually to the terminals 21, and a plurality of lands 22 electrically coupled to the terminals 21 via the plurality of wires 24. As shown in FIG. 1, the thickness of the base substrate 3 is larger than the thickness of the sub-substrate 5. The base substrate is a substrate having the external terminals of the POP 1, and requires a wiring routing space larger than that required by the sub-substrate 5 for the routing of a large number of wires. To satisfy the requirement, four, e.g., or more wiring layers are formed in the base substrate 3 to reserve the wiring routing space, while inhibiting an increase in two-dimensional area, so that the base substrate 3 is thick. On the other hand, the sub-substrate 5 is a substrate mounted over the base substrate 3, and therefore the wiring routing space therein can be reduced to be smaller than that in the base substrate 3. Accordingly, the number of wiring layers in the sub-substrate 5 is smaller than that in the base substrate 3. In the present embodiment, the sub-substrate 5 is a simple wiring substrate having. e.g., one wiring layer at the main surface 5a.

In the sub-substrate 5, the plurality of terminals 21 are arranged in a chip component mounting region 5c of the main surface 5a in accordance with the layout of the chip components 4. In the example shown in the present embodiment, the plurality of chip components 4 are mounted so that the plurality of terminals 21 are formed for the individual chip components 4. On the plurality of terminals 21, the chip components 4 are mounted individually, and a plurality of terminals (electrodes) 4d included in the chip components 4 are electrically coupled to the terminals 21 via solder members 23 serving as conductive members.

Here, each of the chip components 4 is an electronic component having a passive element, an active element, an integrated circuit, or the like formed therein, and has electrode terminals which are surface-mounted on terminals (bonding leads) formed over a wiring substrate serving as a base member to be mounted via conductive members. Examples of the chip components 4 that can be listed include a passive element component such as a chip resistor, a chip capacitor, or an inductor, an active element component such as an amplifier or a rectifier, and an integrated circuit component such as a semiconductor chip or a semiconductor device. In FIG. 1, a chip component 4A is shown as an example which has an upper surface 4a, a lower surface 4b located on the opposite side of the upper surface 4a, side surfaces 4c located between the tipper surface 4a and the lower surface 4b, and the terminals 4d formed on the two facing side surfaces 4c. In FIG. 3, in addition to the chip component 4A, a chip component 4B is also shown as an example which has a main surface, a back surface located on the opposing side of the main surface, and a plurality of electrode pads (the depiction of which is omitted) formed at the main surface. The chip component 4B is mounted by a so-called face-down mounting method which electrically couples the chip component 4B to the terminals (bonding leads or electrode pads, the depiction of which is omitted) formed at the main surface 5a of the sub-substrate 5 via conductive members such as solder members with the main surface of the chip component 4B facing to the main surface 5a of the sub-substrate 5. As an example of the chip component 4B, a so-called Wafer Process Package (WPP) can be shown which has a main surface, a back surface located on the opposite side of the main surface, a plurality of electrode pads formed at the main surface, and external terminals electrically coupled to the electrode pads via a redistribution wiring layer formed over the main surface. However, the shape and mounting form of the chip component 4 are not limited to the form shown in FIGS. 1 and 3. Depending on the type of the chip component 4, various variations can be used appropriately. For example, it is also possible that a so-called Ball Grid Array (BGA) semiconductor device (semiconductor package) in which a semiconductor chip is mounted on the main surface of a wiring substrate, and solder balls serving as external terminals are formed at the back surface thereof opposing to the main surface or a Quad Flat Package (QFP) in which a semiconductor chip is mounted on the chip mounting portion of a lead frame, and parts of leads are exposed from a sealed body may be mounted as the chip component 4 on the main surface 5a of the sub-substrate 5.

The plurality of lands 22 electrically coupled individually to the plurality of terminals 21 are disposed closer to the peripheral portion of the main surface 3a than the terminals 21, i.e., outwardly of the chip component mounting region 5c. In the present embodiment, the plurality of lands 22 are arranged along each of the sides of the main surface 5a of the sub-substrate 5 having a quadrilateral two-dimensional shape. The lands 22 are formed at positions overlapping the lands 12 formed on the base substrate 3 which is the lower-level wiring substrate in the thickness direction. To the plurality of lands 22, the plurality of solder members 8 are bonded individually so that the base substrate 3 is electrically coupled to the sub-substrate 5 via the solder members 8.

On the other hand, the lower surface (back surface) 5b of the sub-substrate 5 has a quadrilateral two-dimensional shape of the same size as that of, e.g., the main surface 3a of the base substrate 3 shown in FIG. 2. In general, in a POP semiconductor device, lands electrically coupled to the upper surface of a wiring substrate disposed on an upper level are formed at the lower surface thereof, and the lands are electrically coupled to lands formed at a lower-level wiring substrate via solder balls (see, e.g., Patent Document 1 described above).

However, in the present embodiment, the solder members 8 serving as the conductive members are formed by being buried in through holes formed from the main surface 5a of the sub-substrate 5 toward the main surface 3a of the base substrate 3 (specifically from the lands 22 formed at the main surface 5a of the sub-substrate 5 toward the lands 12 formed at the main surface 3a of the base substrate 3), as shown in FIG. 1. Therefore, no wire or no land is formed at the back surface 5b. That is, as described above, the sub-substrate 5 is a one-layer (single-layer) wiring substrate which has the wiring layer at the main surface 5a thereof, and has no wiring layer at the back surface 5b thereof. By thus providing the sub-substrate 5 with a simple wiring structure, it is possible to increase the efficiency of the manufacturing process of the sub-substrate 5. In addition, the material cost and processing cost of the sub-substrate 5 can be reduced.

However, depending on the wiring layout of the sub-substrate 5, it may be preferable in terms of reserving a wiring routing space to form a wiring layer also at the back surface 5b, and implement a two-layer substrate or a multilayer substrate including two or more layers. In this case, the sub-substrate 5 may also be formed as a multilayer substrate, not a single-layer substrate.

Additionally, in the present embodiment, the back surface 5b of the sub-substrate 5 is in close contact with and fixed to the sealing resin 16. That is, the sub-substrate 5 is adhesively fixed to the sealing resin 16, thereby forming a structure integral with the base package 6. Forming no wiring layer at the back surface 5b described above is also preferable in terms of improving the adherence between the sealing resin 16 and the sub-substrate 5. Thus, the base package 6 and the sub-substrate 5 disposed on the level thereover each forming the POP 1 has an integral structure. Therefore, it is also possible to use the POP 1 as a wiring substrate having the semiconductor chip (chip component or electronic component) 2 embedded therein.

<Manufacturing Method of Semiconductor Device>

Next, a description will be given to a manufacturing method of the semiconductor device according to the present embodiment. The manufacturing method of the semiconductor device according to the present embodiment has a base-member providing step of providing each of base members corresponding to the base package 6 (except for the sealing resin 16) and the sub-substrate 5. The manufacturing method of the semiconductor device according to the present embodiment also has a sealing step of placing the base package 6 and the sub-substrate 5 in spaced-apart relation, supplying a resin between the main surface 3a of the base substrate 3 and the back surface 5b of the sub-substrate 5, and forming the sealing resin 16. The manufacturing method of the semiconductor device according to the present embodiment also has an electrical coupling step of, after forming the sealing resin 16, forming the through holes from the main surface 5a of the sub-substrate 5 toward the upper surface of the base substrate 3, and forming the conductive members in the through holes to electrically couple the sub-substrate 5 to the base substrate 3.

A characteristic feature of the manufacturing method of the semiconductor device according to the present embodiment is that the sealed body is formed between the base substrate and the sub-substrate that are provided individually and distinctly to be integrated therewith, and then the base substrate is electrically coupled to the sub-substrate. Another characteristic feature of the present embodiment is that, as a means for electrically coupling the base substrate to the sub-substrate, the terminals (lands) of the sub-substrate and the terminals (lands) of the base substrate are disposed such that the respective positions thereof are aligned, the through holes are formed from the terminals of the sub-substrate toward the terminals of the base substrate, and then the conductive members are formed in the through holes.

As in Patent Document 1 described above, when the electrodes are coupled to the pads for coupling the electrodes using a solder, a cleaning step is needed. However, in the case where a chip component (or a semiconductor chip) is preliminarily mounted on the first substrate, and the chip component is electrically coupled to the first substrate via wires, the wires may be deformed by the cleaning step to incur short circuits with adjacent wires.

On the other hand, according to the present embodiment, the semiconductor chip and the wires electrically coupled thereto are protected by the sealed body so that a cleaning step need not be performed. Therefore, it is possible to prevent the deformation of the wires.

When a glass-epoxy-type resin substrate is used, outgas is generated from the substrate under the influence of heat for bonding the electrodes to pads for coupling bumps, and contaminates a surface of the substrate. The surface contaminated by the outgas can be purified by, e.g., applying a plasma thereto. However, when outgas is generated after the first substrate and the second substrate are bonded to each other via the electrodes as in Patent Document 1 described above, it is difficult to apply a plasma to facing surfaces (the upper surface of the first substrate and the lower surface of the second substrate in FIG. 1E of Patent Document 1 described above) between which a sealing resin is supplied. As a result, the adherence between the sealing resin supplied between the individual substrates and each of the substrates deteriorates, and a gap is formed between the sealed body formed by the sealing step and the surface of each of the substrates to degrade the reliability of the semiconductor device.

On the other hand, according to the present embodiment, the step of electrically coupling the base substrate to the sub-substrate is performed after the sealing step. As a result, it is possible to prevent the contamination of the surfaces of the base substrate and the sub-substrate which face to each other. Even if the main surface of the base substrate or the back surface of the sub-substrate is contaminated by outgas generated under the influence of heat in the base-member providing step of providing the base substrate and the sub-substrate, as long as the sealed body is not formed yet, it is possible to easily purify the contaminated surface by applying a plasma thereto.

When the sealed body is formed between the individual substrates in a state where the first substrate is electrically coupled to the second substrate in advance, it follows that warpage occurred in one of the substrates under the influence of heat affects the other substrate. As a result, the degree of warpage increases under the influence of warpage occurred in each of the substrates so that misalignment is likely to occur between the respective two-dimensional positions of the individual substrates.

On the other hand, in the present embodiment, the base substrate and the sub-substrate are independent till the step of forming the sealed body between the two substrates so that warpage occurred in one of the substrates does not affect the other substrate. This can reduce the degree of warpage, and make misalignment less likely to occur between the respective two-dimensional positions of the individual substrates.

Hereinbelow, the individual process steps of the manufacturing method of the semiconductor device according to the present embodiment will be successively described in detail.

Figure 4:
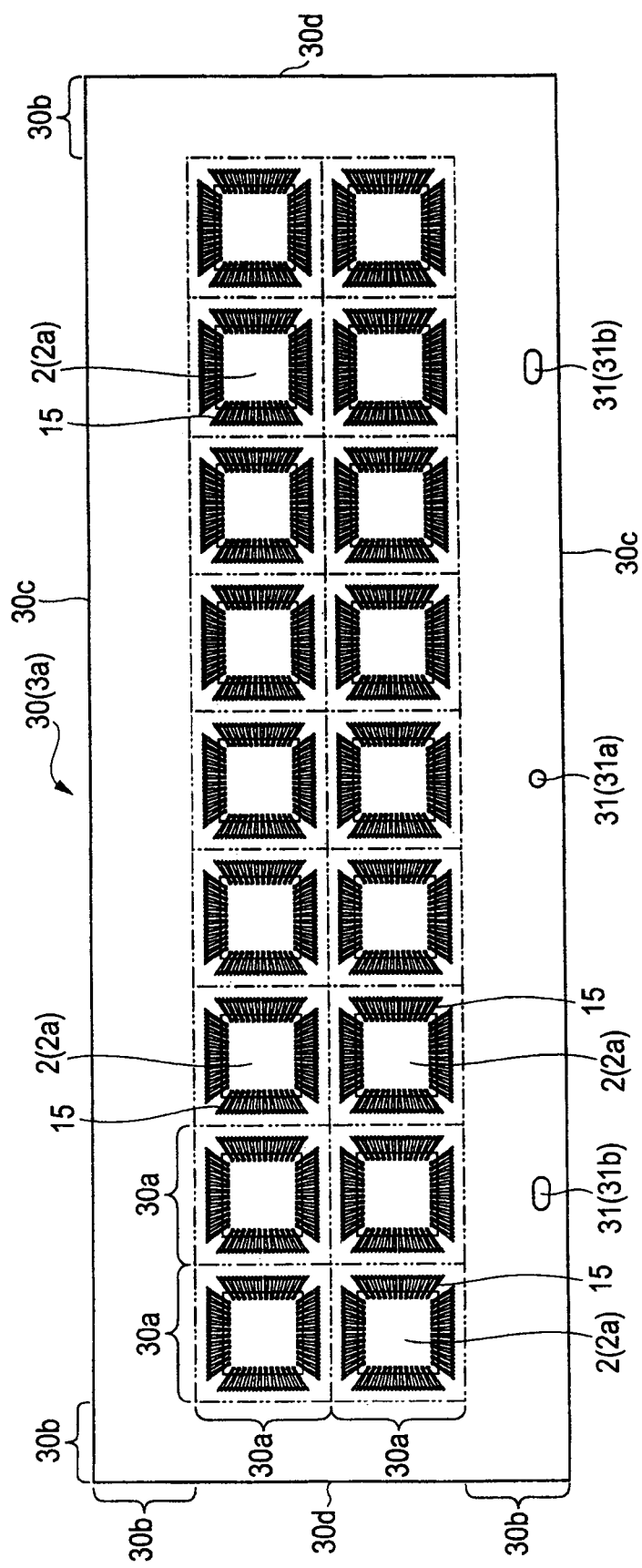
FIG. 4 is a plan view showing an overall configuration of the main surface of a wiring substrate provided in a base-member providing step.
Figure 5:
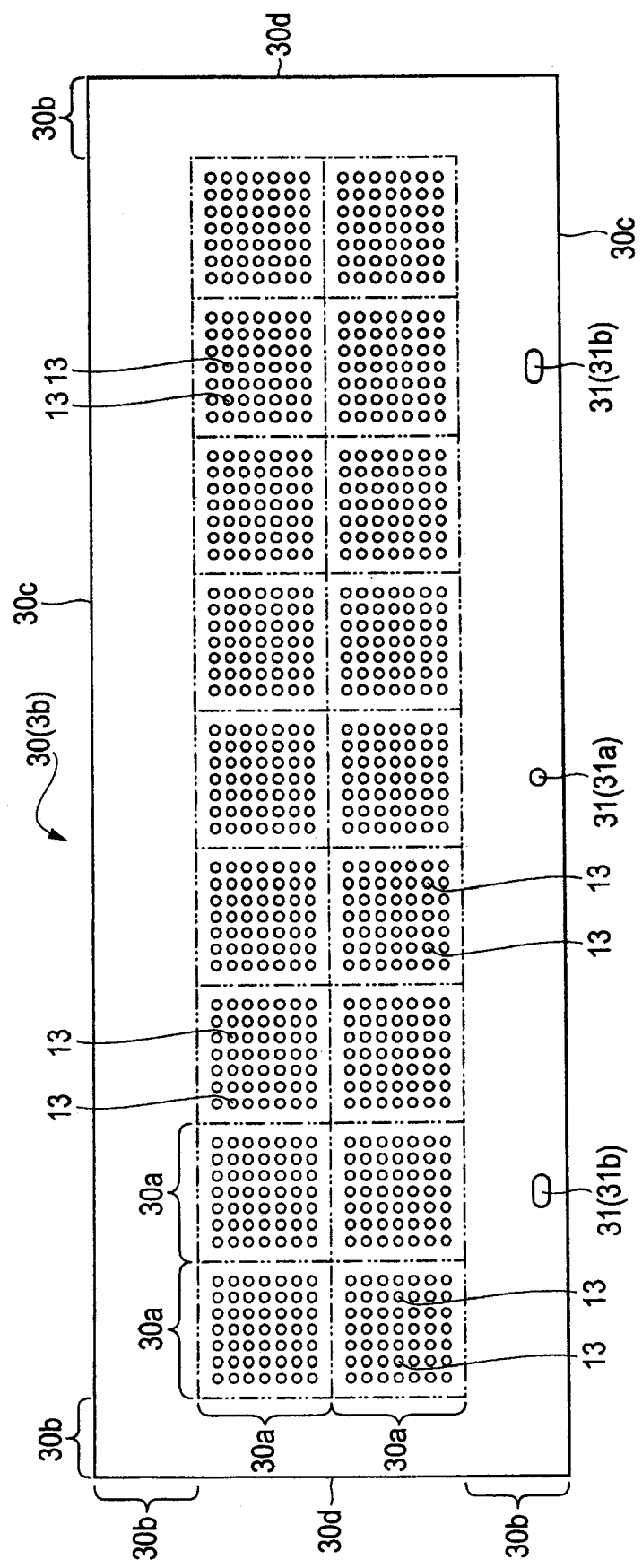
FIG. 5 is a plan view showing an overall configuration of the back surface of the wiring substrate shown in FIG. 4.
Figure 6:
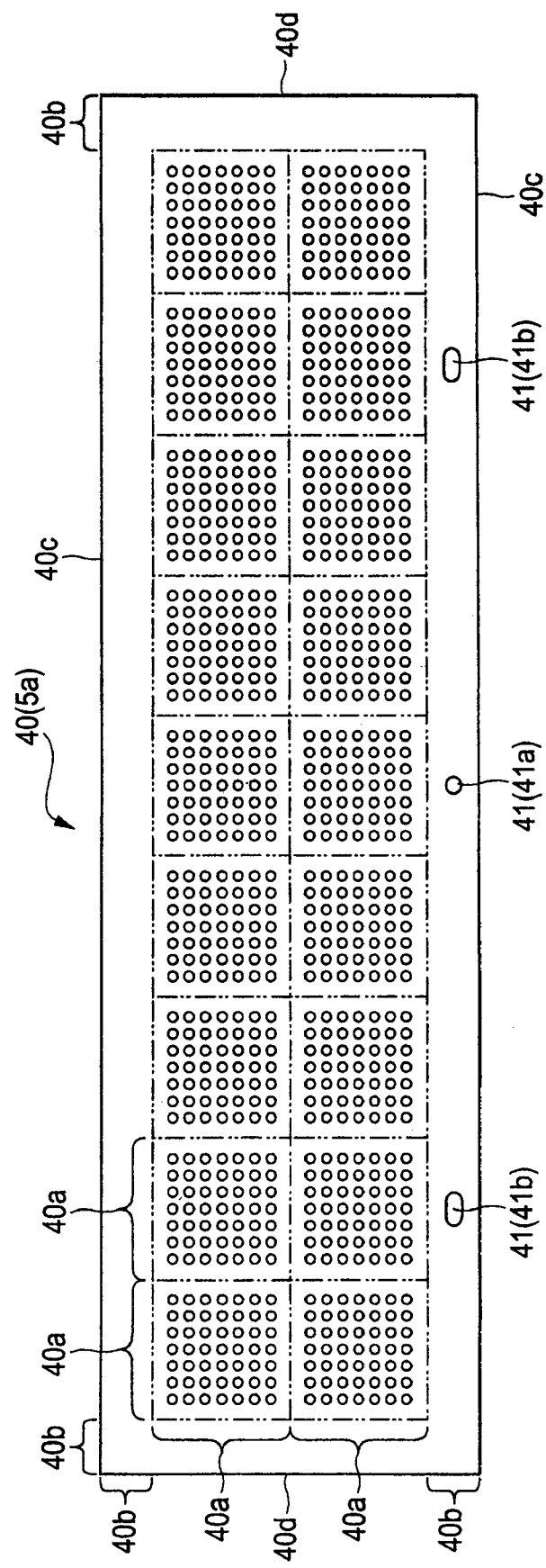
FIG. 6 is a plan view showing an overall configuration of the main surface of another substrate provided in the base-member providing step.
Figure 7:
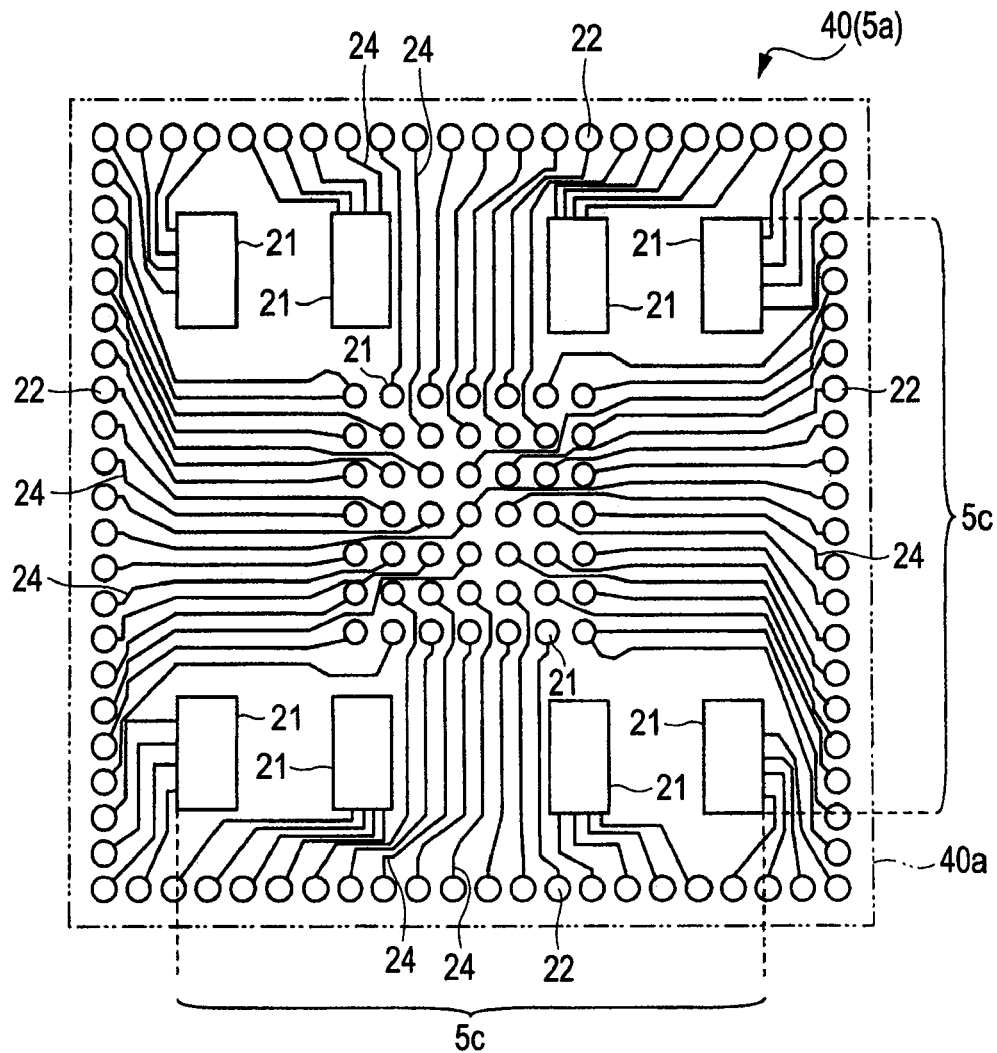
FIG. 7 is an enlarged plan view showing one of the product formation regions of the wiring substrate shown in FIG. 6 in enlarged relation.
Figure 8:
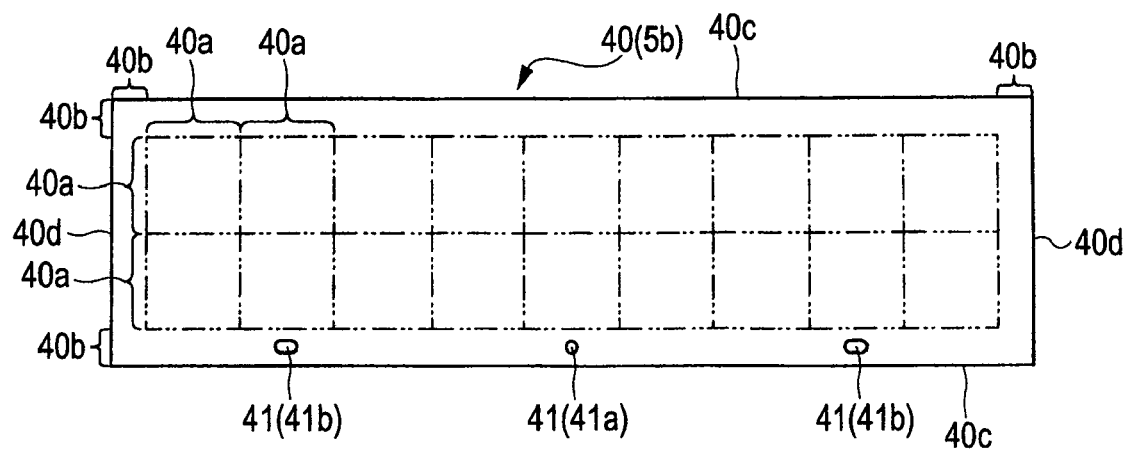
FIG. 8 is a plan view showing an overall configuration of the back surface of the wiring substrate shown in FIG. 6.

First, in the base-member providing step, the base member corresponding to the base member 3 having the semiconductor chip (electronic device) 6 mounted on the main surface (upper surface) thereof and the wiring substrate (base member) corresponding to the sub-substrate 5 are provided individually. FIG. 4 is a plan view showing an overall configuration of the main surface of the wiring substrate provided in the base-member providing step. FIG. 5 is a plan view showing an overall configuration of the back surface of the wiring substrate shown in FIG. 4. FIG. 6 is a plan view showing an overall configuration of the main surface of another substrate provided in the base-member providing step. FIG. 7 is an enlarged plan view showing one of the product formation regions of the wiring substrate shown in FIG. 6 in enlarged relation. FIG. 8 is a plan view showing an overall configuration of the back surface of the wiring substrate shown in FIG. 6.

As shown in FIGS. 4 to 8, a base member (base member, wiring substrate, or multi-piece wiring substrate) 30 and a sub-substrate (base member, wiring substrate, or multi-piece wiring substrate) 40 are matrix substrates (multi-piece substrates) in which a plurality of product formation regions 30a and 40a are arranged respectively in, e.g., rows and columns. Each of the product formation regions 30a of the base substrate 30 corresponds to the base substrate 3 shown in FIG. 2. Each of the product formation regions 40a of the sub-substrate 40 corresponds to the sub-substrate 5 shown in FIG. 3. The base substrate 30 and the sub-substrate 40 have frame portions 30b and 40b surrounding the peripheries of areas where the plurality of product formation regions 30a and 40a are disposed. In other words, the product formation regions 30a and 40a are disposed inwardly of the frame portions 30b and 40b in the planes of the main surfaces 3a and 5a or the back surfaces 3b and 5b.

Each of the product formation regions 30a included in the base substrate 30 has the upper surface (main surface) 3a, the plurality of terminals (bonding leads or electrode pads) 11 formed at the main surface 3a, the plurality of wires 14 formed at the main surface 3a and electrically coupled individually to the plurality of terminals 11, the lands 12 disposed closer to the peripheral portion of the product formation region 30a than the plurality of terminals 11 and electrically coupled to the plurality of wires 14, the lower surface (back surface) 3b located on the opposite side of the main surface 3a, and the lands 13 formed at the back surface 3b and electrically coupled to the lands 12 or the terminals 11 which have been each described using FIG. 1 or FIG. 2. On the main surface 3a, the semiconductor chip 2 is mounted by a so-called face-up mounting method which bonds the back surface 2b and the main surface 3a to each other in facing relation via an adhesive material not shown. The plurality of pads 2d (see FIG. 2) formed at the main surface 2a of the semiconductor chip 2 are electrically coupled to the plurality of terminals 11 (see FIG. 2) via the plurality of wires 15. For a die bonding step of mounting the semiconductor chip 2 over the main surface 3a and a wire bonding step of electrically coupling the plurality of pads 2d to the plurality of terminals 11 via the plurality of wires 15, known methods can be used so that a detailed description thereof is omitted.

At the stage of the present step, the sealing resin 16 shown in FIG. 1 has not been formed so that the main surface 3a of the base substrate 3 is exposed. The solder members 8 shown in FIGS. 1 and 2 have not been formed, either. In addition, the solder balls 17 shown in FIGS. 1 and 2 have not been formed, either, so that the lands 13 are exposed at the back surface 3b.

In the frame portion 30b of the base substrate 30, a plurality of hole portions 31 are formed. Each of the main surface 3a and the back surface 3b of the base substrate 30 has a quadrilateral two-dimensional shape (which is a rectangle in the present embodiment), and has long sides 30c facing to each other and short sides 30d opposing each other. In the present embodiment, the plurality of hole portions 31 are arranged along one of the long sides 30c included in the four sides. The hole portions 31 are holes for aligning the base substrate 30 and the sub-substrate 40 in the sealing step described later. In the present embodiment, the hole portions 31 are through holes extending from the main surface 3a toward the back surface 3b through the base substrate 30. Note that the locations and shapes of the hole portions 31 will be described in detail when the sealing step is described.

On the other hand, as shown in FIGS. 6 to 8, each of the product formation regions 40a included in the sub-substrate 40 has the upper surface (main surface) 5a, the plurality of terminals (bonding leads or electrode pads) 21 formed at the main surface 5a, the plurality of wires 24 formed at the main surface 5a and electrically coupled individually to the plurality of terminals 21, the lands 22 disposed closer to the peripheral portion of the product formation region 40a than the plurality of terminals 21 and electrically coupled to the plurality of wires 24, and the lower surface (back surface) 5b located on the opposite side of the main surface 5a.

At the stage of the present step, the chip components 4 (see FIG. 1) have not been mounted on the main surface 5a of the sub-substrate 40, as shown in FIG. 7, so that each of the terminals 21 is exposed. As shown in FIG. 8, the back surface 5b of the sub-substrate 5 according to the present embodiment is not formed with a wire, a terminal, or the like, and is covered with an insulating material.

In the same manner as in the base substrate 30 described above, a plurality of hole portions 41 are formed in the frame portion 40b of the sub-substrate 40. Each of the main surface 5a and the back surface 5b of the sub-substrate 40 has a quadrilateral two-dimensional shape (which is a rectangle in the present embodiment), and has long sides 40c facing to each other and short sides 40d facing to each other. In the present embodiment, the plurality of hole portions 41 are arranged along one of the long sides 40c included in the four sides. The hole portions 41 are holes for aligning the base substrate 30 and the sub-substrate 40 in the sealing step described later. In the present embodiment, the hole portions 41 are through holes extending from the main surface 5a toward the back surface 5b through the sub-substrate 40. Note that the locations and shapes of the hole portions 41 will be described in detail when the sealing step is described.

Note that, as described above, outgas may be generated from the base substrate 30 under the influence of heat in, e.g., the die bonding step, the wire bonding step, or the like and contaminate the main surface of the base substrate 30. In this case, after the base substrate 30 is provided and prior to the sealing step described later, it is preferable to apply a plasma to the main surface 3a to purify the main surface 3a. This can inhibit a reduction in the adherence between the main surface 3a and the sealing resin in the sealing step. Likewise, it is also preferable to apply a plasma to the back surface 5b of the sub-substrate 40 serving as an adhering surface to the sealing resin in the present step to purify the back surface 5b.

Figure 9:
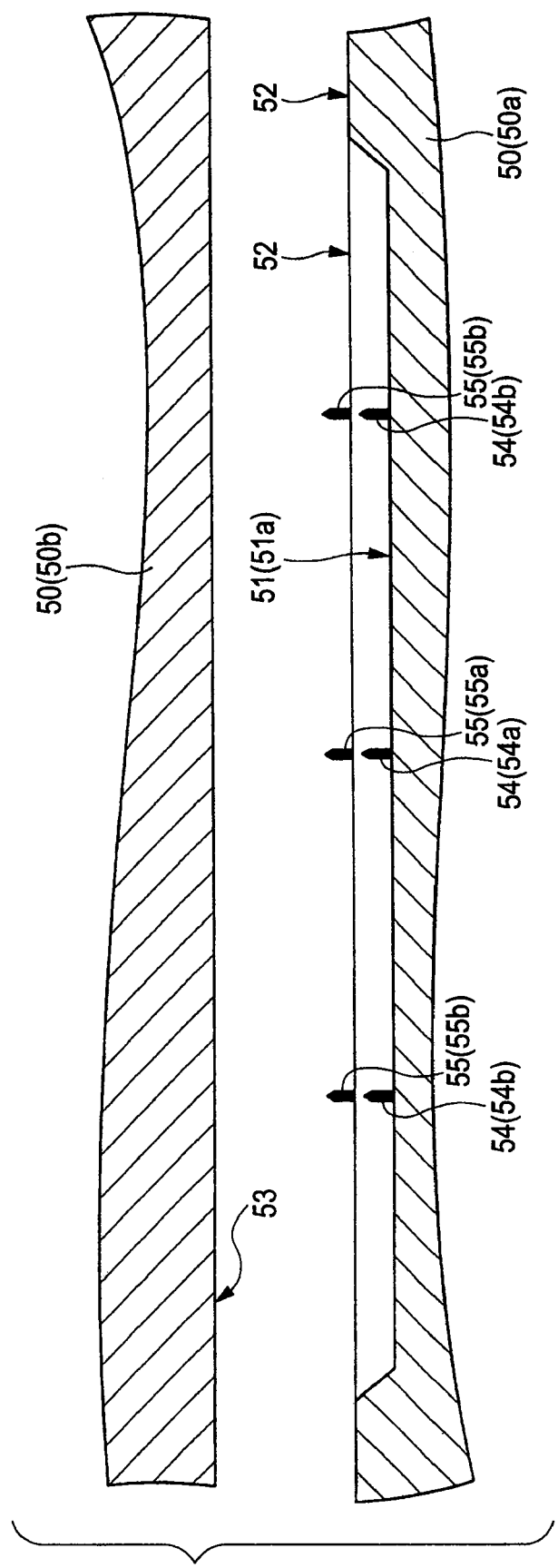
FIG. 9 is a main-portion enlarged cross-sectional view showing the main portion of a mold die provided in a sealing step.
Figure 10:
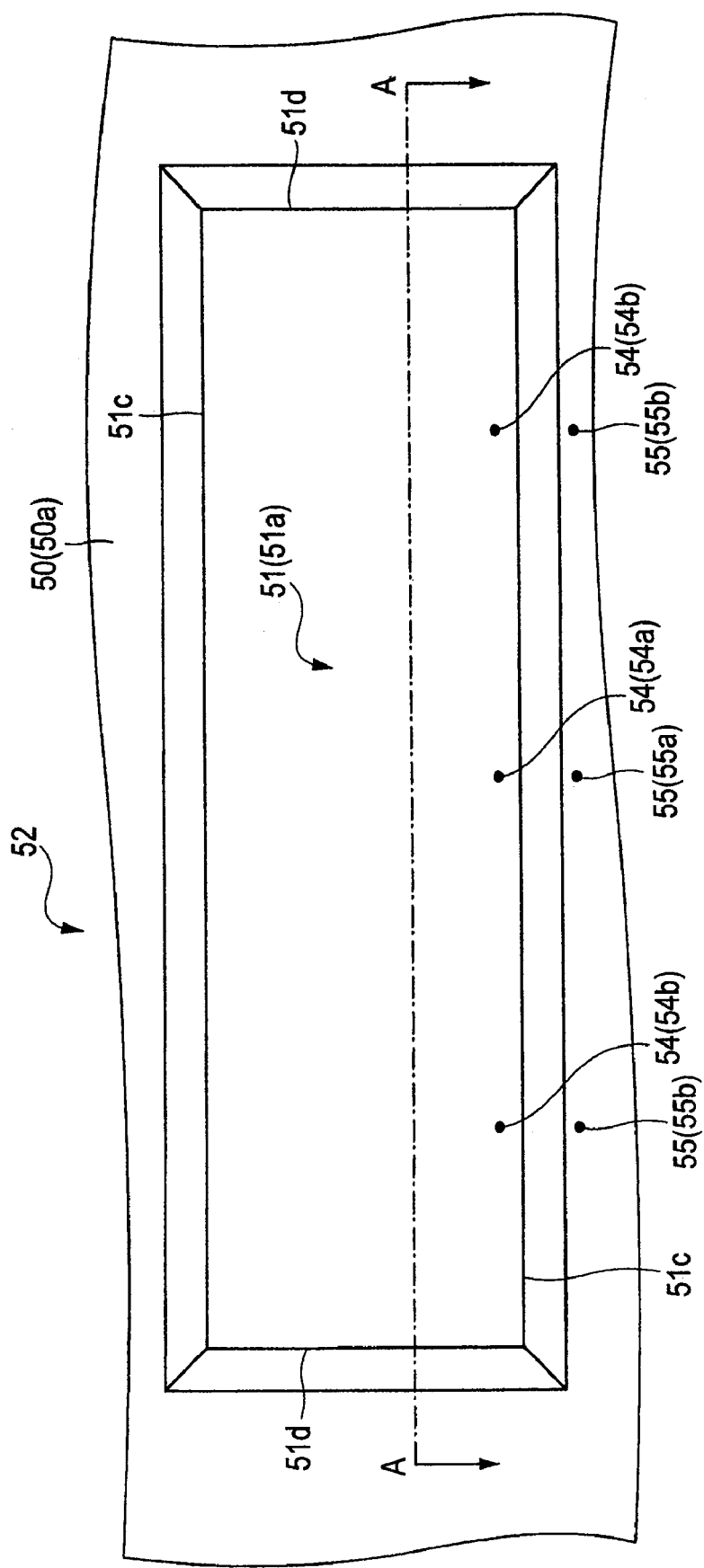
FIG. 10 is a main-portion enlarged plan view showing a configuration of the upper-surface side of the lower mold shown in FIG. 9.

Next, the sealing step will be described. The sealing step includes a die providing step of providing a mold die. FIG. 9 is a main-portion enlarged cross-sectional view showing the main portion of the mold die provided in the sealing step. FIG. 10 is a main-portion enlarged plan view showing a structure of the upper-surface side of the lower mold shown in FIG. 9. Note that FIG. 9 corresponds to a cross section along the line A-A shown in FIG. 10, and shows the respective positions of pins formed in the mold die and the upper surface in order to show the positional relations (positional relations in a height direction) among the pins. In the present embodiment, a sealing method termed a so-called Mold Array Package (MAP) will be described which places the wiring substrates each having the plurality of product formation regions arranged in rows and columns in a single cavity, and performs simultaneous sealing for the plurality of product formation regions.

A mold die 50 provided in the present step has an upper mold (die) 50b having a lower surface 53 and a lower mold (die) 50a having an upper surface 52 facing to the lower surface 53, and having a cavity (recessed portion or depressed portion) 51 formed in the upper surface 52.

The lower mold 50a has a plurality of pins (projections or alignment pins) 54 and 55. The pins 54 and 55 are projections used to align the base substrate 30 and the sub-substrate 40 which are shown in any of FIGS. 4 to 8, and are formed to protrude from the bottom surface 51a of the cavity 51 or from the upper surface 52 toward the lower surface 53 of the upper mold 50b.

In the sealing step, alignment is performed by inserting the pins 54 and 55 into the hole portions 31 and 41 shown in FIG. 4 or FIG. 6. Accordingly, the pins 54 and 55 are formed at respective positions corresponding to the hole portions 31 and 41. In other words, the hole portions 31 and 41 included respectively in the base substrate 30 and the sub-substrate 40 are formed correspondingly to the respective positions of the pins 54 and 55. Specifically, the bottom surface 51a of the cavity 51 has a quadrilateral two-dimensional shape (which is a rectangle in the present embodiment), and has long sides 51c facing to each other and short sides 51d facing to each other. In the present embodiment, the plurality of pins 54 are arranged over the bottom surface 51a and along one of the long sides 51c included in the four sides. On the other hand, the plurality of pins 55 are arranged over the upper surface 52 and along one of the long sides 51c included in the four sides.

Figure 11:
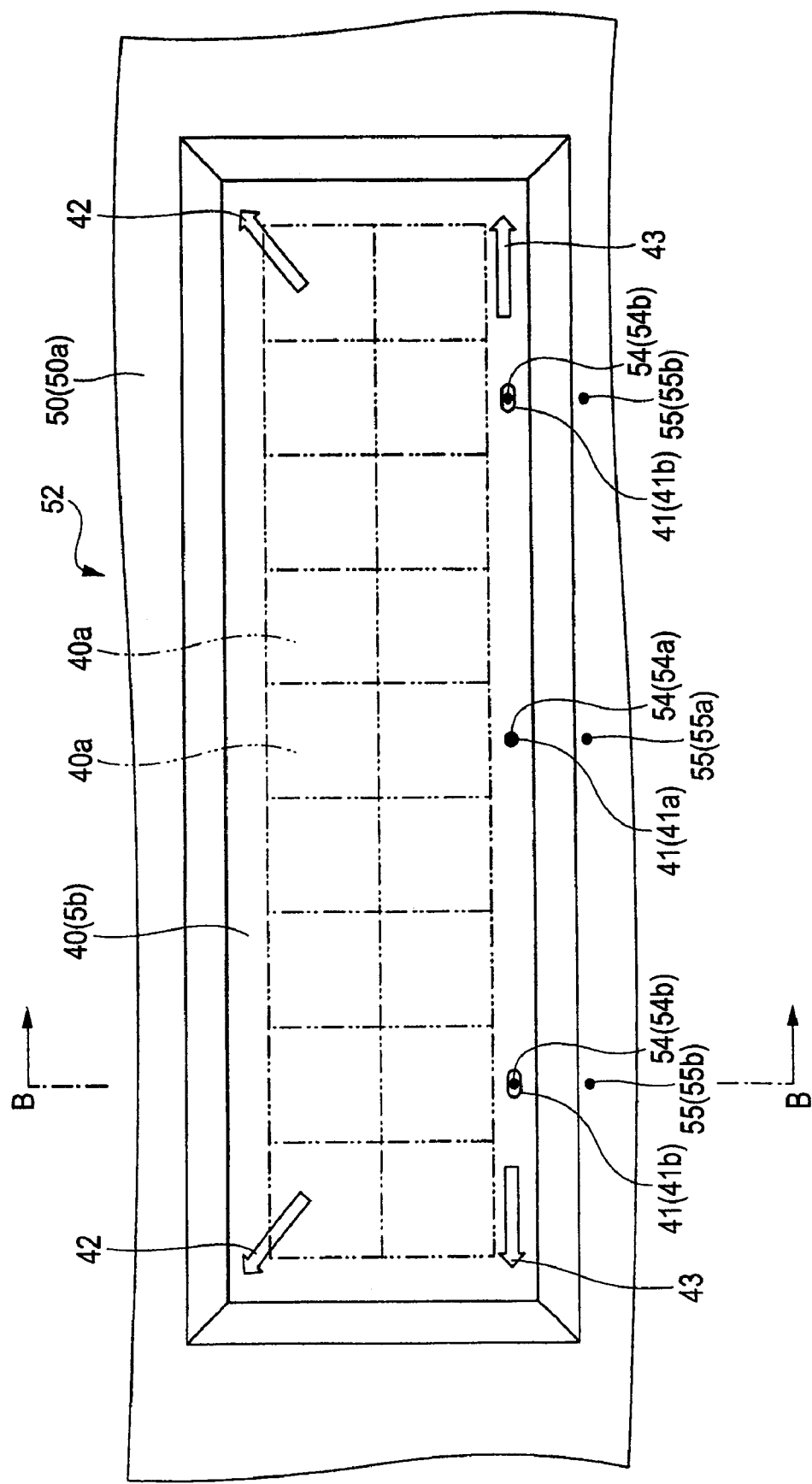
FIG. 11 is a main-portion enlarged plan view showing a state where the wiring substrate shown in FIGS. 6 and 8 is placed in the cavity of the mold die shown in FIG. 10.
Figure 12:
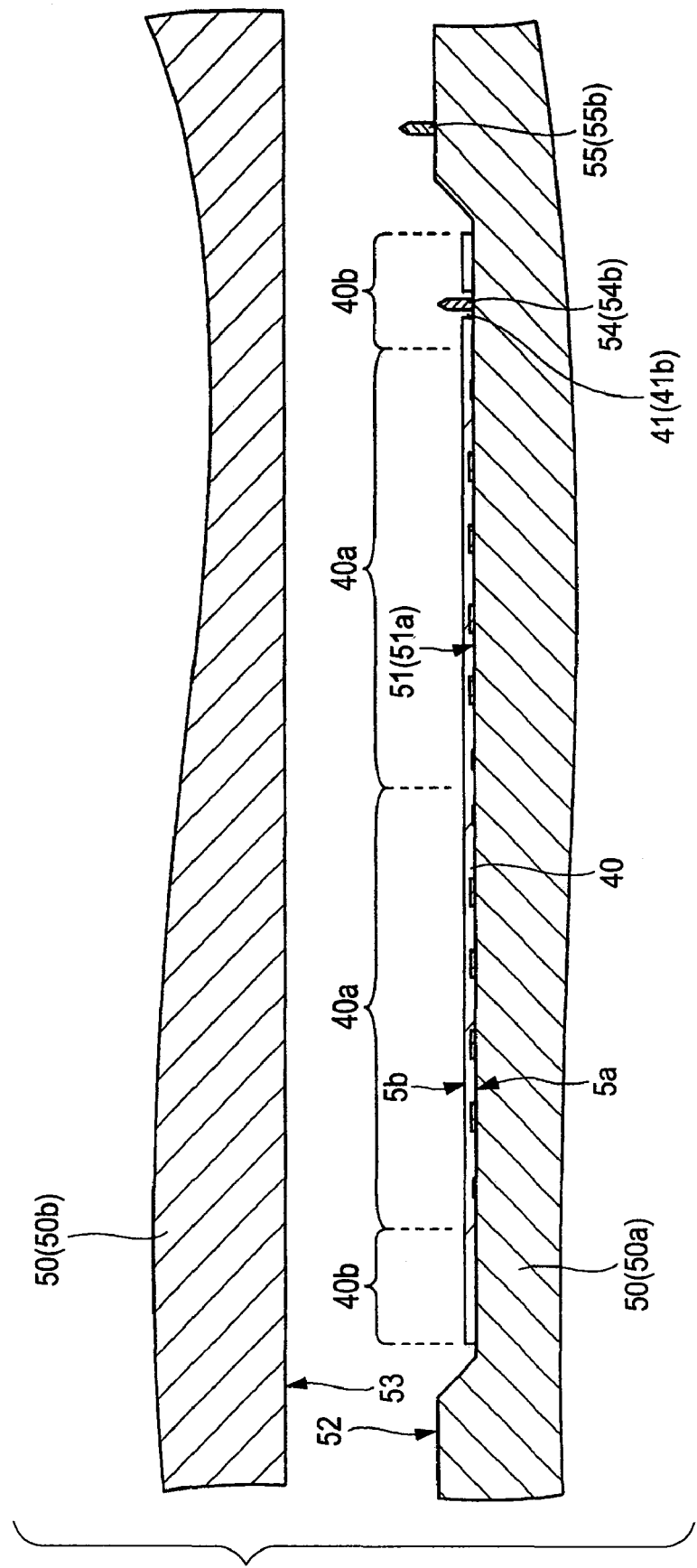
FIG. 12 is a main-portion enlarged cross-sectional view along the line B-B shown in FIG. 11.

The sealing step also includes a first-base-member placing step of placing the sub-substrate 40 provided in the base-member providing step described above in the cavity 51 of the mold die 50. FIG. 11 is a main-portion enlarged plan view showing a state where the wiring substrate shown in FIGS. 6 and 8 is placed in the cavity of the mold die shown in FIG. 10. FIG. 12 is a main-portion enlarged cross-sectional view along the line B-B shown in FIG. 11.

In the present step, the sub-substrate 40 is placed in the cavity 51 such that the main surface 5a of the sub-substrate 40 faces to the cavity 51 of the lower mold 50a (specifically, the main surface 5a faces to the bottom surface 51a of the cavity 51). That is, the sub-substrate 40 is placed in a vertically inverted state in the cavity 51 with the main surface 5a facing downward. At this time, the sub-substrate 40 is placed such that the pins 54 formed in the cavity 51 are located in the hole portions 41 of the sub-substrate 40. Specifically, the pins 54 are inserted into the hole portions formed in the sub-substrate 40 as the through holes for alignment to adjust the two-dimensional positional relationship between the sub-substrate 40 and the cavity 51.

In terms of performing alignment of the sub-substrate 40, at least one pair of the pin 54 and the hole portion 41 may be provided appropriately. However, in terms of performing alignment with higher accuracy, the plurality of pins 54 and the plurality of hole portions 41 are preferably provided, as provided in the present embodiment.

Also in the present step, the sub-substrate 40 is placed over the bottom surface 51a of the cavity 51, but an operation of attracting the main surface 5a of the sub-substrate 40 from the bottom surface 51a by suction or the like is not particularly performed. On the main surface 5a of the sub-substrate 40, the chip components 4 shown in FIG. 1 have not been formed at this stage so that the main surface 5a is generally planar. In addition, the size of the outer shape of the main surface 5a is smaller than the size of the outer shape of the bottom surface 51a. Moreover, in a sealed-body forming step described later, a resin for sealing is supplied between the base substrate 30 and the sub-substrate 40. In the present embodiment, the base substrate 30 and the sub-substrate 40 are provided individually and distinctly, and integrated with each other by forming the sealing resin in the present sealing step. Accordingly, if the resin for sealing is supplied from the back surface 5b of the sub-substrate 40, it follows that the sub-substrate 40 is pressed in the direction of the bottom surface 51a by the pressure of the supplied resin for sealing. Therefore, in the sealed-body forming step described later, it is possible to provide close contact between the main surface 5a and the bottom surface 51a without attracting the main surface 5a by suction.

Figure 14:
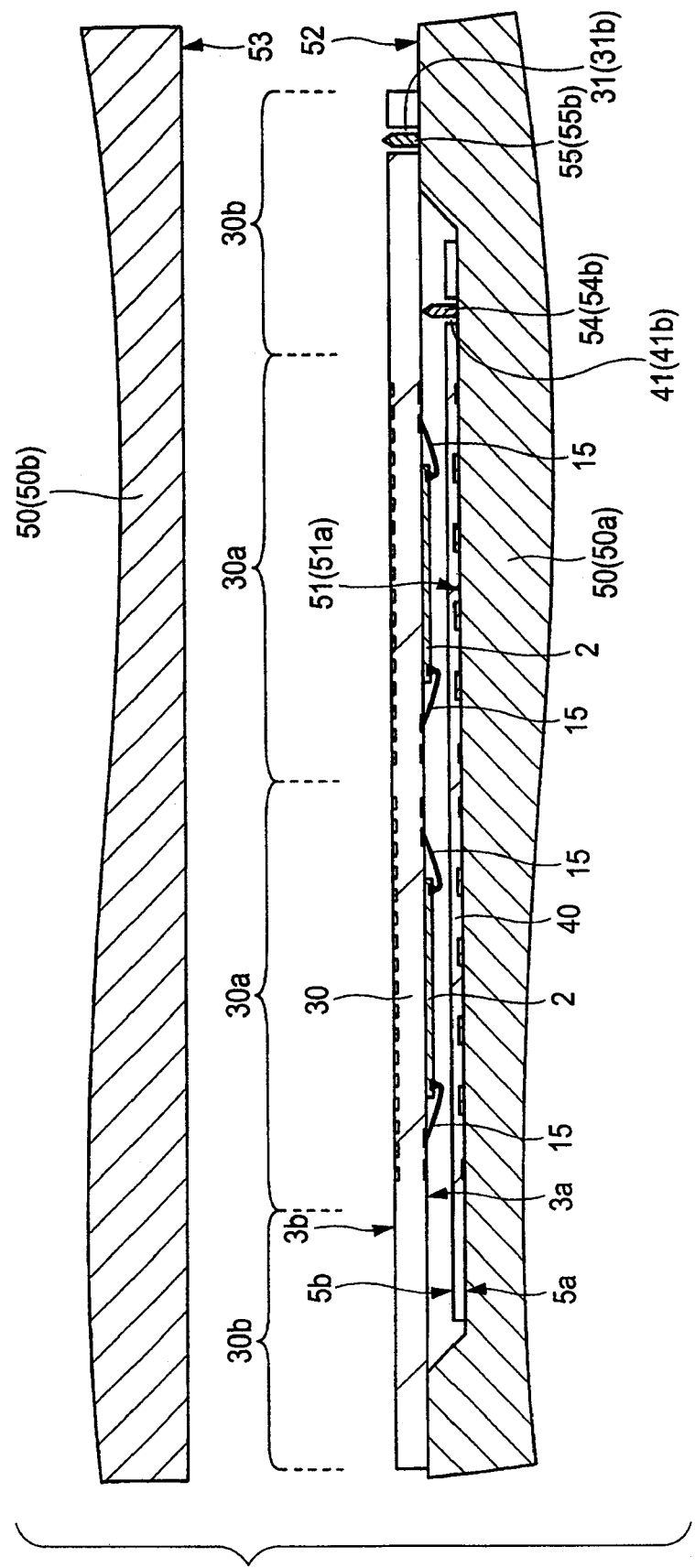
FIG. 14 is a main-portion enlarged cross-sectional view along the line B-B shown in FIG. 13.

Next, the sealing step has a second-base-member placing step of placing the base substrate 30 provided in the base-member providing step described above in the mold die 50. FIG. 13 is a main-portion enlarged plan view showing a state where the wiring substrate shown in FIGS. 4 and 5 is placed in the lower mold of the mold die shown in FIG. 11. FIG. 14 is a main-portion enlarged cross-sectional view along the line B-B shown in FIG. 13.

In the present step, the base substrate 30 is placed between the upper mold 50b and the lower mold 50a (specifically between the upper mold 50b and the sub-substrate 40) such that the main surface 3a of the base substrate 30 faces to the back surface 5b of the sub-substrate 40. That is, the base substrate 30 is placed in a vertically inverted state in the lower mold 50a with the main surface 3a facing downward. The main surface 3a of the base substrate 30 has an area larger than the aperture area of the cavity 51 in the plane of the upper surface 52 of the lower mold 50a so that the main surface 3a of the frame portion 30b of the base substrate 30 comes into contact with the upper surface 52 of the lower mold 50a. As a result, the positional relationship between the base substrate 30 and the sub-substrate 40 in the thickness direction is defined by the depth of the cavity 51. Specifically, by setting the depth (level difference between the upper surface 52 and the bottom surface 51a) of the cavity 51 larger than the total sum of the respective thicknesses of the base substrate and the sub-substrate 40 and the height from the main surface 3a of the base substrate 30 to the highest point of the wire loops of the wires 15, the wires 15 can be spacedly disposed from the back surface 5b of the sub-substrate 40 without being brought into contact therewith.

In the present step, the base substrate 30 is placed such that the pins 55 formed over the upper surface 52 of the lower mold 50a are located in the hole portions 31 of the base substrate 30. Specifically, the pins 55 are inserted into the hole portions 31 formed in the base substrate 30 as the through holes for alignment to adjust the two-dimensional positional relationship between the base substrate 30 and the lower mold 50a.

In the preset embodiment, the base substrate 30 and the sub-substrate 40 are provided individually and distinctly, and the adjustment of the two-dimensional positional relationship therebetween is performed by performing alignment via the mold die 50. In the present embodiment, it is necessary to individually couple the plurality of terminals (lands 12 and 22) formed at the individual substrates to each other in the electrical coupling step described later. Accordingly, it is necessary to align the respective two-dimensional positions of the product formation regions 30a and 40a formed in the individual substrates with high accuracy. Therefore, in the present embodiment, alignment is performed by providing the plurality of pins 54 and the plurality of hole portions 41 in the sub-substrate 40 and providing the plurality of pins 55 and the plurality of hole portions 31 in the base substrate 30 in terms of performing alignment with higher accuracy. This allows an improvement in alignment accuracy as compared to the case where the pins 54 and 55 and the hole portions 41 and 31, each for alignment, are not provided or the case where one pair of the pin 54 and the hole portion 41 and one pair of the pin 55 and the hole portion 31 are provided.

Figure 15:
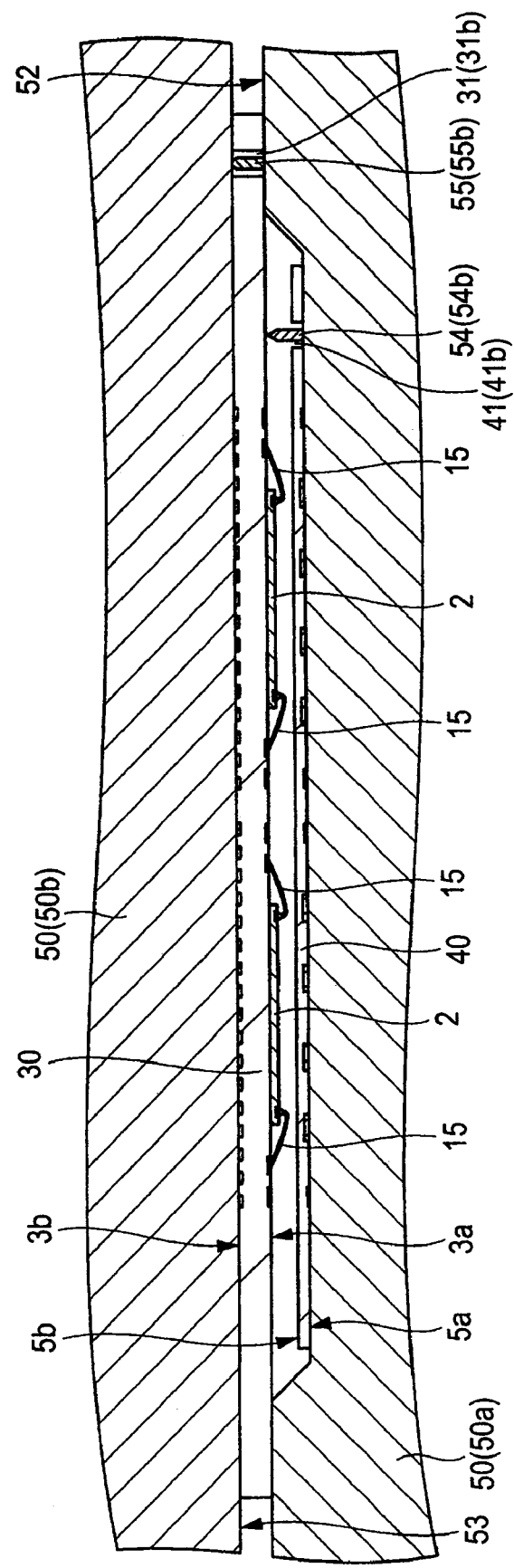
FIG. 15 is a main-portion enlarged cross-sectional view showing a state where the wiring substrate (base substrate) shown in FIG. 14 is held between the upper and lower molds of the mold die, and clamped therewith.

Next, the sealing step has a clamping step of, after the second-base-member placing step described above, holding the base substrate 30 between the upper mold 50b and the lower mold 50a, and clamping the base substrate 30 therewith. FIG. 15 is a main-portion enlarged cross-sectional view showing a state where the wiring substrate (base substrate) shown in FIG. 14 is held between the upper and lower molds of the mold die, and clamped therewith.

In the present step, the lower surface 53 of the upper mold 50b is pressed against the back surface 3b of the base substrate 30, and the upper surface 52 of the lower mold 50a is pressed against the main surface 3a of the base substrate 30 to securely fix the base substrate 30.

Figure 16:
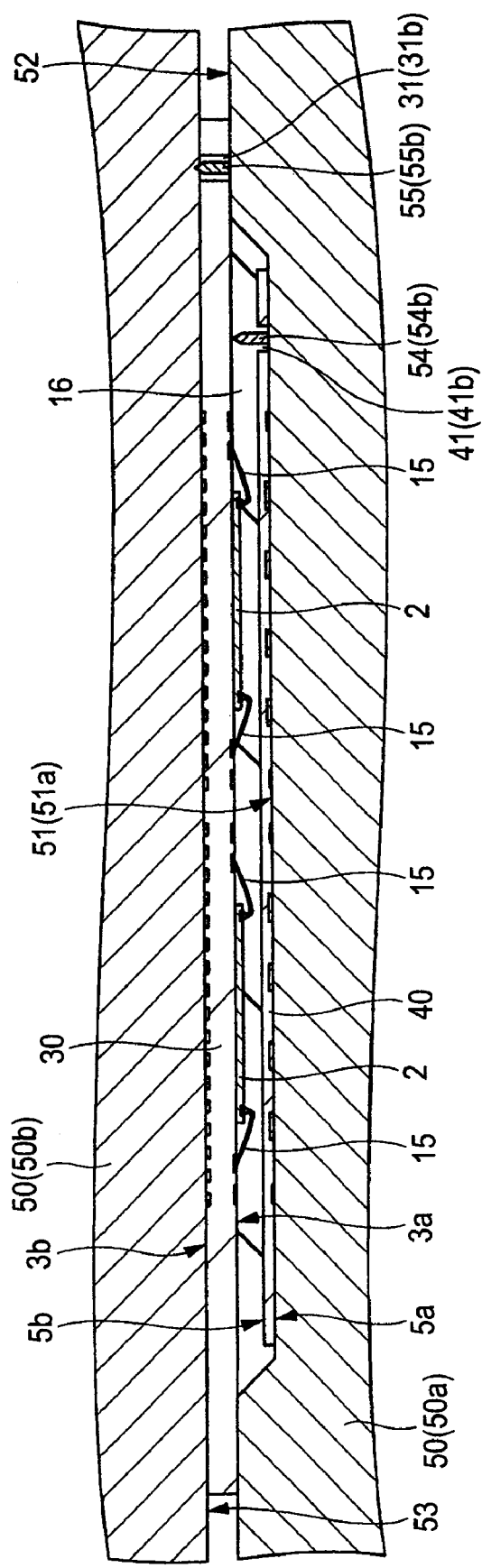
FIG. 16 is a main-portion enlarged cross-sectional view showing a state where a sealed body is formed between the two wiring substrates shown in FIG. 15.
Figure 17:
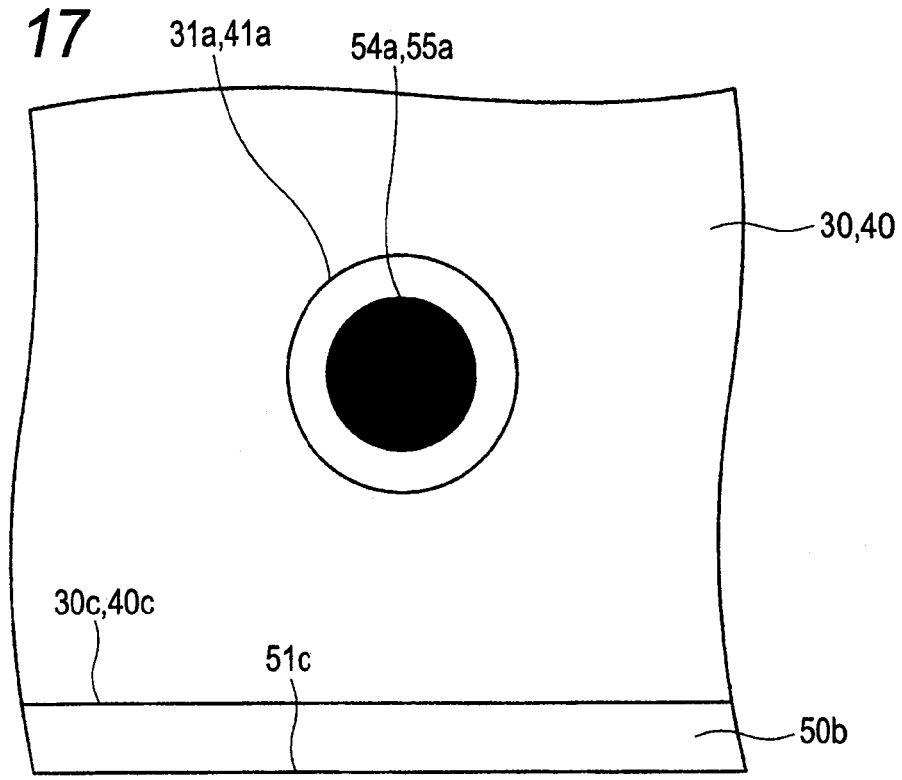
FIG. 17 is a main-portion enlarged plan view showing the vicinity of the reference point for controlling the expansion of the wiring substrate shown in FIG. 11 or FIG. 13 in enlarged relation.
Figure 18:
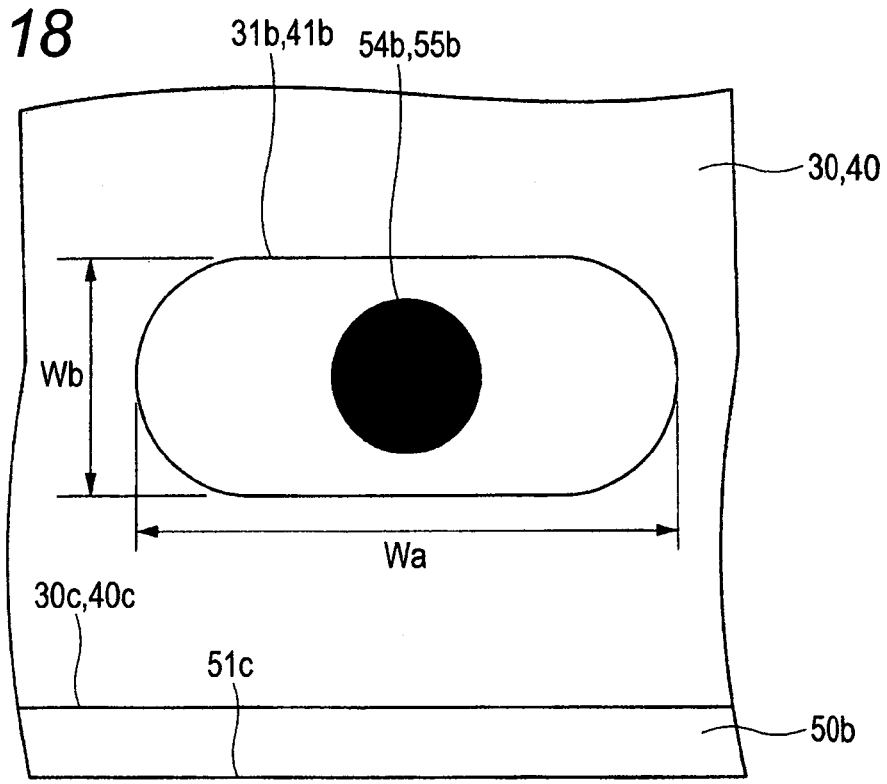
FIG. 18 is a main-portion enlarged plan view showing the vicinity of each of the auxiliary points for controlling the expansion of the wiring substrate shown in FIG. 11 or FIG. 13 in enlarged relation.

Next, the sealing step has the sealed-body forming step of, after the clamping step described above, supplying a resin between the sub-substrate 40 and the base substrate 30 and forming the sealed body between the sub-substrate 40 and the base substrate 30. FIG. 16 is a main-portion enlarged cross-sectional view showing a state where the sealed body is formed between the two wiring substrates shown in FIG. 15. FIG. 17 is a main-portion enlarged plan view showing the vicinity of a reference point for controlling the expansion of the wiring substrate shown in FIG. 11 or FIG. 13 in enlarged relation. FIG. 18 is a main-portion enlarged plan view showing the vicinity of each of auxiliary points for controlling the expansion of the wiring substrate shown in FIG. 11 or FIG. 13 in enlarged relation.

In the present step, a resin for sealing is supplied into the space between the main surface 3a of the base substrate 30 and the back surface 5b of the sub-substrate 40 from a gate portion not shown. The supplied resin flows in the direction of an air vent portion (the depiction of which is omitted) located on the opposite side of the gate portion so that the space between the main surface 3a of the base substrate 30 and the back surface 5b of the sub-substrate 40 is filled with the sealing resin.

Thereafter, the supplied resin is cured with heat so that the sealing resin 16 shown in FIG. 16 is formed. When the sealing resin 16 is formed, the main surface 3a of the base substrate 30 and the back surface 5b of the sub-substrate 40 are bonded to each other via the sealing resin 16 so that the base substrate 30 and the sub-substrate 40 that have been separate and distinct structures are integrated with each other.

The heat curing will be described in detail. The resin for sealing supplied into the mold die 50 is heated to a temperature of, e.g., about 180° C. into a so-called temporarily cured state where one half or more (e.g., about 70%) of to-be-cured components in the resin are cured. In the temporarily cured state, not all the to-be-cured components in the resin are not cured, but half or more of the to-be-cured components are cured. As a result, the base substrate 30 and the sub-substrate 40 each in close contact with the sealing resin 16 shown in FIG. 16 are fixed. However, in terms of the stability of the strength of the sealing resin, it is preferable to completely cure all the to-be-cured components. Therefore, after a retrieving step described later, so-called complete curing is performed in which a simultaneously sealed structure having the temporarily cured sealing resin 16, the base substrate 30, and the sub-substrate 40 is moved to a heating oven, and heated again.

Here, at the stage where the present step is performed in the present embodiment, the conductive members (the solder members 8 shown in FIG. 1) which electrically couple the base substrate 30 to the sub-substrate 40 have not been formed. Accordingly, even when the number of the electrodes (i.e., the lands 12 shown in FIG. 4 and the lands 22 shown in FIG. 6) which electrically couple the base substrate 30 to the sub-substrate 40 increases, the increased electrodes do not act as an impediment which inhibits the flow of a resin for sealing when the resin is supplied. Therefore, as compared to the case of forming the sealed body after electrically coupling the base substrate 30 to the sub-substrate 40 in advance, the resin can be stably supplied. Also in the present step, it is possible to prevent air from being contained in the injected resin for sealing and remaining in the sealing resin 16. This allows a semiconductor device having high reliability to be obtained. In the case of placing the plurality of product formation regions 30a and 40a (see FIG. 11 or FIG. 13) in the single cavity 51, and simultaneously sealing these plurality of product formation regions 30a and 40a, as performed in the present embodiment, the space in the single cavity 51 is large as compared to the case of individually sealing each of the product formation regions 30a and 40a. Therefore, it is possible to more reliably prevent air from being contained in the resin for sealing when the resin is supplied.

The present step is performed in a state where the space in the cavity 51 of the mold die 50 is heated for the purpose of improving the fluidity of the resin to be supplied, or curing (temporarily curing) the supplied resin. However, under the influence of the heating, each of the base substrate 30 and the sub-substrate 40 thermally expands. As described above, it is important in the present embodiment to align the respective two-dimensional positions of the product formation regions 30a (see FIG. 4) of the base substrate 30 and the product formation regions 40a (see FIG. 6) of the sub-substrate 40 with high accuracy. However, when each of the base substrate 30 and the sub-substrate 40 disorderly expands, a new problem of misaligned positions arises.

In terms of preventing the misaligned positions of the product formation regions due to the thermal expansion, it is preferable to prevent the thermal expansion of the wiring substrate (base substrate 30 or sub-substrate 40). However, it is difficult to completely prevent the thermal expansion of the wiring substrate and, if the layout of the materials and components of the wiring substrate and the like are excessively limited in order to prevent the thermal expansion, design flexibility significantly decreases. Therefore, the present inventors need to control the direction of expansion by providing the pins 54 and 55 and the hole portions 31 and 41 each described above, and prevent or inhibit misalignment between the respective two-dimensional positions of the product formation regions 30a and 40a.

Specifically, in the present embodiment, the pins 54 and 55 are disposed closer to one (which is the long side 51c shown in FIG. 10 in the present embodiment) of the four sides forming the outer shape of the bottom surface of the cavity 51 (closer than to the side located in facing relation). On the other hand, the hole portions 31 and 41 are disposed closer to one (which is the long side 30c shown in FIG. 4 or the long side 40c shown in FIG. 6 in the present embodiment) of the four sides forming the outer shape of the base substrate 30 or the sub-substrate. As a result, the positions where the pins 54 and 55 and the hole portions 31 and 41 overlap each other are fixed, and therefore the direction of expansion can be controlled using the fixed positions as reference points.

It may also be considered that, besides being disposed closer to one side as disposed in the present embodiment, the positions of the reference points are disposed at generally the center of each of the substrates. For example, there can be considered a method wherein, in FIG. 10, the pins 54 formed in the cavity 51 are disposed at generally the center of the bottom surface 51a. In this case, however, the hole portions 41 of the sub-substrate 40 shown in FIG. 6 are also disposed at generally the center correspondingly thereto so that the hole portions 41 are formed in the product formation regions 40a. As a result, an additional step of removing the regions where the hole portions 41 are formed becomes necessary to reduce manufacturing efficiency. Therefore, it is preferable to dispose the pins 54 and the hole portions 41 each for alignment in the frame portion 40b (or at positions overlapping the frame portion 40b) located outwardly of the product formation regions 40a included in the sub-substrate 40, as disposed in the present embodiment. The frame portion 40b is a space for work when the sub-substrate 40 is processed in each of the manufacturing process steps, which is a space to be eventually cut and removed regardless of whether or not the pins for alignment are present therein. Accordingly, by forming the pins 54 and the hole portions 41 in the frame portion 40b, a reduction in manufacturing efficiency can be inhibited, which is also preferable in terms of effective use of the space.

In addition, the pins and the hole portions each serving as the reference point are disposed at the middle portion of the side to which they are disposed closer. In the present embodiment, the pins 54a and 55a shown in FIG. 10, the hole portion 31a shown in FIG. 4, and the hole portion 41a shown in FIG. 6 correspond thereto. By thus disposing the pins 54a and 55a and the hole portions 31a and 41a each serving as the reference at the middle portion of the side to which they are disposed closer, the distance from the reference point to the end portion of each of the substrates (base substrate 30 or the sub-substrate 40) is reduced. If consideration is given to the thermal expansion of each of the substrates, as the distance from the reference point increases, the degree of misalignment increases. Therefore, by reducing the distance from the reference point to the end portion, the degree of misalignment can be reduced.

In terms of reducing the distance from the reference point to the most distant end portion, the pins 54a and 55a and the hole portions 31a and 41a each serving as the reference point are preferably disposed closer to the long sides 51c, 30c, and 40c, respectively.

As described above, the distance from the reference point increases, the degree of misalignment increases. That is, in the case where only the pins 54a and 55a each serving as the reference point shown in FIG. 11 or FIG. 13 are provided, misalignment increases in the directions indicated by the arrows 42. Accordingly, in the present embodiment, pins 54b and 55b are disposed as auxiliary points which assist the control of thermal expansion on both sides of the pins 54a and 55a each serving as the reference point and along the long side 51c to which the pins 54a and 55a each serving as the reference point are disposed closer, as shown in FIG. 10.

In correspondence thereto, in the base substrate 30 shown in FIG. 4, hole portions 31b are disposed as auxiliary points which assist the control of thermal expansion on both sides of the hole portion 31a serving as the reference point and along the long side 30c to which the hole portion 31a serving as the reference point is disposed closer. Likewise, in the sub-substrate 40 shown in FIG. 6, hole portions 41b are disposed as auxiliary points which assist the control of thermal expansion on both sides of the hole portion 41a serving as the reference point and along the long side 40c to which the hole portion 41a serving as the reference point is disposed closer. In the step of placing the sub-substrate 40 and the base substrate 30, the hole portions 41b and 31b are disposed to overlap the pins 54b and 55b, respectively. This allows misalignment in the directions indicated by the arrows 42 shown in FIG. 11 or 13 to be inhibited.

In the present embodiment, the hole portions 31a and 41a used as the reference points for controlling the directions of expansion and the hole portions 31b and 41 serving as the auxiliary points for controlling the directions of expansion are provided with different aperture shapes. Specifically, as shown in FIG. 17, the respective aperture shapes of the hole portions 31a and 41a are formed in accordance with the outer shapes (two-dimensional shapes) of the pins 54a and 55a to be inserted therein. In the present embodiment, along the pins 54a and 55a each having a circular outer shape, the aperture shape of each of the hole portions 31b and 41a is also formed circular. On the other hand, as shown in FIG. 18, the aperture shape of each of the hole portions 31b and 41b is formed oblong. Specifically, the hole portions 31a, 31b, 41a, and 41b are formed such that an aperture width Wa in a direction along the long side 30c or 40c of the wiring substrate (base substrate 30 or sub-substrate 40) is larger than an aperture width Wb in a direction (direction along the short side 30d or 40d shown in FIG. 4 or FIG. 6) crossing the long side 30c or 40c. Accordingly, with regard to the long sides 30c or 40c, the respective gaps (clearances) between the hole portions 31b and 41b and the pins 54b and 55b each serving as the auxiliary point are larger than the respective gaps (clearances) between the hole portions 31a and 41a and the pins 54a and 55a each serving as the reference point.

The hole portions 31 and 41 are thus provided with different aperture shapes depending on whether they serve as the reference points or the auxiliary points from the following viewpoint. That is, to control the thermal expansion of the wiring substrates, it is important to reduce the misalignment between the reference points. Accordingly, the respective aperture shapes of the hole portions 31a and 41a serving as the reference points are formed in accordance with the outer shapes (two-dimensional shapes) of the pins 54a and 55a to be inserted therein, and minimum clearances required in terms of inserting the pins 54a and 55a into the hole portions 31a and 41a are provided.

On the other hand, if the respective clearances between the hole portions 31b and 41b and the pins 54b and 55b each serving as the auxiliary point are reduced in the same manner as for the reference points, when the wiring substrate (base substrate 30 or sub-substrate 40) thermally expands, a strong stress is applied from each of the pins 54b and 55b to the wiring substrate, and the wiring substrate may be deformed or damaged depending on the strength of the stress. Accordingly, as shown in FIG. 18, wider clearances are provided for the hole portions 31b and 41b each serving as the auxiliary point than those provided for the hole portions 31a and 41a each serving as the reference point to allow the stress applied from each of the pins 54b and 55b to be released. This allows a reduction in the stress. By also setting the aperture width Wa in the direction along the long side 30c or 40c larger than the aperture width Wb, the directions in which the wiring substrate expands can be controlled to the directions indicated by the arrows 43 shown in FIGS. 11 and 13.

Additionally, in the present embodiment, the reference points (pins 54a and 55a and hole portions 31a and 41a) for controlling expansion and the auxiliary points (pins 54b and 55b and hole portions 31b and 41b) are disposed closer to the same side (closer than to the side located in facing relation). In other words, the hole portions 41 of the sub-substrate 40 are disposed closer to the long side 40c included in the four sides, and the hole portions 31 of the base substrate 30 are disposed closer to the long side 30c included in the four sides and disposed along the long side 40c. This can equalize the directions of expansion when the wiring substrates thermally expand.

Note that the directions of expansion when the wiring substrates expand can be predicted to a degree based on the physical value (thermal expansion coefficient) of the material. Therefore, as long as the respective positions of the plurality of product formation regions of the individual wiring substrates are aligned in a state where the sealing resin 16 is cured and the base substrate 30 and the sub-substrate 40 are fixed, the directions of expansion need not be equal. That is, for example, the reference point (pin 55a and hole portion 31a) and the auxiliary points (pins 55b and hole portions 31b) of the base substrate 30 and the reference point (pin 54a and hole portion 41a) and the auxiliary points (pins 54b and hole portions 41b) of the sub-substrate 40 can be disposed closer to different sides.

In this case, however, it is necessary to consider complicated elements such as the respective expansion speeds of the individual substrates and the curing speed of the sealing resin 16. Therefore, it is particularly preferable to equalize the directions of expansion, as performed in the present embodiment, in terms of allowing easy alignment of the respective positions of the product formation regions of the individual substrate.

In the present embodiment, as described above, the hole portions 31 and 41 are formed as the through holes extending from the main surfaces 3a and 5a to the back surfaces 3b and 5b through the wiring substrates. Also in the present embodiment, the pins 54 and 55 have respective lengths which allow the pins 54 and 55 to protrude to respective points over the back surface 5b of the sub-substrate 40 and the back surface 3b of the base substrate 30. That is, the lengths of the pins 54 are larger than the thickness of the sub-substrate 40, and the lengths of the pins 55 are larger than the thickness of the base substrate 30. As long as only the alignment of the base substrate 30 and the sub-substrate 40 is performed in the first- or second-base-member placing step described above, it is sufficient to form the hole portions 31 and 41 not as the through holes, but as respective holes (depressed portions or recessed portions) formed in the main surfaces 3a and 5a. However, in the present embodiment, the pins 54 and 55 and the hole portions 31 and 41 are used as the reference points or as the auxiliary points each for controlling the directions of the thermal expansion of the wiring substrates. In terms of thus controlling the directions of expansion, it is necessary to maintain the positional relations between the wiring substrates and the pins with a stronger force. Therefore, it is more preferable that the hole portions 31 and 41 are formed as the through holes, and the respective lengths of the pins 54 and 55 are set larger than the thickness of the base substrate 30 or the sub-substrate 40.

Figure 19:
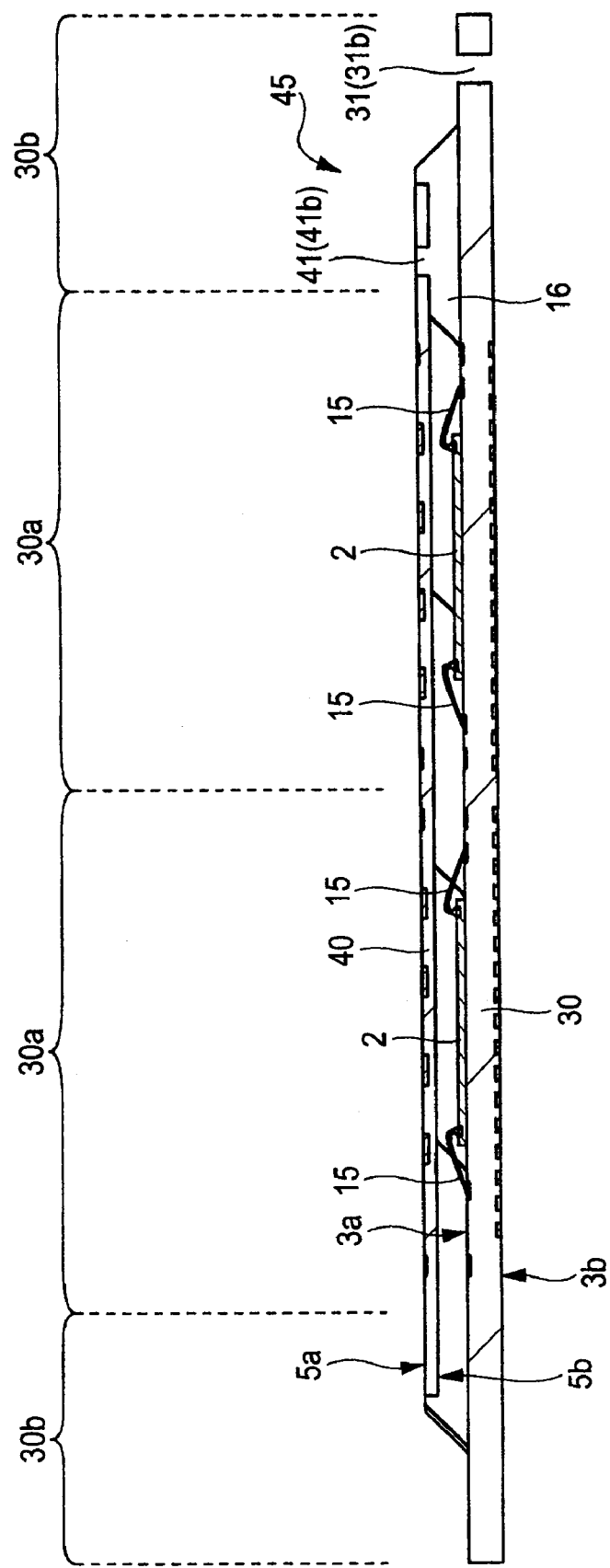
FIG. 19 is a cross-sectional view showing a simultaneously sealed structure retrieved from the mold die shown in FIG. 16, and vertically inverted.

Next, the sealing step has the step of retrieving the base substrate 30 and the sub-substrate 40 each formed with the sealing resin 16 from the mold die 50 used in the sealing step described above. FIG. 19 is a cross-sectional view showing a simultaneously sealed structure retrieved from the mold die shown in FIG. 16, and vertically inverted.

In the present step, the lower surface 53 of the upper mold 50b and the upper surface 52 of the lower mold 50a, each shown in FIG. 16, are pulled away from each other, and a simultaneously sealed structure 45 in which the sealing resin 16 is formed and the base substrate 30 and the sub-substrate 40 are fixed via the sealing resin 16 is retrieved. At this stage, the base substrate 30 and the sub-substrate 40 have been adhesively fixed to each other, but have not been electrically coupled to each other. Also in the present step, resin burr that has occurred in the sealing step described above and the like are removed as necessary.

Figure 20:
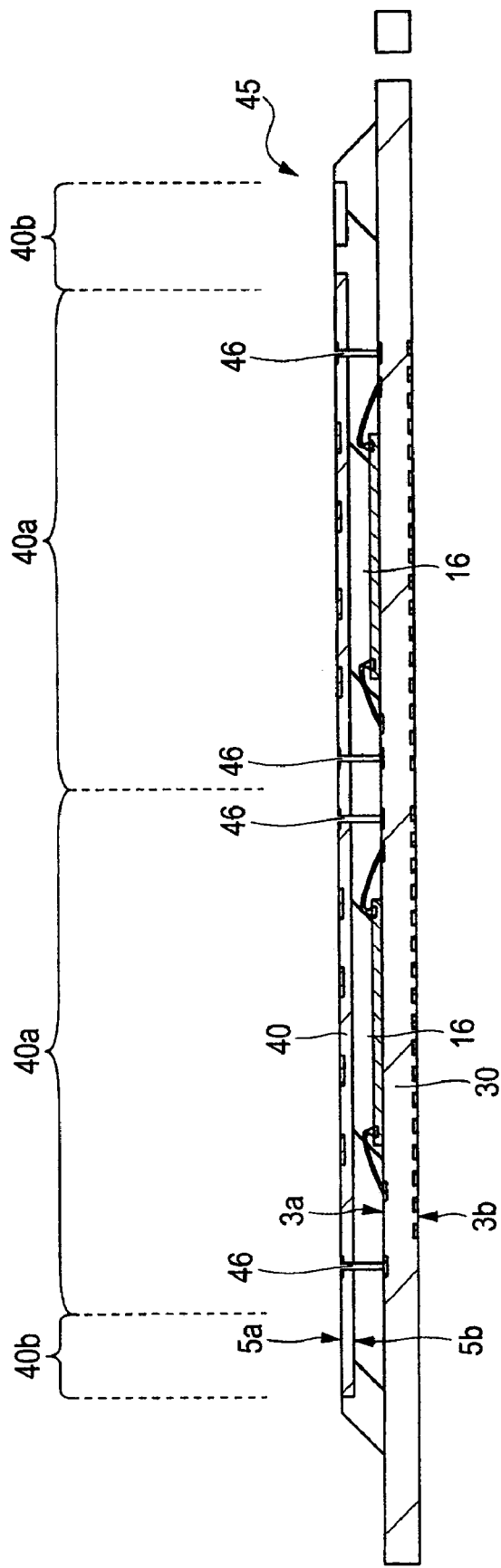
FIG. 20 is a cross-sectional view showing a state where a plurality of through holes are formed in the simultaneously sealed structure shown in FIG. 19.
Figure 21:
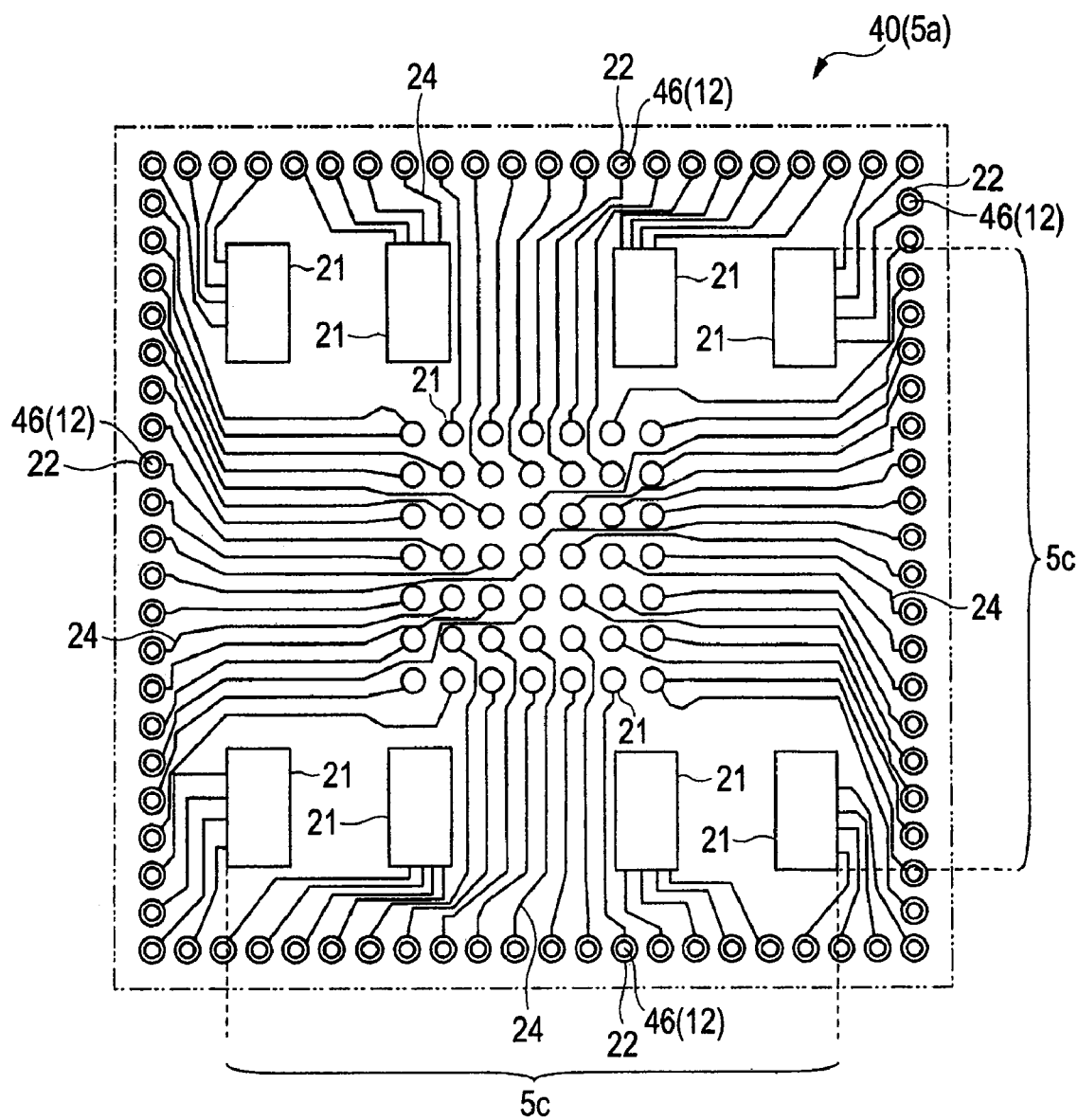
FIG. 21 is an enlarged plan view showing the upper surface of the simultaneously sealed structure after the through holes shown in FIG. 19 are formed in enlarged relation with regard to one product formation region.
Figure 22:
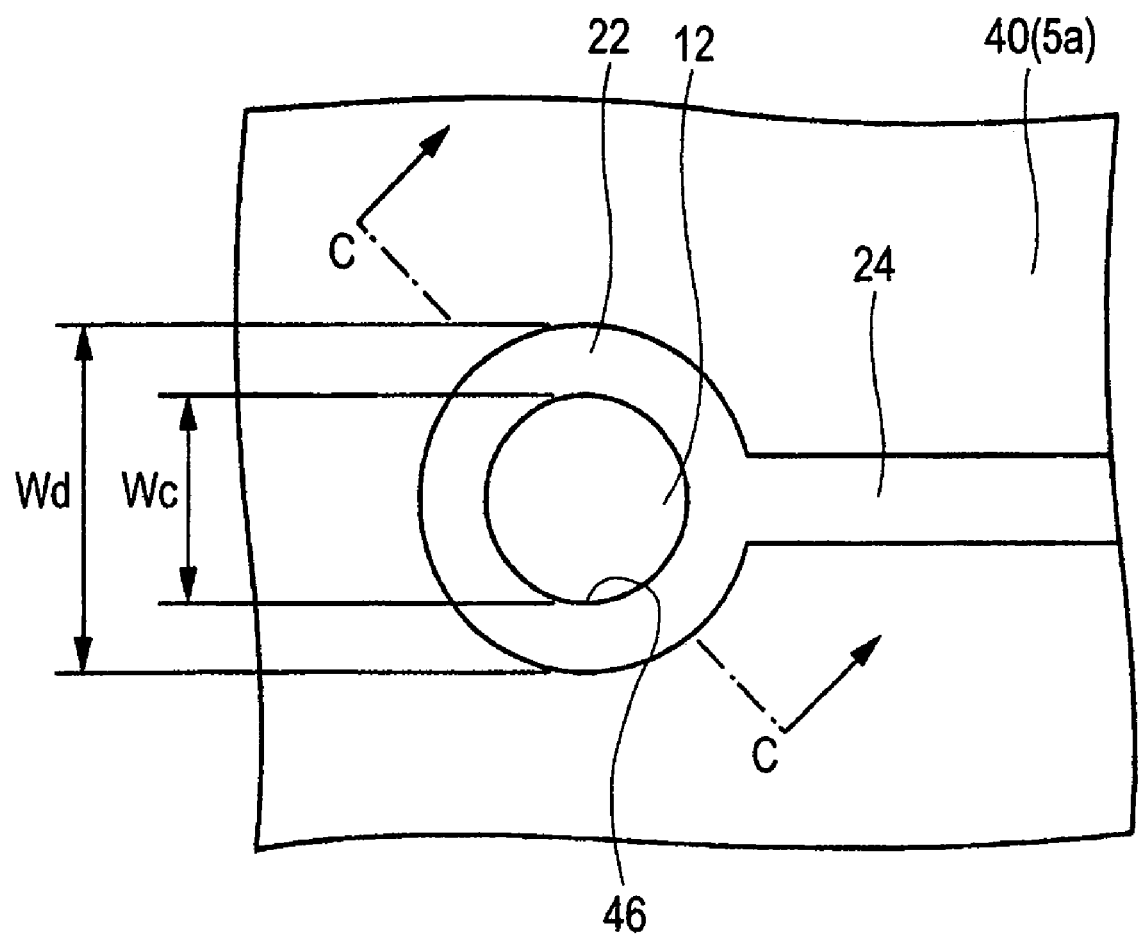
FIG. 22 is a main-portion enlarged plan view showing one of the through holes shown in FIG. 21 in enlarged relation.
Figure 23:
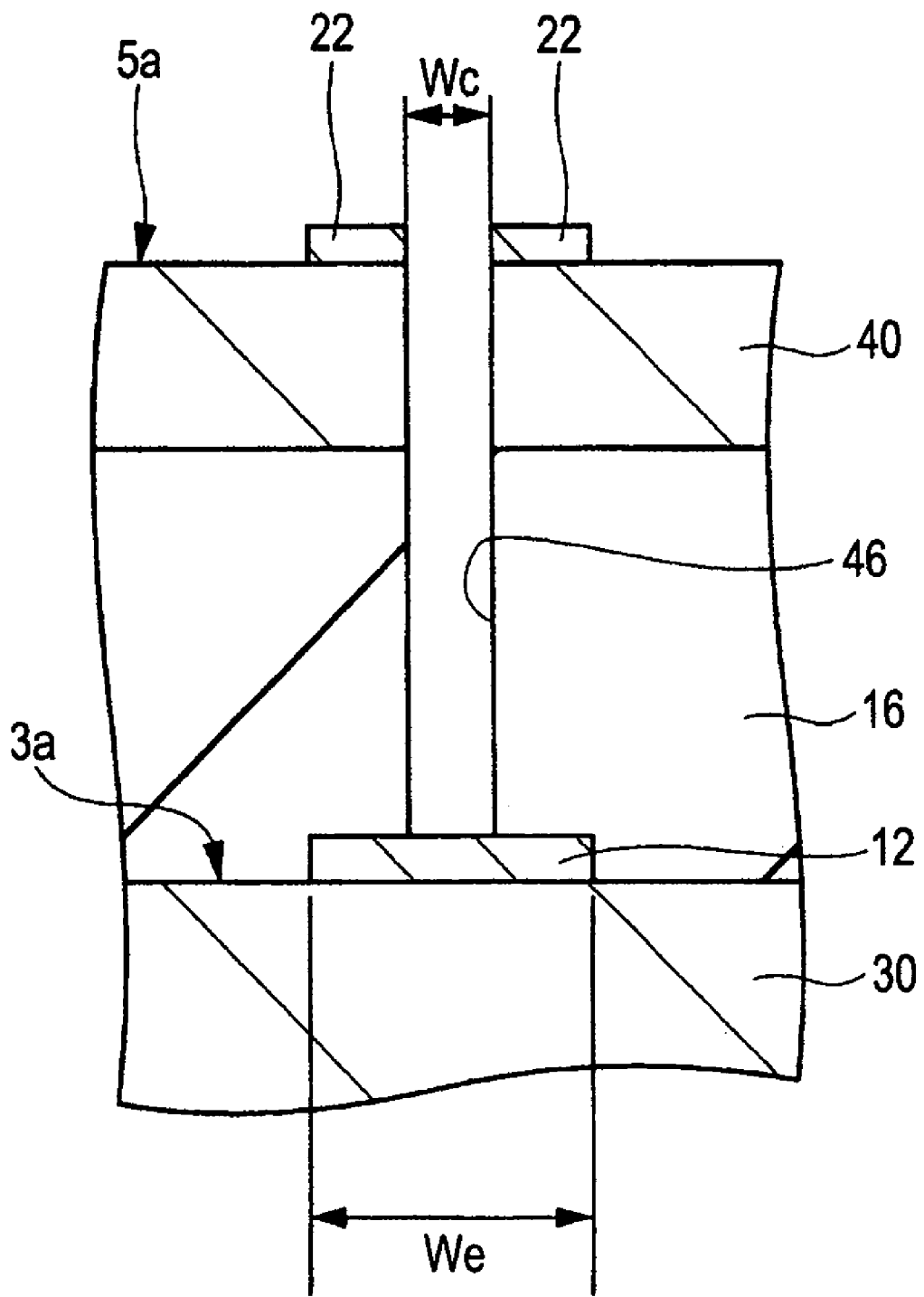
FIG. 23 is a main-portion enlarged cross-sectional view along the line C-C shown in FIG. 22.

Next, a description will be given to the electrical coupling step of electrically coupling the base substrate 30 to the sub-substrate 40 each included in the simultaneously sealed structure 45. The electrical coupling step includes a through-hole forming step of forming the through holes from the lands of the sub-substrate 40 toward the lands of the base substrate each included in the retrieved simultaneously sealed structure and a conductive-member forming step of forming the conductive members in the through holes. FIG. 20 is a cross-sectional view showing a state where the plurality of through holes are formed in the simultaneously sealed structure shown in FIG. 19. FIG. 21 is an enlarged plan view showing the upper surface of the simultaneously sealed structure after the through holes shown in FIG. 19 are formed in enlarged relation with regard to one product formation region. FIG. 22 is a main-portion enlarged plan view showing one of the through holes shown in FIG. 21 in enlarged relation. FIG. 23 is a main-portion enlarged cross-sectional view along the line C-C shown in FIG. 22.

First, in the through-hole forming step, through holes 46 are formed from the lands 22 formed at the main surface 5a of the sub-substrate 40 toward the lands 12 formed at the main surface 3a of the base substrate 30 and the lands 12 are exposed. In the present step, the plurality of through holes 46 are formed for the plurality of lands 22 formed in each of the product formation regions 40a, as shown in FIG. 20 or FIG. 21.

Here, the wording "through" of the through holes 46 indicates the extension thereof through the sub-substrate 40 and the sealing resin 16 in the thickness direction. As described in the foregoing sealing step, in the present embodiment, it is possible to align the respective two-dimensional positions of the base substrate 30 and the sub-substrate 40 with high accuracy so that the lands 22 and the lands 12 are disposed to overlap each other in the thickness direction. Accordingly, by downwardly removing the individual members such as the sealing resin 16 from the lands 22 toward the lands 12, the lands 12 can be exposed.

In addition, as shown in FIG. 22, an aperture diameter Wc of each of the through holes 46 is smaller than a width Wd of each of the lands 22. In other words, the aperture area of each of the through holes 46 is smaller than the area of the surface of each of the lands 22. As a result, in the present step, a state is established where the annular lands 22 surround the respective peripheries of the through holes 46, as shown in FIG. 22. Moreover, as shown in FIG. 23, the aperture diameter Wc is smaller than a width We of each of the lands 12. In other words, the aperture area of each of the through holes 46 is smaller than the area of the surface of each of the lands 12. That is, in the conductive-member forming step described later, the area of the junction surface between the conductive member formed in each of the through holes 46 and the land 12 is smaller than the area of the surface of the land 12. Therefore, even when the respective two-dimensional positions of the lands 12 and the lands 22 are slightly misaligned due to the influence of alignment accuracy, processing accuracy, or the like, the lands 12 can be reliably coupled to the lands 22.

As a means for removing the individual members such as the sealing resin 16 stacked on the surface of each of the lands 22 and reaching the surface of each of the lands 12, i.e., as a through hole forming means, there can be listed various methods such as a laser processing method and an etching method. However, in the present embodiment, the through holes 46 need to extend through the sealing resin 16 in the thickness direction, and the aperture diameter We of each of the through holes 46 needs to be reduced, as described above. To form such narrow and long through holes 46, laser processing is preferably performed in terms of processing accuracy and processing efficiency. Specifically, laser light is emitted from the main surface 5a of the sub-substrate 40, specifically from the surface of each of the lands 22 to remove the sub-substrate 40 and the sealing resin 16, and expose the lands 12. This allows the formation of the through holes 46. Note that, in the present embodiment, each of the lands 22 is preliminarily formed in an annular shape (doughnut shape) at the stage where the lands 22 are formed at the main surface 5a of the sub-substrate 40. That is, the lands 22 are not formed in the regions where the through holes 46 are to be formed, and the insulating layer of the sub-substrate 40 is exposed. As a result, when the through holes 46 are formed by laser processing, it is possible to reduce the output of a laser. However, each of the lands 22 formed in advance can also be formed in, e.g., a circular solid pattern. In this case, in the present step, generally the center of each of the lands 22 in the solid pattern is removed by adjusting the output of the laser or the like, and the thorough holes 46 are formed.

Figure 24:
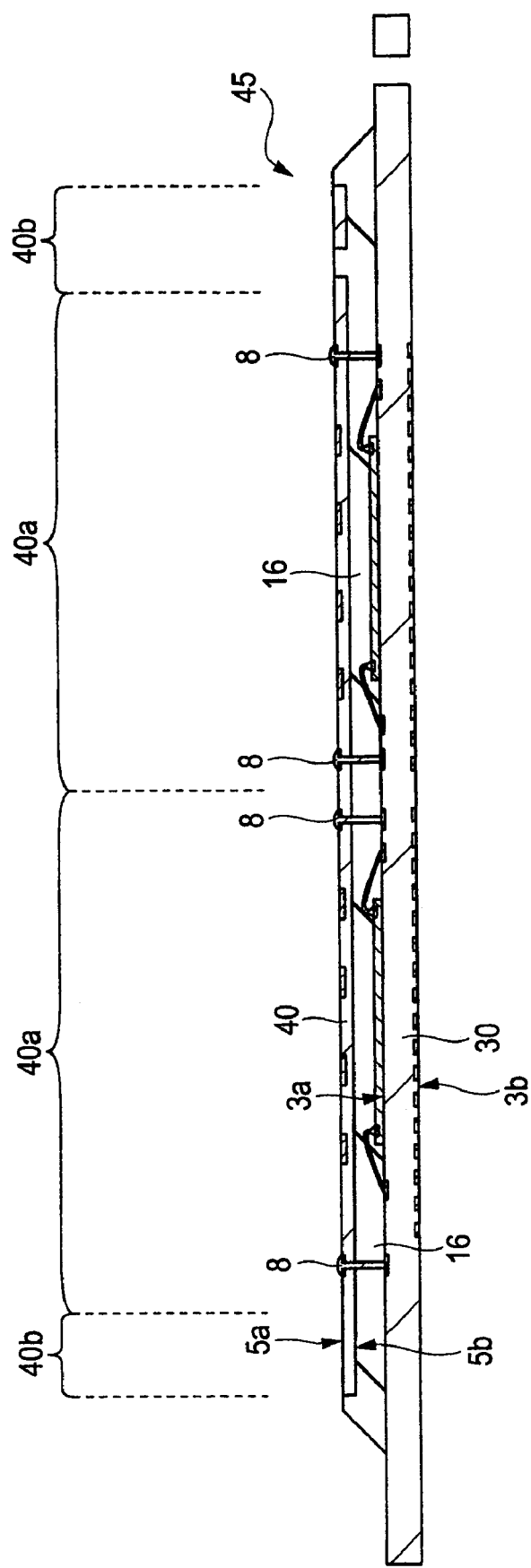
FIG. 24 is a cross-sectional view showing a state where conductive members are formed in the respective through holes shown in FIG. 21.
Figure 25:
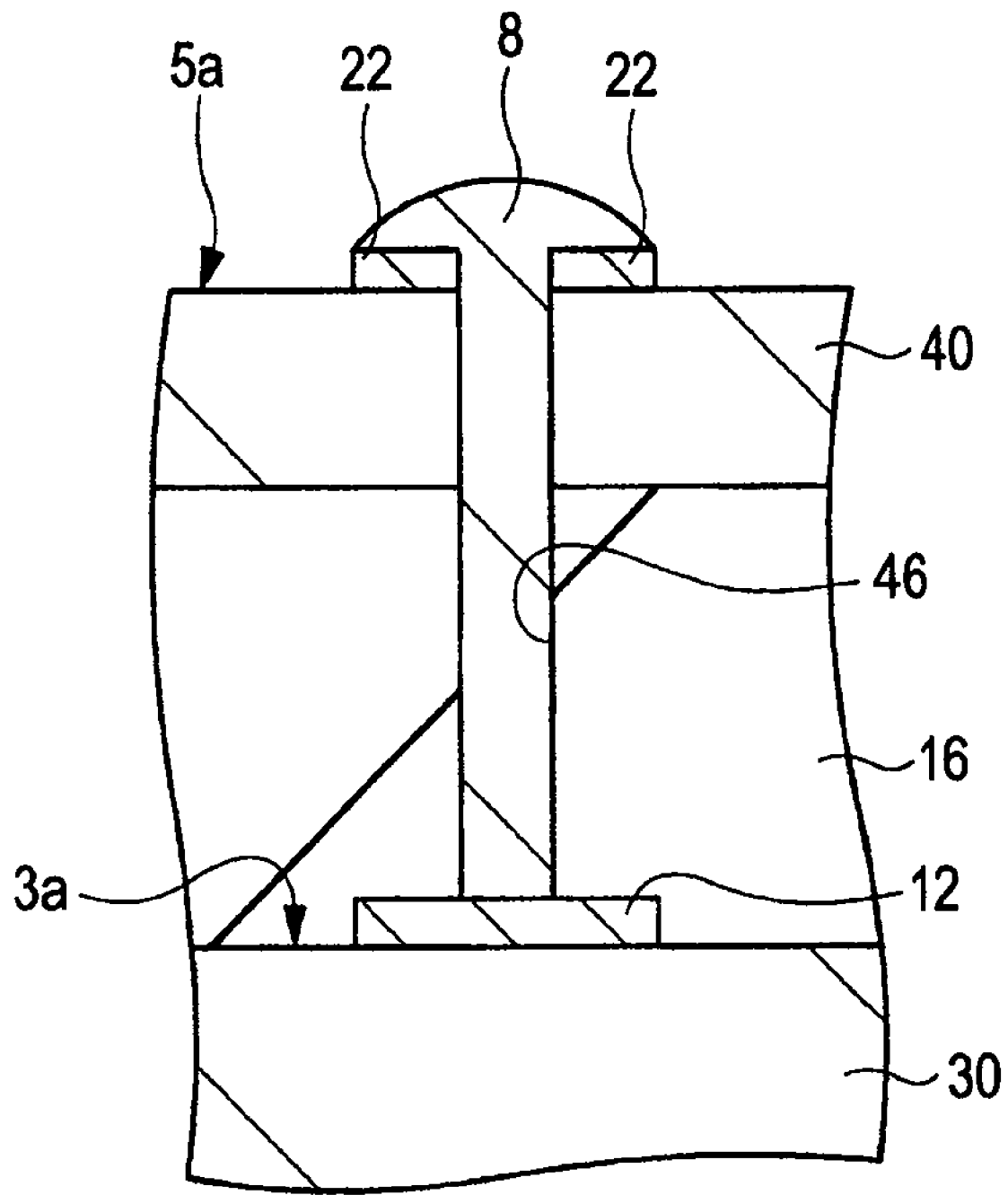
FIG. 25 is a main-portion enlarged cross-sectional view showing the vicinity of the one through hole shown in FIG. 24 in enlarge relation.

Next, in the conductive-member forming step, the conductive members are formed in the respective through holes 46 to electrically couple the base substrate 30 to the sub-substrate 40. FIG. 24 is a cross-sectional view showing a state where the conductive members are formed in the respective through holes shown in FIG. 21. FIG. 25 is a main-portion enlarged cross-sectional view showing the vicinity of the one through hole shown in FIG. 24 in enlarged relation.

In the present step, as shown in FIG. 24, the solder members 8 serving as the conductive members are formed individually in the plurality of through holes 46 (see FIG. 19), as shown in FIG. 24. Specifically, the solder members 8 are bonded to both of the lands 22 and 12 to provide electrical coupling therebetween.

The solder members 8 can electrically couple the lands 12 to the lands 22 as long as the solder members 8 are in contact with at least both of the lands 12 and 22. However, in terms of increasing the contact areas between the solder members 8 and the lands 22 and improving coupling reliability, it is preferable that the solder members 8 are formed to points outward of the through holes 46, and the surfaces of the lands 22 are covered with the solder members 8, as shown in FIG. 25.

In the case of electrically coupling the lands 12 to the lands 22 using the solder members 8 as performed in the present embodiment, it is preferable to use a material having a high melting point for the solder members 8. This is for preventing the solder members 8 from reflowing in a heating step such as a ball mounting step, the step of mounting an electronic component over the sub-substrate, or the step of mounting the finished POP 1 shown in FIG. 1 on a mounting substrate. However, when a material having an extremely high melting point is used, a temperature necessary for forming the solder members 8 becomes excessively high. Accordingly, the melting point of each of the solder members 8 is preferably set higher than the melting point of each of the solder balls 17 (see FIG. 1) mounted on the back surface of the base substrate 30 in the ball mounting step described later. Specifically, it is preferable to use a material having a melting point of about 300° C. higher than the reflow temperature. Examples of such a material that can be shown include a Sn-10Ag alloy.

As a means for forming the solder members 8, there can be listed a method which drops a molten solder into each of the through holes 46 to fill the through hole 46 using a molten solder dropping apparatus termed a so-called solder shoot, or a method which forms a solder in each of the through holes 46 by plating. These methods are preferred in terms of allowing the conductive members to be reliably formed in the through holes 46 even when each of the through holes 46 has a small aperture diameter and a long distance to the land 12.

As a variation of the solder members 8, a material called a conductive paste in which grains of a metal such as, e.g., Ag are dispersed in a paste-like resin can also be used. In this case, the conductive paste is buried in each of the through holes 46, and then cured. In the case of the conductive paste, the viscosity thereof can be adjusted with a resin component in which the metal grains are dispersed. In addition, by using a thermosetting resin material as the resin component, stable electrical coupling can be ensured between the lands 12 and the lands 22 since the thermosetting resin material once cured does not reflow even when it is heated thereafter.

As another variation of the solder members 8, a metal material (such as, e.g., copper) different from a solder can also be formed by a plating method. In this case, even when each of the through holes 46 has a small aperture diameter and a long distance to the land 12, the conductive members can be reliably formed in the through holes 46. In addition, by forming a metal material having a melting point higher than that of each of the solder balls 17 shown in FIG. 1 by plating, it is possible to prevent reflow due to the subsequent heating step, and ensure stable electrical coupling between the lands 12 and the lands 22.

Figure 26:
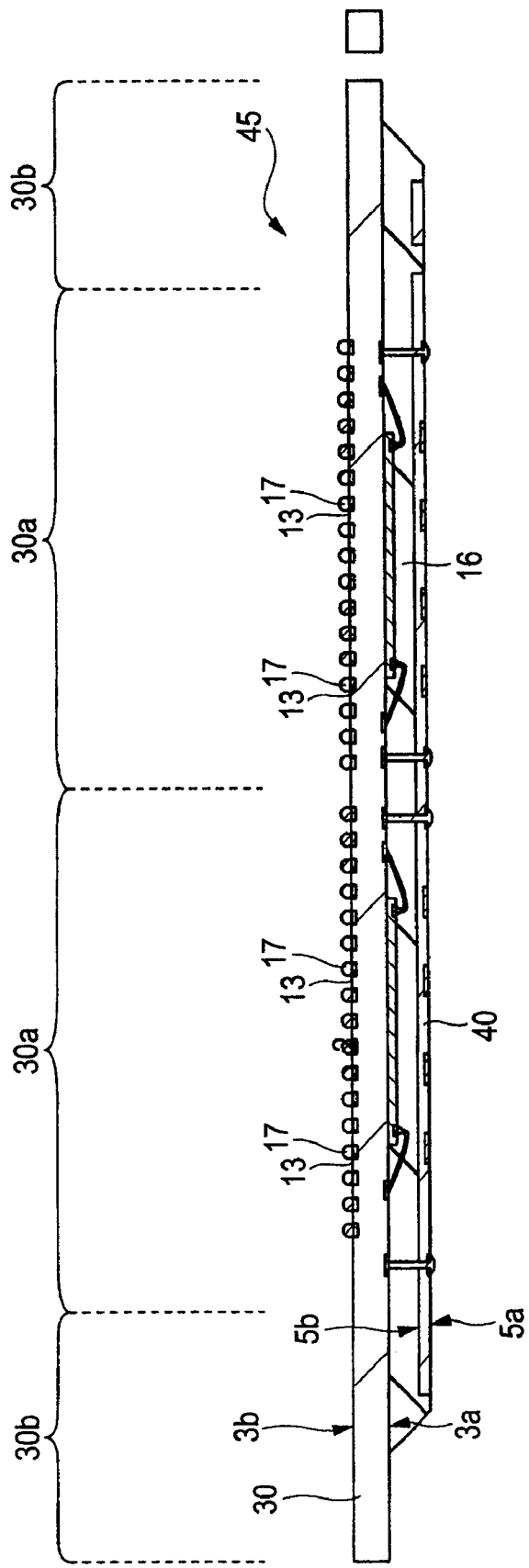
FIG. 26 is a cross-sectional view showing a state where solder balls are mounted on the back surface of the simultaneously sealed structure shown in FIG. 24.

Next, in the ball mounting step, a plurality of solder balls are mounted individually on the plurality of lands formed at the back-surface of the base substrate 30 shown in FIG. 24. FIG. 26 is a cross-sectional view showing a state where the solder balls are mounted on the back surface of the simultaneously sealed structure shown in FIG. 24.

In the present step, as shown in FIG. 26, the simultaneously sealed structure 45 is vertically inverted, and the plurality of solder balls 17 are individually mounted on (bonded to) the plurality of lands 13 formed at the back surface 3b of the base substrate.

In the present embodiment, the ball mounting step is performed after the electrical coupling step, but the order of performing the ball mount step and the other process steps is not limited thereto. For example, in the case of forming the solder members 8 by dropping the molten solder using the solder shoot described above or using a conductive paste instead of the solder members 8, it is also possible to perform the ball mounting step first, and then perform the electrical coupling step described above. However, in the case of forming the solder members 8 by plating or forming a metal material other than a solder by plating, it is preferable that the solder balls 17 have not been formed at the time of the plating step. Therefore, the present step is preferably performed after the electrical coupling step. Alternatively, the present step may also be performed after a singulation step described later or after an electronic-component mounting step.

Figure 27:
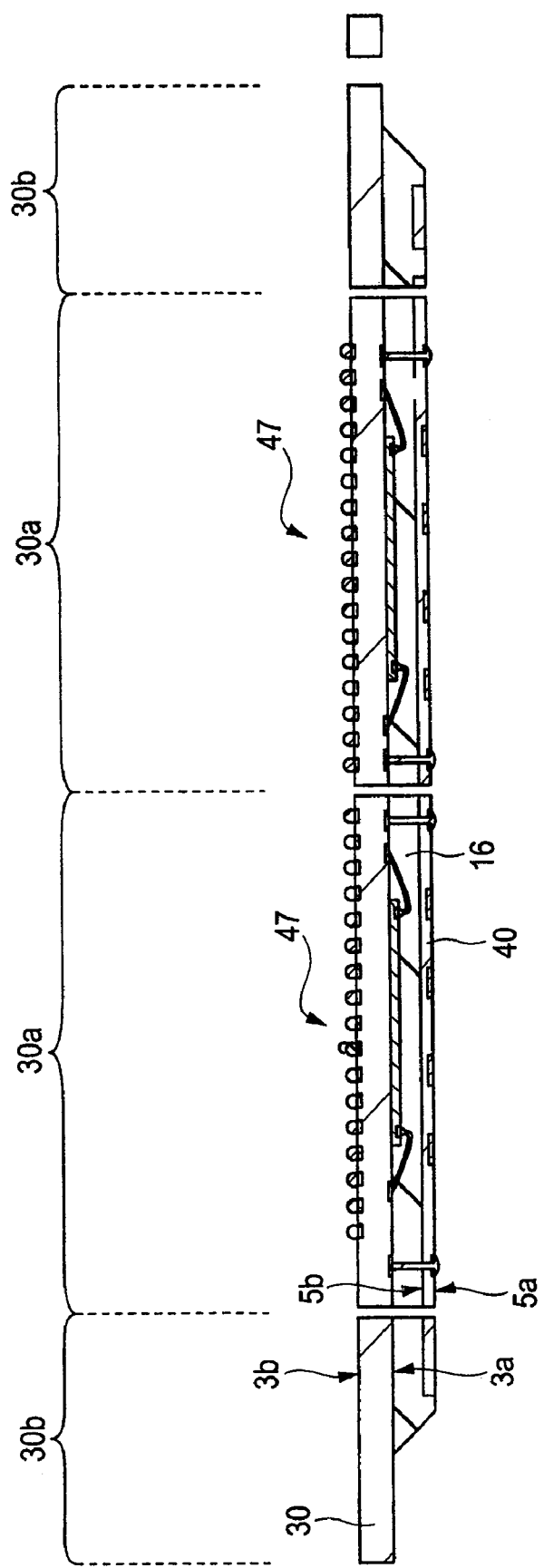
FIG. 27 is a cross-sectional view showing a state of the simultaneously sealed structure shown in FIG. 26 that has been cut.
Figure 28:
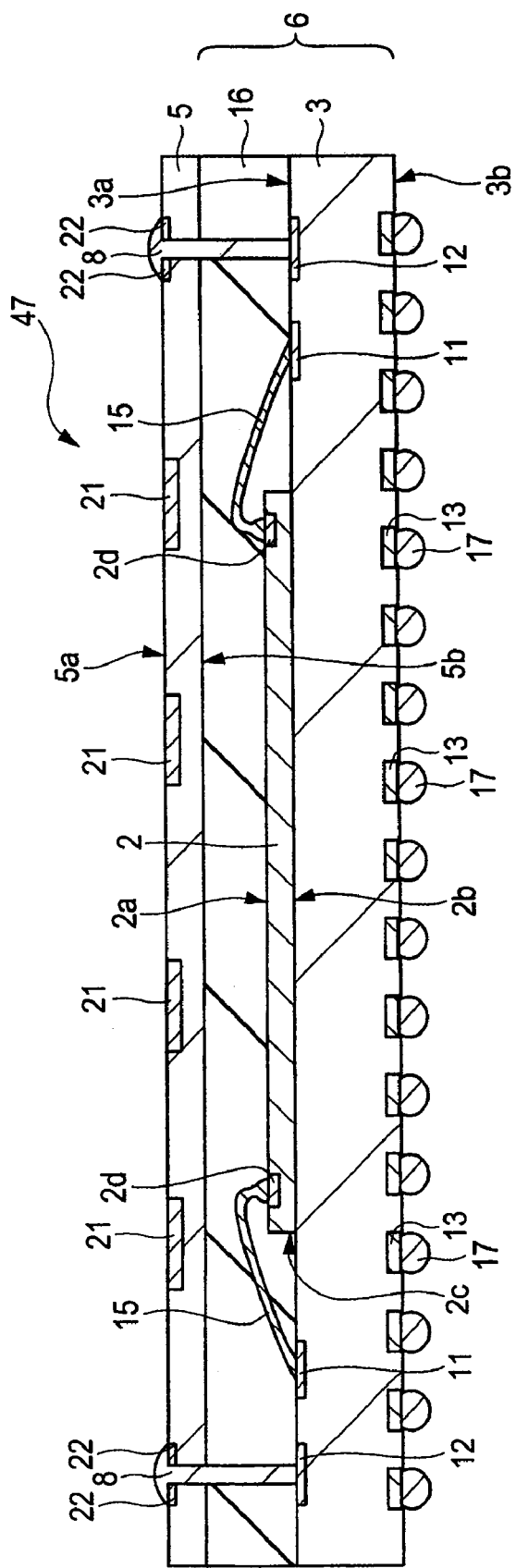
FIG. 28 is a cross-sectional view showing one of the wiring substrates shown in FIG. 26 after subjected to the singulation.

Next, in the singulation step, the simultaneously sealed structure 45 shown in FIG. 26 is cut on a per product-formation-region basis, and divided into individual packages (singulated). FIG. 27 is a cross-sectional view showing a state of the simultaneously sealed structure shown in FIG. 26 that has been cut. FIG. 28 is a cross-sectional view showing one of the wiring substrates shown in FIG. 26 after subjected to the singulation.

In the present step, the simultaneously sealed structure 45 (see FIG. 26) is cut by, e.g., scanning it along the product formation regions 30a using a cutting jig called a dicing blade so that a plurality of stacked wiring substrates (electronic devices or semiconductor devices) 47 shown in FIG. 27 or FIG. 28 are obtained.

As shown in FIG. 28, each of the stacked wiring substrates 47 is a wiring substrate in which the sub-substrate 5 is stacked over the base substrate 3. The base substrate 3 and the sub-substrate 5 are adhesively fixed to each other via the sealing resin 16, and electrically coupled to each other via the solder members 8. At the main surface 5a of the sub-substrate 5, formed are the plurality of terminals 21. The plurality of terminals 21 are electrically coupled to the lands 13 serving as the external terminals formed at the back surface 3b of the base substrate 3 via the solder members 8. Between the base substrate 3 and the sub-substrate 5, the semiconductor chip (electronic component) 2 is mounted and sealed with the sealing resin 16. That is, the stacked wiring substrate 47 is a wiring substrate having the semiconductor chip 2 embedded therein. In other words, it can also be said that the stacked wiring substrate 47 is a semiconductor device (electronic device) in which the sub-substrate 5 is adhesively fixed onto the base package 6, and the sub-substrate is electrically coupled to the base package 6.

Since the stacked wiring substrate 47 includes the base package 6, the stacked wiring substrate 47 can be electrically driven without the mounting of the chip components 4 shown in FIG. 1 over the main surface 5a of the sub-substrate 5. Therefore, the stacked wiring substrate 47 in the current condition can also be a finished product. In this case, the stacked wiring substrates 47 are subjected to an electrical inspection or an outer appearance inspection as necessary, and those of the stacked wiring substrates 47 determined to be non-defective are shipped. In this case, as necessary, the plurality of terminals 21 formed at the main surface 5a of the sub-substrate 5 serve as extended terminals for the mounting of the chip components 4 (see FIG. 1) at another place.

In the case where the POP 1 shown in FIG. 1 is assumed to be a finished product, the plurality of chip components 4 shown in FIG. 1 or FIG. 2 are mounted over the main surface 5a in the electronic-component mounting step. The plurality of terminals 4d included in the chip components 4 are electrically coupled to the plurality of terminals 21 via the solder members 23 (see FIG. 1) such as a paste-like solder called a cream solder or solder balls.

As described above, according to the present embodiment, the sealing resin 16 is formed between the base substrate 30 and the sub-substrate 40, and then the base substrate 30 is electrically coupled to the sub-substrate 40. Therefore, it is possible to inhibit air from remaining in the sealed body in the sealed-body forming step, and obtain a semiconductor device having high reliability.

Moreover, even in the case of electrically coupling the base substrate 30 to the semiconductor chip 2 via the wires 15, the wires 15 are protected by the sealing resin 16 when the base substrate 30 is electrically coupled to the sub-substrate 40. As a result, a cleaning step or the like need not be performed so that the wires 15 are not deformed by cleaning.

In addition, according to the present embodiment, the base substrate 30 and the sub-substrate 40 provided individually and distinctly are integrated with each other in the mold die 50. Accordingly, even if either one or both of the respective surfaces (main surface 3a and back surface 5a) of the base substrate 30 and the sub-substrate 40 to be faced to each other is contaminated by outgas, it is possible to easily purify the surface or surfaces by applying a plasma thereto before the base substrate 30 and the sub-substrate 40 are placed in the mold die 50. Therefore, it is possible to prevent the deterioration of the adherence between each of the wiring substrates and the sealing resin.

In general, in a POP, a lower-level package and an upper-level package are provided individually and distinctly, and then stacked. However, according to the present embodiment, the plurality of POPs can be simultaneously formed by MAP, and hence manufacturing efficiency can be improved.

Embodiment 2

In the first embodiment described above, the description has been given to the implementation of the semiconductor device in which the two wiring substrates (base members) are stacked. However, the number of the wiring substrates to be stacked is not limited to two. In the second embodiment, a description will be given to an implementation in which three or more wiring substrates (base members) are stacked. Note that, in the present embodiment, the difference between the present embodiment and the first embodiment will be primarily described, and a description overlapping that in the first embodiment is omitted in principle.

Figure 29:
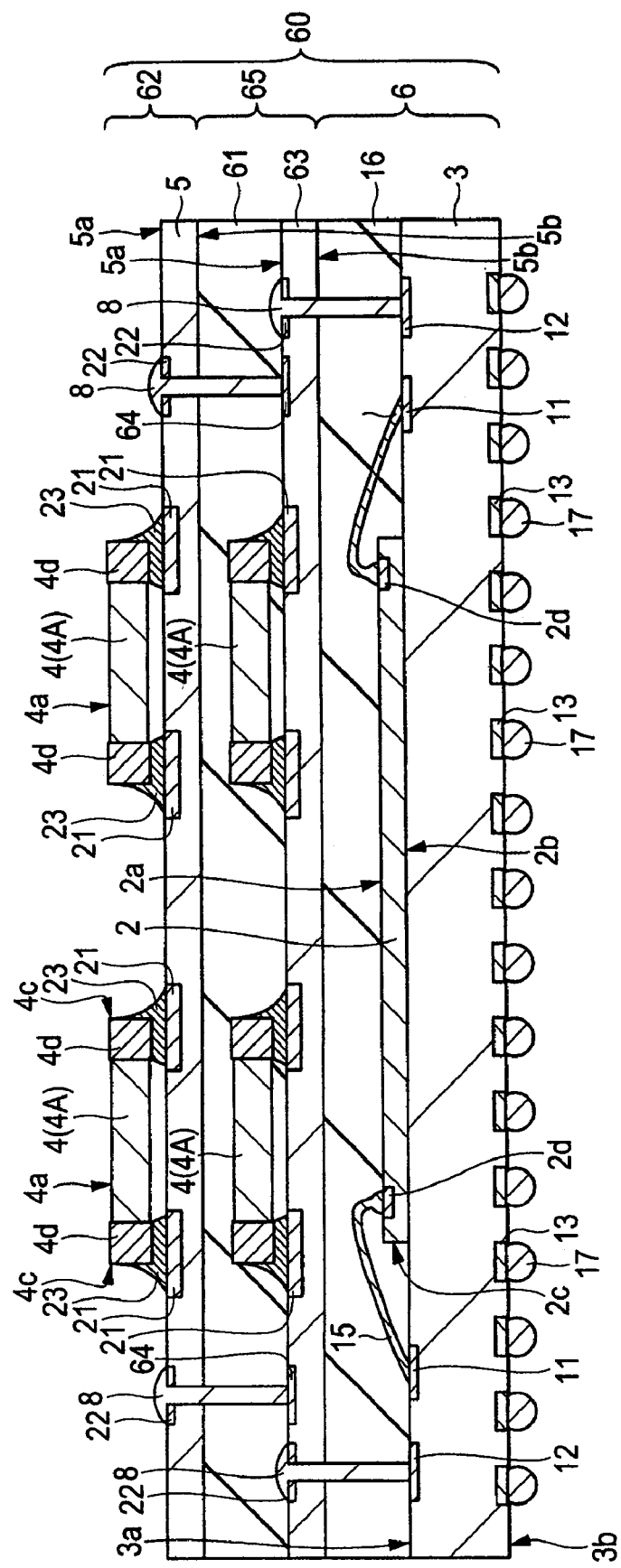
FIG. 29 is a cross-sectional view showing an overall structure of a semiconductor device as another embodiment of the present invention.

FIG. 29 is a cross-sectional view showing an overall structure of a semiconductor device according to the present embodiment. The POP 60 according to the second embodiment shown in FIG. 29 is different from the POP 1 described above in the first embodiment in that the main surface 5a of a sub-substrate 63 mounted over the base substrate 3 is sealed with a sealing resin 61, and a sub-package 62 is further mounted thereover. For example, the sub-package 62 is a package having the same structure as that of the sub-package 7 described above in the first embodiment, and has the sub-substrate 5 described above in the first embodiment. However, the layout of the lands 22 is such that the lands 22 are formed at positions not overlapping the lands 22 included in the sub-substrate 63 which are disposed on a middle level. In addition, the back surface 5b of the sub-package 62 is in closer contact with the sealing resin 61, and integrated with the sub-substrate 63. Note that a sub-package 65 disposed on the middle level and the sub-substrate 63 included in the sub-package 65 are provided with the different reference numerals so as to be distinguished from the sub-substrate 5 disposed on the uppermost level. However, the sub-package 65 and the sub-substrate 63 have the same structures as those of the sub-package 7 and the sub-substrate described above in the first embodiment except that the sealing resin 61 is formed, and a plurality of lands 64 serving as electrodes for inter-substrate coupling to the sub-substrate 5 are formed at the main surface 5a of the sub-substrate 63 in addition to the plurality of lands 22.

The lands (terminals or inter-substrate terminals) 64 formed at the main surface 5a of the sub-substrate 63 are disposed at positions overlapping the lands 22 formed on the sub-substrate 5 in the thickness direction, and electrically coupled thereto via the solder members 8. The lands 64 are also electrically coupled to the terminals 21 or the lands 22 formed at the main surface 5a of the sub-substrate 63 via wiring not shown. That is, the sub-substrate 63 disposed on the middle level is electrically coupled to the sub-substrate 5 disposed on the level over the sub-substrate 63 via the solder members 8. The sub-substrate 5 is electrically coupled to the base substrate 3 via the sub-substrate 63. Thus, by applying the technology described above in the first embodiment, it is also possible to stack three or more wiring substrates. It will be appreciated that, as described above in the first embodiment, various variations can be applied to the solder members 8 electrically coupling the sub-substrate 63 to the sub-substrate 5.

Figure 30:
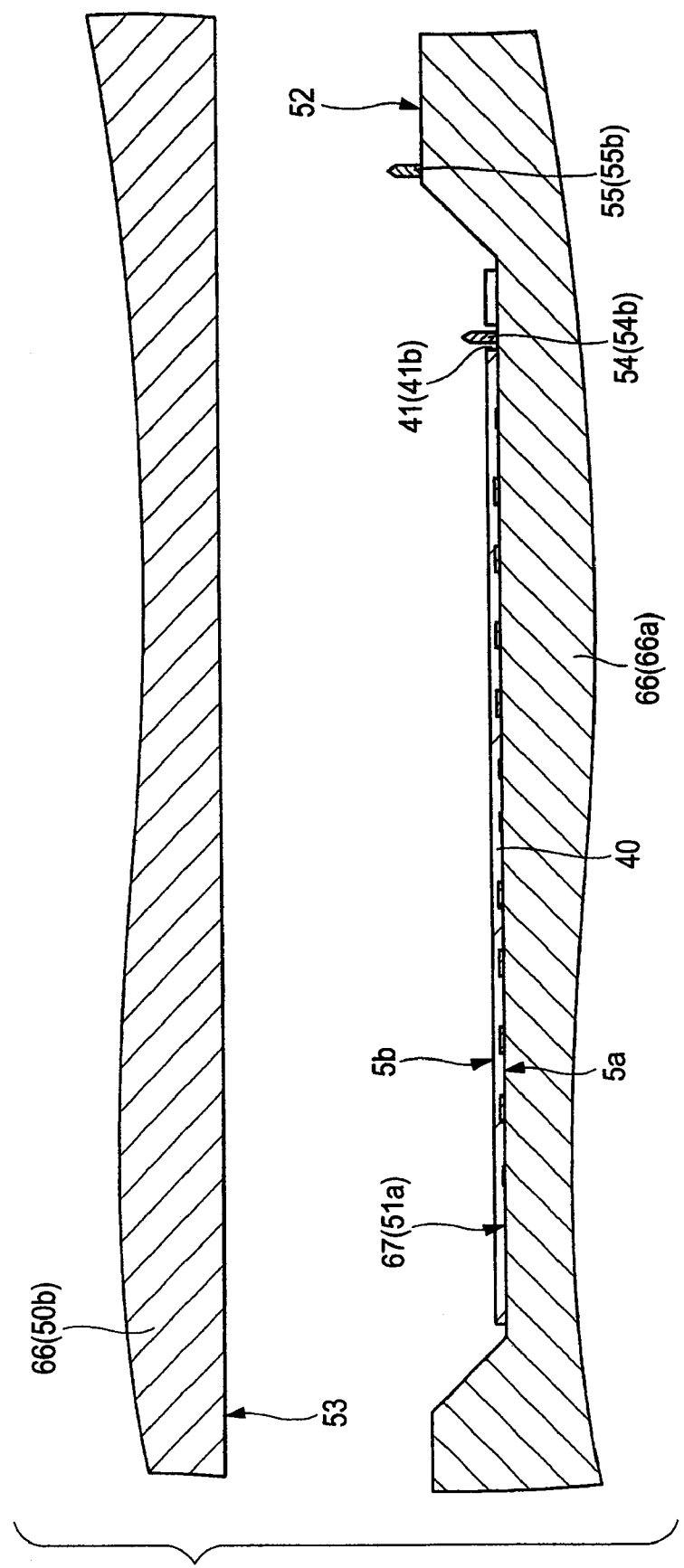
FIG. 30 is a main-portion enlarged cross-sectional view showing a third-base-member placing step in a manufacturing method of the semiconductor device as the another embodiment of the present invention.
Figure 31:
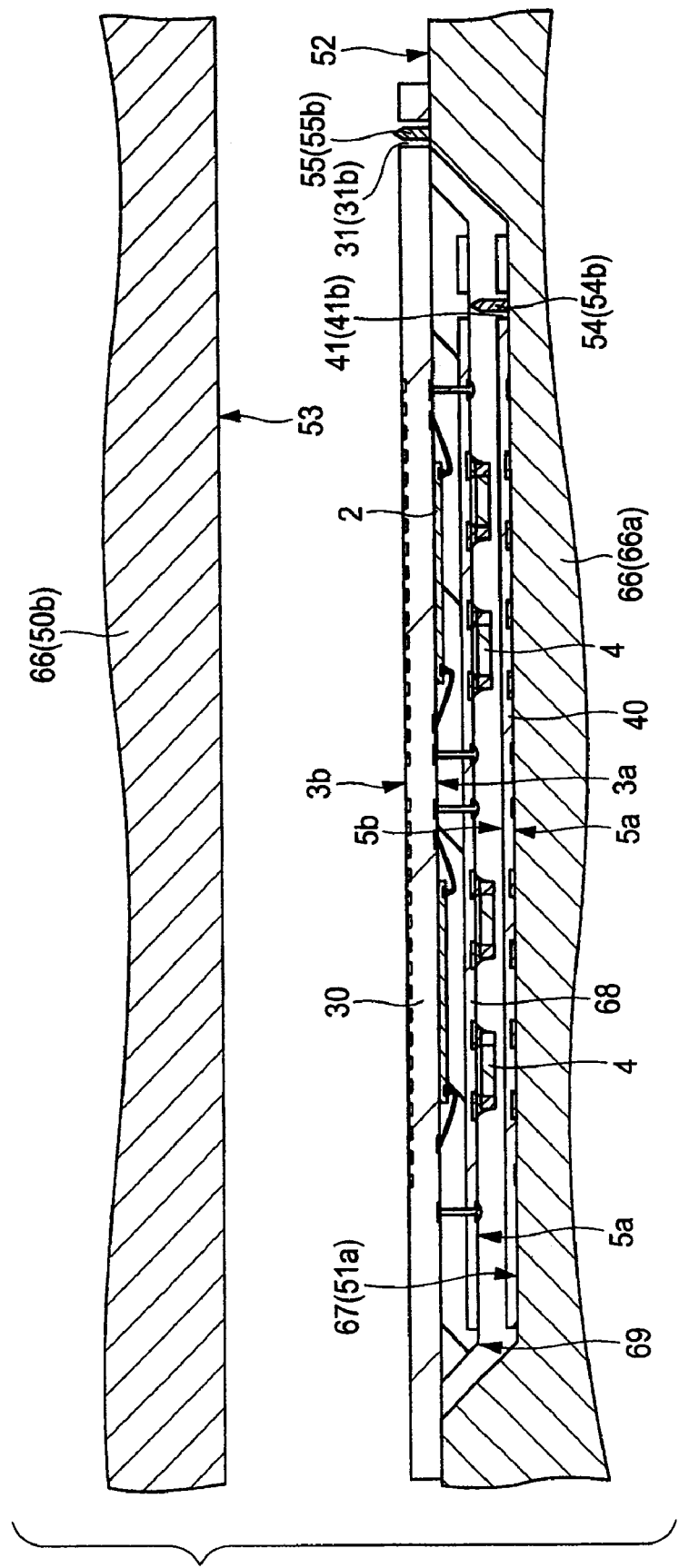
FIG. 31 is a main-portion enlarged cross-sectional view showing a state where the simultaneously sealed structure is disposed over the wiring substrate shown in FIG. 30.
Figure 32:
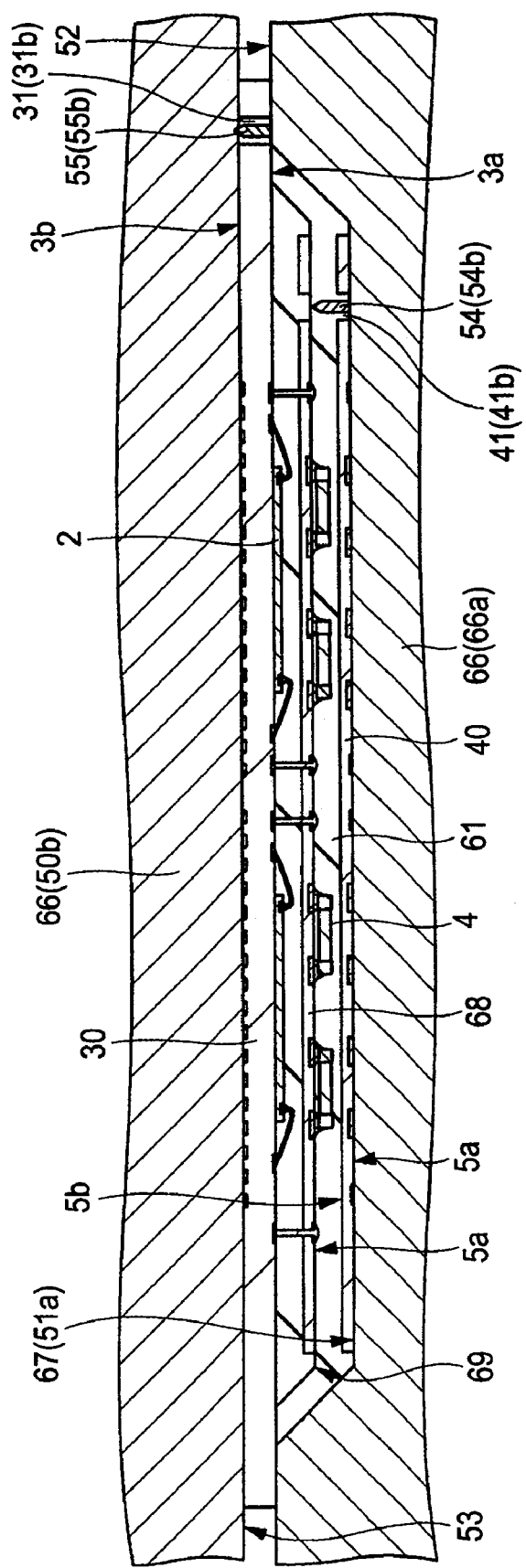
FIG. 32 is a main-portion enlarged cross-sectional view showing a state where a second sealed body is formed between the simultaneously sealed structure and the wiring substrate each shown in FIG. 31.

A semiconductor device in which three or more wiring substrates are stacked such as the POP 60 shown in FIG. 29 can be manufactured by applying the manufacturing method described above in the first embodiment. Hereinbelow, a description will be given primarily to the difference between the second embodiment and the first embodiment. FIG. 30 is a main-portion enlarged cross-sectional view showing a third-base-member placing step in the manufacturing method of the semiconductor device according to the second embodiment. FIG. 31 is a main-portion enlarged cross-sectional view showing a state where a simultaneously sealed structure is disposed over the wiring substrate shown in FIG. 30. FIG. 32 is a main-portion enlarged cross-sectional view showing a state where a second sealed body is formed between the simultaneously sealed structure and the wiring substrate each shown in FIG. 31.

In the manufacturing method of the semiconductor device according to the second embodiment, after the base-member providing step, the sealing step, the electrical coupling step, and the electronic-component mounting step each described above in the first embodiment are performed, a second sealing step is further performed.

The second sealing step is performed by so-called MAP similarly to the sealing step (first sealing step) described above in the first embodiment. First, in a mold-die providing step, a mold die 66 including the upper mold (die) 50b and a lower mold (die) 66a each shown in FIG. 30 is provided. Note that the mold die 50 (see FIG. 10) described above in the first embodiment and the second mold die 66 according to the second embodiment have the same structure except for the depth of a cavity 67 included in the lower mold 66a, i.e., the level difference between the upper surface 52 and the bottom surface 51a, and the aperture area of the cavity 67 at the upper surface 52.

The cavity 67 is formed deeper than the cavity 51 (see FIG. 9) described above in the first embodiment. This is for disposing a sub-substrate 68 and the sub-substrate 40 in spaced-apart relation, as shown in FIG. 31.

The cavity 67 is formed to have an aperture area at the upper surface 52 which is larger than the aperture area of the cavity 51. This is for causing the sealing resin 16 formed in the sealing step described above in the first embodiment to be contained in the cavity 67, and providing close contact between the upper surface 52 and the frame portion of the base substrate 30.

Next, in the third-base-member placing step, the sub-substrate 40 serving as a third base member is placed, as shown in FIG. 30. In the present step, in the same manner as in the first-base-member placing step described above in the first embodiment, the sub-substrate 40 is placed in the cavity 67 such that the main surface 5a of the sub-substrate 40 faces to the cavity 67 of the lower mold 66a (specifically, the main surface 5a faces to the bottom surface 51a of the cavity 67). Note that, at this time, the pins 54 formed over the bottom surface 51a of the cavity 67 are inserted into the hole portions 41 formed in the sub-substrate 40 in the same manner as in the first example described above.

Next, in a fourth-base-member placing step, a simultaneously sealed structure 69 in which the base substrate and the sub-substrate 68 are stacked and fixed via the sealing resin 16 is placed, as shown in FIG. 31. Note that the sub-substrate 68 is provided with the different reference numeral so as to be distinguished from the sub-substrate 40. However, the sub-substrate 68 has the same structure as that of the sub-substrate 40 described above in the first embodiment except that, in addition to the plurality of lands 22 (see FIG. 29), the plurality of lands 64 (see FIG. 29) serving as electrodes for inter-substrate coupling to the sub-substrate 40 are formed at the main surface 5a. The simultaneously sealed structure 69 is obtained by performing the electronic-component mounting step with respect to the simultaneously sealed structure 45 shown in FIG. 24 described above in the first embodiment, and mounting the chip components 4 (see FIG. 31) on the individual product formation regions 40a.

In the present step, the simultaneously sealed structure 69 is placed between the upper mold 50b and the lower mold 66a (specifically between the upper mold 50b and the sub-substrate 40) with the main surface 3a of the base substrate 30, i.e., the main surface 5a of the sub-substrate 68 facing to the back surface 5b of the sub-substrate 40. At this time, by bringing the main surface 3a of the base substrate 30 into contact with the upper surface of the lower mold 66a, the chip components 4 and the sub-substrate 40 are disposed in spaced-apart relation. Also at this time, the pins 55 formed over the upper surface 52 of the cavity 67 are inserted into the hole portions 31 formed in the base substrate 30 in the same manner as in the first embodiment described above. The hole portions 31 are disposed to be located outwardly of the cavity 51 in the first sealing step described above in the first embodiment. As a result, a surplus resin when the sealing resin 16 is formed is not buried in the hole portions 31, and therefore the hole portions 31 can be used without alteration as hole portions for alignment or as hole portions for controlling the expansion of the wiring substrates.

Next, in a sealed-body forming step, a resin for sealing is supplied between the base substrate 30 and the sub-substrate 40, and cured to form the sealing resin 61 serving as a second sealing resin, as shown in FIG. 32. The present step is performed prior to the electrical coupling step of electrically coupling the sub-substrate 68 to the sub-substrate 40, similarly to the sealing step described above in the first embodiment. Accordingly, the present step can be performed in a state where obstacles such as the inter-substrate coupling electrodes are not present. Therefore, it is possible to prevent air from remaining in the sealing resin 61 in the same manner as in the sealed-body forming step described above in the first embodiment.

Next, in a second electrical coupling step, the sub-substrate 68 is electrically coupled to the sub-substrate 40. Specifically, the lands 22 (see FIG. 29) formed at the main surface 5a of the sub-substrate 40 are electrically coupled to the lands 64 (see FIG. 29) formed at the main surface 5a of the sub-substrate 68 via conductive members such as the solder members 8 (see FIG. 29). To the present step, the electrical coupling step (first electrical coupling step) described above in the first embodiment can be applied by respectively replacing the lands 12 and the base substrate 30 in the first electrical coupling step with the lands 64 and the sub-substrate 68 so that an overlapping description is omitted.

Also, to a ball mounting step, an electronic-component mounting step, and a singulation step, the individual process steps described above in the first embodiment can be applied so that an overlapping description is omitted. Note that, in the second embodiment, in terms of securely clamping the base substrate 30 with the mold die 66 in the sealing step (second sealing step) of forming the sealing resin 61, the ball mounting step is preferably performed after the sealing step (second sealing step).

<Variation 1>

Figure 33:
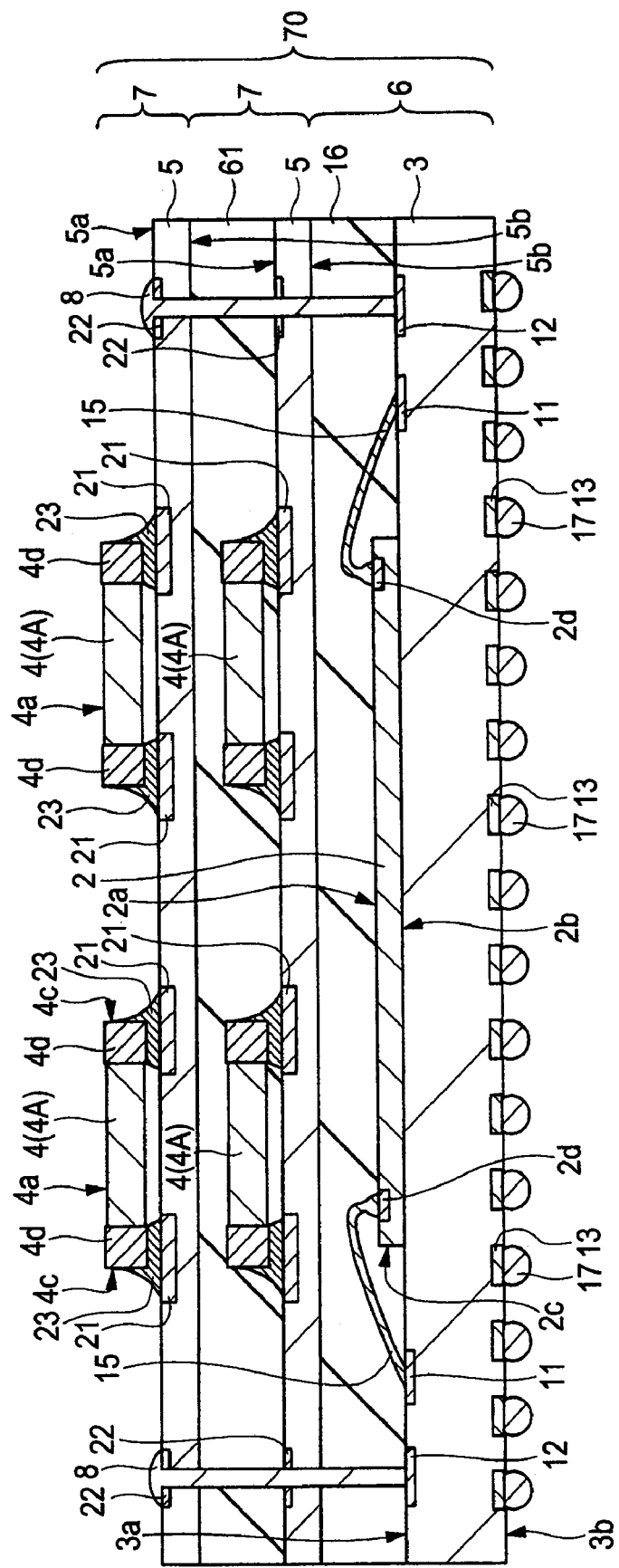
FIG. 33 is a cross-sectional view showing an overall structure of a semiconductor device as a first variation of the present invention.

Next, a first variation in which a plurality of wiring substrates are stacked over the base substrate will be described. FIG. 33 is a cross-sectional view showing an overall structure of a semiconductor device as the first variation. The difference between the POP 70 shown in FIG. 33 and the POP 60 shown in FIG. 29 lies in the locations of the lands (terminals) for inter-substrate coupling.

In the POP 70, the lands 12 and 22 serving as inter-substrate coupling terminals are disposed at positions overlapping each other in the thickness direction, and the solder members 8 extend through the plurality of sub-substrates 5 and the plurality of sealing resins 16 and 61 to be bonded to the lands 12 of the base substrate 30. In the case of thus electrically coupling each of the sub-substrates 5 to the base substrate 3 via the solder members 8 extending through the plurality of sub-substrates 5, electrical coupling steps can be simultaneously performed. This allows the simplification of the manufacturing process.

That is, after the sealing step (first sealing step) described above in the first embodiment and the second sealing step described using FIGS. 29 to 32 are performed, the electrical coupling step described above in the first embodiment is performed. In the electrical coupling step, through holes extending through the plurality of sub-substrates 5 (specifically the multi-piece substrates each corresponding to the sub-substrate 5) and the plurality of sealing resins 16 and 61 are formed from the lands 22 disposed at the main surface 3a of the sub-substrate 40 disposed on the uppermost level toward the lands 12 formed at the main surface 3a of the base substrate 30 disposed on the lowermost level and the lands 12 are exposed. Then, by forming conductive members (solder members 8) for electrically coupling the lands 12 and 22 on the individual levels to each other in the through holes, it is possible to electrically couple the individual substrates to each other. The present variation is particularly effective when applied to a semiconductor device in which a plurality of identical wiring substrates are stacked in parallel coupling.

<Variation 2>

Figure 34:
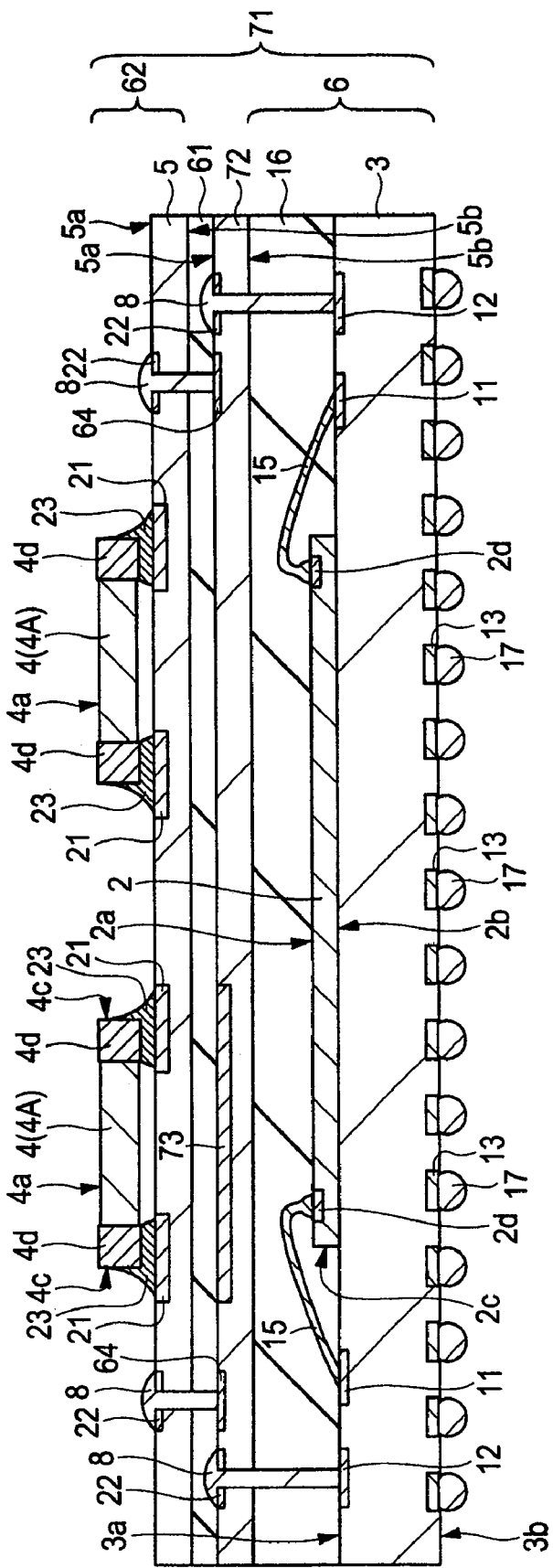
FIG. 34 is a cross-sectional view showing an overall structure of a semiconductor device as a second variation of the present invention.

Next, a second variation in which a plurality of wiring substrates are stacked over the base substrate will be described. FIG. 34 is a cross-sectional view showing an overall structure of a semiconductor device as the second variation. The POP 71 shown in FIG. 34 is different from the POP 60 shown in FIG. 29 in that the chip components 4 are not mounted over the main surface 5a of a sub-substrate 72 disposed on the middle level. In addition, wiring 73 electrically coupled to the sub-substrate 5 disposed on the upper level is formed at the main surface 5a of the sub-substrate 72.

As described above in the first embodiment, the sub-substrate 5 stacked over the base substrate 3 is provided as a single-layer wiring substrate in which wiring is formed only at the main surface 5a. However, depending on the wiring layout of the sub-substrate 5, it may be preferable to use a wiring substrate having a plurality of wiring layers in terms of reserving a wiring routing space. Accordingly, by disposing the sub-substrate 72 in which electronic components are not mounted at the main surface 5a on the middle level, and electrically coupling the sub-substrate 72 to the sub-substrate 5 as performed in the present variation, the wiring routing space can be enlarged.

To the manufacturing method of the POP 71 according to the present variation, the manufacturing method of the POP 60 described using FIGS. 29 to 32 can be applied by omitting the first-electronic-component mounting step therefrom. Therefore, an overlapping description is omitted.

<Variation 3>

Figure 35:
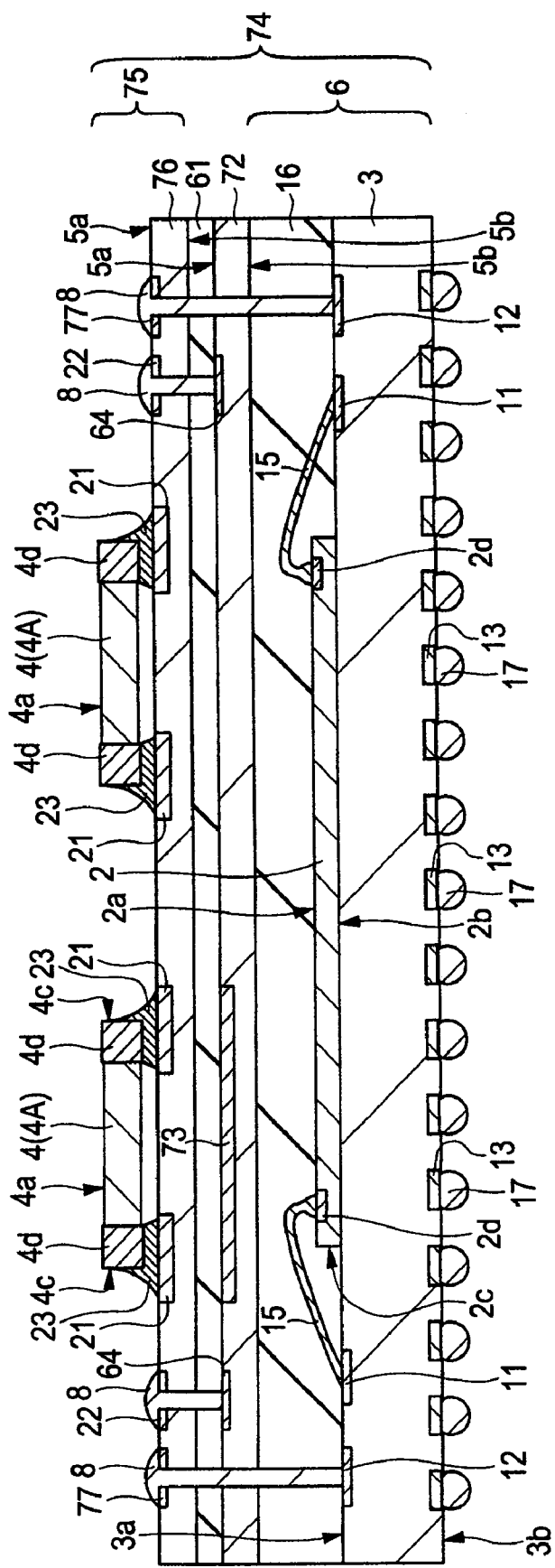
FIG. 35 is a cross-sectional view showing an overall structure of a semiconductor device as a third variation of the present invention.

Next, a third variation in which a plurality of wiring substrates are stacked will be described. FIG. 35 is a cross-sectional view showing an overall structure of a semiconductor device as the third variation. The difference between the POP 74 shown in FIG. 35 and the POP 71 shown in FIG. 34 lies in a Coupling structure between the substrates. A sub-substrate 76 included in a sub-package 75 mounted on the uppermost level in the POP 74 has a plurality of lands 77 electrically coupled to the base substrate 3 in addition to the plurality of lands 22 electrically coupled to the sub-substrate 72 disposed on the middle level over the main surface 5a thereof. Specifically, the lands 22 are electrically coupled to the lands 64 formed at the main surface 5a of the sub-substrate 72 via the solder members 8. Also, the lands 77 are electrically coupled to the lands 12 on the base substrate 30 via the solder members 8 formed to extend through the plurality of sub-substrates 5 and the plurality of sealing resins 16 and 61. The lands 22 and the lands 77 are also electrically coupled to the chip components 4 mounted on the sub-substrate 76 via wiring not shown. In the same manner as in the second variation described above, in the case of the third variation shown in FIG. 35 also, the wiring routing space can be enlarged by disposing the sub-substrate 72 in which electronic components are not mounted at the main surface 5a thereof on the middle level, and electrically coupling the sub-substrate 72 to the sub-substrate 5.

The POP 74 according to the present variation can be manufactured by, e.g., applying the manufacturing method according to the first variation described above. That is, after the sealing step (first sealing step) described above in the first embodiment and the second sealing step described using FIGS. 29 to 32 are performed, the electrical coupling step described above in the first embodiment is performed. In this case, in the electrical coupling step, through holes extending through the plurality of sub-substrates 76 and 72 and the plurality of sealing resins 16 and 61 are formed from the lands 77 disposed over the main surface 3a of the sub-substrate (specifically a multi-piece substrate corresponding to the sub-substrate 76) disposed on the uppermost level toward the lands 12 formed at the main surface 3a of the base substrate 30 disposed on the lowermost level and the lands 12 are exposed. In addition, from the lands 22, through holes extending through the sub-substrate 76 and the plurality of sealing resins 61 are formed toward the lands 64 formed at the main surface 5a of the sub-substrate 72 (specifically a multi-piece substrate corresponding to the sub-substrate 72) disposed in the layer under the lands 22 and the lands 64 are exposed. Then, by forming conductive members (solder members 8) for electrically coupling the lands 12, the lands 77, the lands 22, and the lands 64 to each other in the respective through holes, the individual substrates can be electrically coupled to each other. According to the present variation, the inter-substrate coupling terminals on the individual levels can be individually coupled to each other so that the flexibility of the wiring layout is improved. It will be appreciated that the present variation can also be applied to the first variation described above.

<Variation 4>

Figure 36:
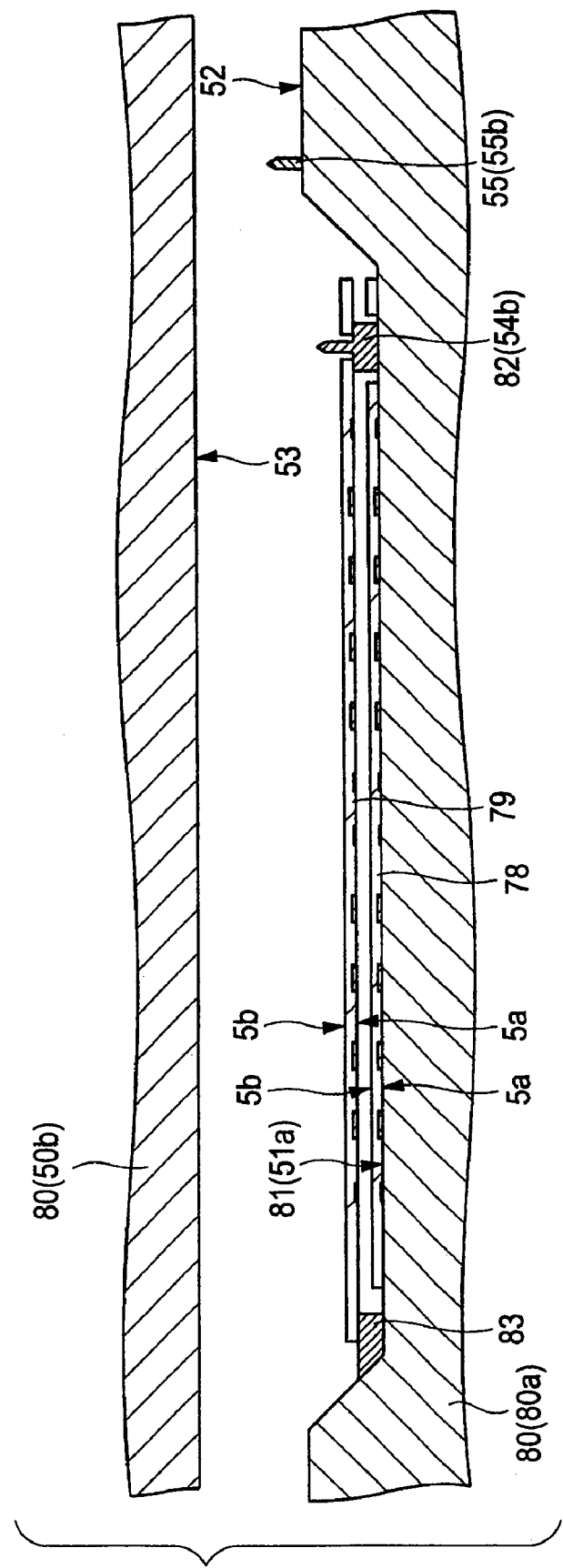
FIG. 36 is a main-portion enlarged cross-sectional view showing a state where a plurality of wiring substrates are placed in the cavity of a mold die in a first-base-member placing step according to the variation of a manufacturing method of the present invention.
Figure 38:
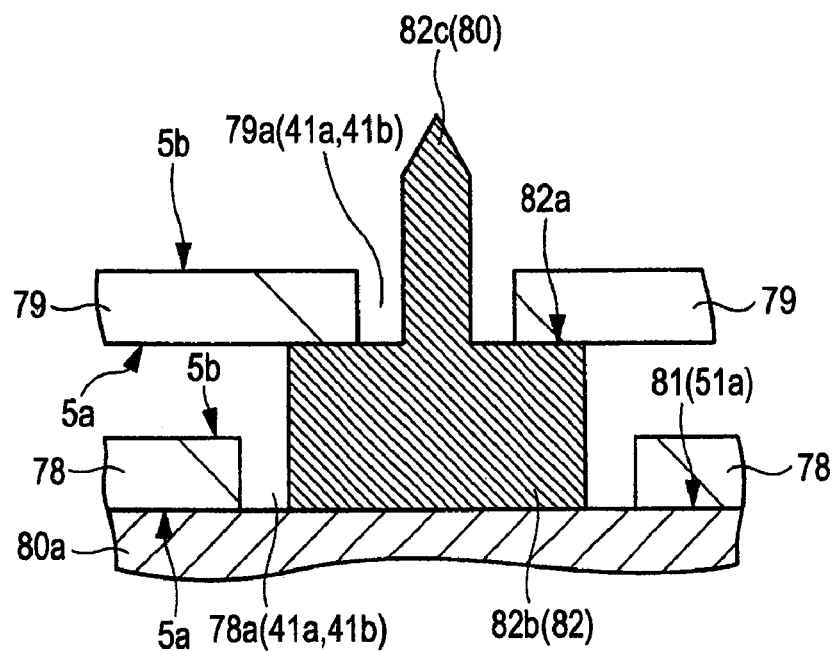
FIG. 38 is a main-portion enlarged cross-sectional view showing the vicinity of the alignment pin shown in FIG. 36 in enlarged relation.
Figure 39:
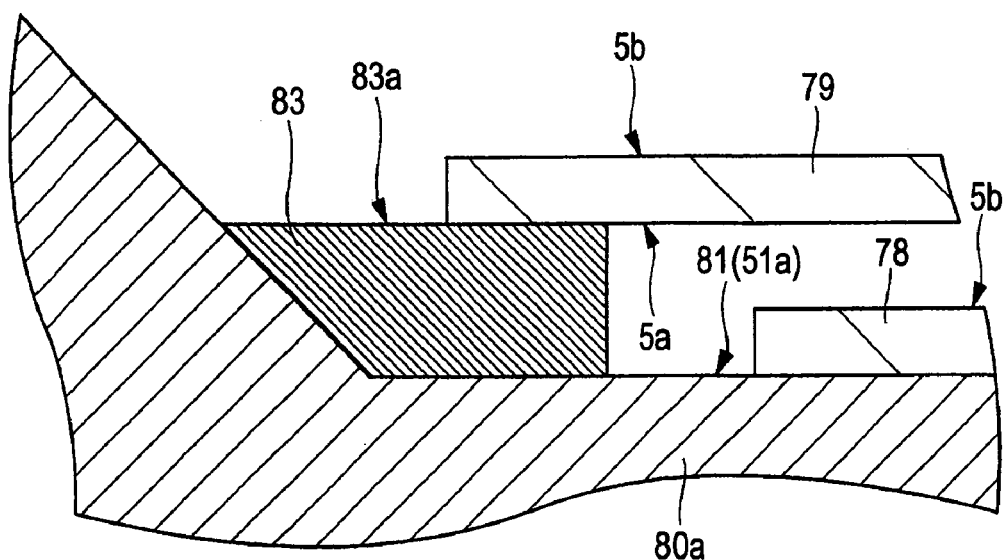
FIG. 39 is a main-portion enlarged cross-sectional view showing the vicinity of each of the support stands shown in FIG. 36.

The POP 74 shown in FIG. 35 can also be manufactured by a manufacturing method other than that according to the third variation described above by applying the manufacturing method described above in the first embodiment. Hereinbelow, the other manufacturing method will be described as a fourth variation. FIG. 36 is a main-portion enlarged cross-sectional view showing a state where the plurality of wiring substrates are placed in the cavity of the mold die in the first-base-member placing step according to the present variation. FIG. 39 is a main-portion enlarged plan view showing the upper surface of the lower mold shown in FIG. 36. FIG. 38 is a main-portion enlarged cross-sectional view showing the vicinity of the alignment pin shown in FIG. 36 in enlarged relation. FIG. 39 is a main-portion enlarged cross-sectional view showing the vicinity of each of the support stands shown in FIG. 36.

The manufacturing method according to the present variation described below is different from the manufacturing method described above in the first embodiment in that, in the sealing step, the plurality of sub-substrates (base members) are placed before the base substrate is placed, and simultaneously sealed. That is, as described in the second embodiment or each of the first to third variations, three or more wiring substrates (base members) are preliminarily placed in stacked relation, and sealing resins are simultaneously formed between the individual wiring substrates, instead of using the method in which the sealing resins are formed successively between the pairs of wiring substrates (base members) placed in facing relation.

In the present variation, in the first-base-member placing step included in the sealing step described above in the first embodiment, the plurality of wiring substrates, i.e., the sub-substrate 78 and the sub-substrate 79 each shown in FIG. 36 are successively placed in the lower mold (die) 80a of a mold die 80. Note that each of the sub-substrates 78 and 79 is a multi-piece wiring substrate having the same structure as that of the sub-substrate 40 described above in the first embodiment except for the locations of the lands serving as the inter-substrate coupling terminals, the layout of the wires formed at the main surface 5a, the size of the outer shape, and the aperture diameters of the hole portions.

The mold die 80 used in the sealing step according to the present variation is different from the mold die 50 (see FIG. 10) described above in the first embodiment in the following points. First, in the mold die 80 according to the present variation, the depth of the cavity 81 included in the lower mold 80a, i.e., the level difference between the upper surface 52 and the bottom surface 51a is larger. This is for placing the three or more wiring substrates (base members) in mutually spaced-apart relation. In addition, the shapes of pins 82 disposed over the bottom surface 51a of the cavity 81 are different from those of the pins 54 described above in the first embodiment. Moreover, support stands 83 for supporting the sub-substrate 79 disposed in the upper layer are disposed along the side facing to the long side 51c to which the pins 54 are disposed closer. The pins 82 having the shapes different from those of the pins 54 and the support stands 83 are provided for placing the sub-substrates 78 and 79 in spaced-apart relation.

The following is a detailed description. As shown in FIG. 38, each of the pins 82 has a receiving portion 82b having a receiving surface 82a located on the opposite side of the bottom surface 51a of the cavity 81. The pin 82 also has a protruding portion (projecting portion) 82c disposed over the generally center of the receiving surface 82a and protruding in the direction opposing to the bottom surface 51a. On the other hand, each of the support stands 83 shown in FIG. 39 has a receiving surface 83a located on the opposite side of the bottom surface 51a of the cavity 81. The receiving surface 82a and the receiving surface 83a are at the same height from the bottom surface 51a of the cavity 81, and the sub-substrate 79 disposed on the upper level is supported in a state spaced apart from the sub-substrate 78 by having the main surface 5a thereof in contact with the receiving surfaces 82a and 83a.

In the first-base-member placing step according to the present variation, the sub-substrate 78 which is a multi-piece wiring substrate corresponding to the sub-substrate 76 shown in FIG. 35 is first placed in the cavity 81 such that the main surface 5a faces to the bottom surface 51a. A hole portion 78a formed in the sub-substrate 78 has an aperture diameter larger than the diameter of the receiving surface 82a so that the receiving portion 82b is inserted into the hole portion 78a when the sub-substrate 78 is placed. As a result, the main surface 5a of the sub-substrate 78 comes into contact with the bottom surface 51a. In the sealing step according to the present variation, the receiving portion 82b performs the function of the pins 54 described above in the first embodiment. Note that, since the other characteristic features of the hole portion 78a are the same as those of the hole portions 41 described above in the first embodiment, an overlapping description is omitted.

Next, the sub-substrate 79 which is a multi-piece wiring substrate corresponding to the sub-substrate 72 shown in FIG. 35 is placed in the cavity 81 such that the main surface 5a faces to the back surface 5b of the sub-substrate 78. Here, a hole portion 79a formed in the sub-substrate 79 has an aperture diameter larger than the protruding portion 82c, and smaller than the receiving surface 82a. Accordingly, when the sub-substrate 79 is placed, the protruding portion 82c is inserted into the hole portion 78a, and the sub-substrate 79 is placed over the receiving surface 82a. Note that the sub-substrate 79 is formed to have short sides longer than those of the sub-substrate 78. Accordingly, on the long side 51c facing to the long side 51c (see FIG. 37) along which the pins 82 are disposed, the main surface 5a of the sub-substrate 79 is in contact with the receiving surface 83a of each of the support stands 83, as shown in FIG. 39. As a result, the sub-substrate 79 is placed in a state generally parallelly spaced apart from the sub-substrate 78. In the sealing step according to the present variation, the protruding portion 82c performs the function of the pins 54 described above in the first embodiment with respect to the sub-substrate 79. Note that, since the other features of the hole portion 79a are the same as those of the hole portions 41 described above in the first embodiment, an overlapping description is omitted.

Next, the second-base-member placing step, the clamping step, the sealed-body forming step, and the retrieving step each described above in the first embodiment are performed to obtain the simultaneously sealed body in which the three wiring substrates are formed integrally via the sealing resins. Note that, in the sealed-body forming step in the present variation, the sub-substrate 79 is placed between the sub-substrate 78 disposed in the lowermost layer and the base substrate 30 (see FIG. 14) so that resistance when the resin for sealing is supplied is higher than in the first embodiment described above. However, in the present variation, the sub-substrate 78 and the sub-substrate 79 are placed in spaced-apart relation to be generally in parallel using the pins 82 and the support stands 83. This allows the resin for sealing to be reliably supplied also between the sub-substrate 78 and the sub-substrate 79. Therefore, it is possible to prevent air from remaining in the formed sealing resin 61.

In addition, by varying the aperture diameters of the hole portions 78*a* and 79*a* of the sub-substrates 78 and 79, the respective clearances between the hole portion 78*a* and the receiving portion 82*b* and between the hole portion 79*a* and the protruding portion 82*c* can be adjusted properly. This allows the respective two-dimensional positions of the sub-substrate 78, the sub-substrate 79, and also the base substrate 30 to be aligned with high accuracy. Therefore, in the electrical coupling step, it is possible to provide reliable coupling between the lands 22 and the lands 64 and between the lands 77 and the lands 12 each shown in FIG. 35 and serving as the inter-substrate coupling terminal.

Also in the present variation, not only the electrical coupling steps, but also the sealing steps can be simultaneously performed. Therefore, the manufacturing process can further be simplified as compared to those of the manufacturing methods according to the three variations described above.

Figure 37:
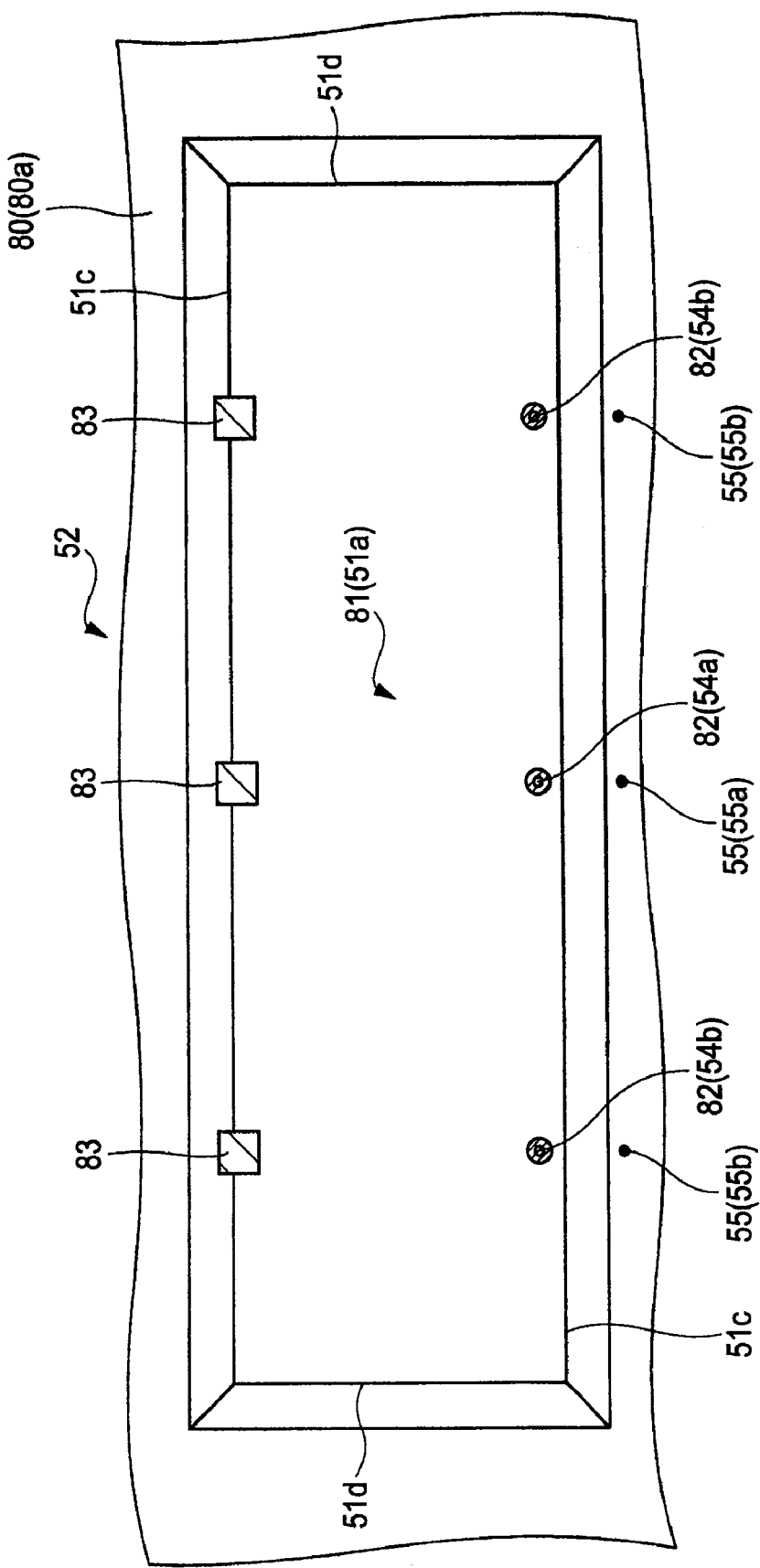
FIG. 37 is a main-portion enlarged plan view showing the upper surface of the lower mold shown in FIG. 36.

As another implementation of the present variation, it can also be considered that the pins 82 are also disposed along the side along which the support stands 83 shown in FIG. 37 are arranged, and the hole portions 78*a* and 79*a* are each arranged along the facing long side. However, in terms of controlling the direction of the thermal expansion of the wiring substrates in the sealing step, it is particularly preferable to dispose the pins 82 or the hole portions 78*a* and 79*a* closer to one of the opposing sides, as performed in the present variation.

While the invention achieved by the present inventors has been specifically described heretofore based on the embodiments of the present invention, it will be appreciated that the present invention is not limited to the foregoing embodiments thereof, and various changes and modifications can be made in the invention within the scope not departing from the gist thereof.

For example, in each of the first and second embodiments described above, the semiconductor chip mounted by the face-up mounting method, and electrically coupled to the base substrate via the wires has been described as an example of the semiconductor chip mounted on the base substrate. However, the mounting form of the semiconductor chip is not limited thereto. For example, it is also possible to use a semiconductor chip mounted over a wiring substrate via bump electrodes with the main surface of the semiconductor chip facing to the main surface of the wiring substrate by a face-down mounting method which mounts the semiconductor chip through so-called flip-chip coupling. In the case of mounting a semiconductor chip by a face-down mounting method, the mounting of the semiconductor chip is typically performed with the back surface of the semiconductor chip being exposed. However, in the case of applying the technology described in the present application, the back surface of the semiconductor chip is also covered with the sealing resin. By forming the sealing resin also over the back surface of the semiconductor chip, it is possible to provide generally equal distances between the individual wiring substrates. As a result, the respective two-dimensional positions of the individual substrates can be aligned with high accuracy. Moreover, since it is possible to improve the strength, moisture resistance, and the like of the finished semiconductor device by filling the gaps between the individual substrates with sealing resins, reliably can be improved.

In each of the first and second embodiments, the semiconductor device having the semiconductor chip or the wiring substrates having the semiconductor chips embedded therein have been described. However, the present invention is also applicable to an electronic device in which a semiconductor chip is not mounted. For example, it is also possible to replace the semiconductor chip 2 or each of the chip components 4 described above in the first and second embodiments with an electronic component other than semiconductor chip.

To the base substrates and the sub-substrates described above in the first and second embodiments also, various variations can be applied. For example, in the foregoing first embodiment, the glass-epoxy-type resin substrate has been described as an example of each of the sub-substrates 5 and 40. However, instead of this, a ceramic substrate can also be used. Otherwise, a tape substrate (film substrate) or the like made of, e.g., a polyimide resin or the like can also be used. In the foregoing first embodiment, the wiring substrate made of a pre-preg has been described as an example of the base substrate 30. However, instead of this, a ceramic substrate can also be used. Otherwise, as the base substrate 30, a lead frame having a chip mounting portion and a plurality of leads arranged around the chip mounting portion can also be used. However, as described above in the first embodiment, the sub-substrate is supported by bringing the upper surface 52 of the lower mold 50*a* into contact with the frame portion 30*b* of the base substrate 30 in the sealing step so that the base substrate 30 is required to have a given rigidity. On the other hand, in the case of forming the sealing resin using the mold die having the cavity formed in the lower mold thereof, the wiring substrate disposed in the lowermost layer is pressed against the bottom surface by its own weight or by the pressure of the supplied resin for sealing. Accordingly, a material having a low rigidity such as a tape substrate can be used.

Figure 40:
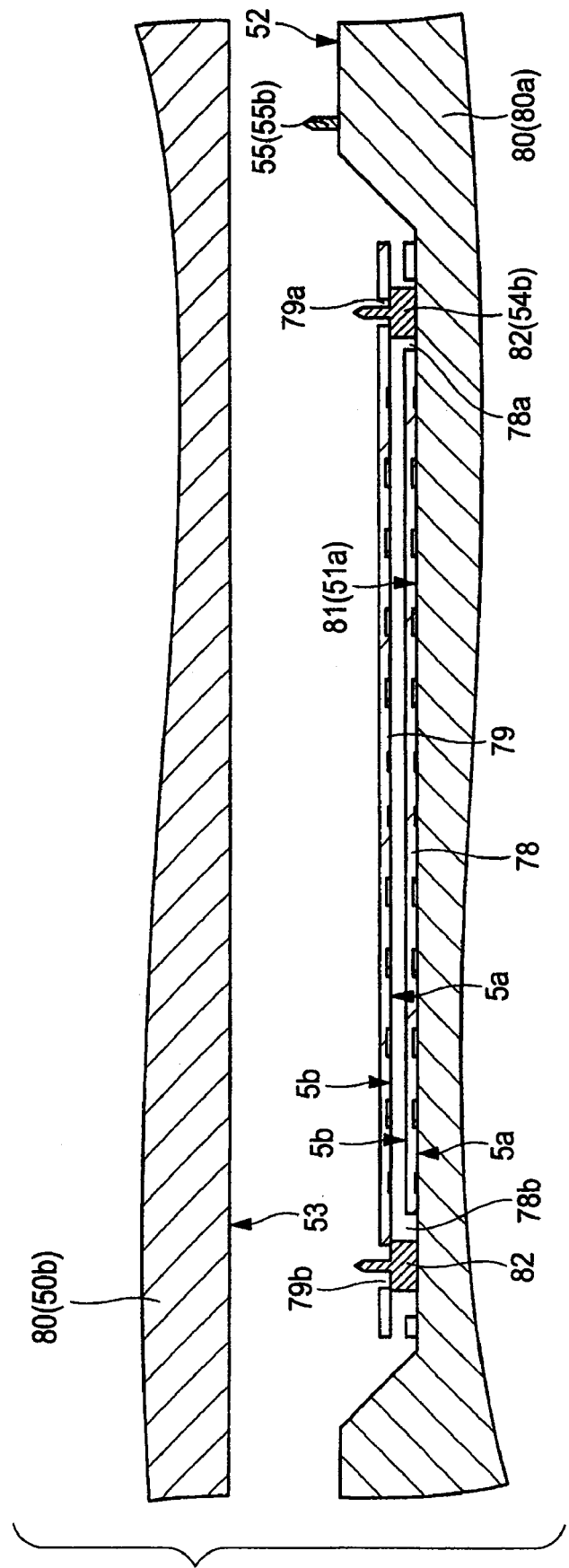
FIG. 40 is a main-portion enlarged cross-sectional view showing a variation of a fourth variation described using FIG. 36.

In the foregoing fourth variation, the method has been described in which the support stands 83 are provided in the mold die 50 to space the sub-substrates 78 and 79 apart from each other. However, the means for spacing the sub-substrates 78 and 79 apart from each other is not limited thereto. FIG. 40 is a main-portion enlarged cross-sectional view showing a variation of the fourth variation described using FIG. 36. In FIG. 40, the pins 82 are disposed instead of the support stands 83 shown in FIG. 36. That is, in the sub-substrates 78 and 79, the pins 82 are arranged along the other long sides facing to the long sides along which the plurality of hole portions 78*a* and 79*a* are formed. When the pins 82 are thus arranged along the facing side, if the sub-substrates 78 and 79 expand or contract and come in contact with the pins 82, the expansion or contraction of the sub-substrates 78 and 79 may be hindered thereby.

Accordingly, in the variation shown in FIG. 40, hole portions 78*b* and 79*b* having diameters larger than those of the hole portions 78*a* and 79*a* are formed along the other long sides facing to the long sides along which the plurality of hole portions 78*a* and 79*a* are formed in the sub-substrates 78 and 79. That is, the gaps between the hole portions 78*b* and 79*b* and the pins 82 are larger than the gaps between the hole portions 78*a* and 79*a* and the pins 82. As a result, even when the sub-substrate 79 expands or contracts around the smaller-diameter hole portions 78*a* and 79*a* serving as the base points, it is possible to prevent or inhibit the pins 82 from hindering the expansion or contraction of the sub-substrate 79.

The present invention can be used for an electronic device (semiconductor device) in which, over the main surface of a base member having an electronic component such as a semiconductor chip mounted thereon, another wiring substrate is further stacked.

What is claimed is:

1. A manufacturing method of a semiconductor device, comprising the steps of:
   (a) providing a mold die including a first die having a first surface, and a second die formed with a recessed portion and having a second surface facing to the first surface;
   (b) disposing a first base member, having a first main surface, a plurality of first electrode pads formed on the first main surface, a plurality of first wires coupled individually to the first electrode pads, a plurality of first lands coupled individually to the first wires, and a first back surface opposing to the first main surface, in the recessed portion of the second die such that the first main surface faces to the recessed portion of the second die;
   (c) after the step (b), disposing a second base member, having a second main surface, a plurality of second electrode pads formed on the second main surface, a plurality of second wires coupled individually to the second electrode pads, a plurality of second lands coupled individually to the second wires, and a second back surface opposing to the second main surface and has a semiconductor chip mounted over the second main surface, between the first die and the second die such that the second main surface faces to the first back surface of the first base member;
   (d) after the step (c), clamping the second base member with the first die and the second die;
   (e) after the step (d), supplying a resin between the first base member and the second base member, and forming a sealed body between the first base member and the second base member;
   (f) after the step (e), retrieving the first base member and the second base member each formed with the sealed body from between the first die and the second die;
   (g) after the step (f), forming through holes from the first lands of the first base member toward the second lands of the second base member, and exposing the second lands; and
   (h) after the step (g), forming a conductive member in each of the through holes.

2. A manufacturing method of the semiconductor device according to claim 1,
   wherein the first base member has a first hole portion formed from the first main surface toward the first back surface,
   wherein, in the step (b), the first base member is placed in the recessed portion of the second die such that a first pin formed in the recessed portion of the second die is located in the first hole portion of the first base member,
   wherein the second base member has a second hole portion formed from the second main surface toward the second back surface, and
   wherein, in the step (c), the second base member is placed between the first die and the second die such that a second pin formed at the second surface of the second die is located in the second hole portion of the second base member.

3. A manufacturing method of the semiconductor device according to claim 2,
   wherein each of the first main surface of the first base member and the second main surface of the second base member has a quadrilateral two-dimensional shape,
   wherein the first hole portion is disposed closer to a first one of the four sides of the first main surface, and
   wherein the second hole portion is disposed closer to a second one of the four sides of the second main surface that is disposed along the first side of the first main surface.

4. A manufacturing method of the semiconductor device according to claim 3,
   wherein each of the first main surface of the first base member and the second main surface of the second base member has a rectangular two-dimensional shape, and
   wherein each of the first side and the second side is a long side.

5. A manufacturing method of the semiconductor device according to claim 4,
   wherein a plurality of the first hole portions are formed along the first side, and a plurality of the second hole portions are formed along the second side.

6. A manufacturing method of the semiconductor device according to claim 5,
   wherein the first hole portions include a first middle hole portion disposed at the middle of the first side and first side hole portions disposed on both sides of the first middle hole portion and along the first side,
   wherein the second hole portions include a second middle hole portion disposed at the middle of the second side and second side hole portions disposed on both sides of the second middle hole portion and along the second side,
   wherein an aperture area of each of the first side hole portions is larger than an aperture area of the first middle hole portion, and
   wherein an aperture area of each of the second side hole portions is larger than an aperture area of the second middle hole portion.

7. A manufacturing method of the semiconductor device according to claim 2,
   wherein the first base member has a first product formation region where the first electrode pads, the first wires, and the first lands are formed, and a first frame portion disposed outwardly of the first product formation region,
   wherein the second base member has a second product formation region where the second electrode pads, the second wires, and the second lands are formed, and a second frame portion disposed outwardly of the second product formation region, and
   wherein the first hole portion is formed in the first frame portion, and the second hole portion is formed in the second frame portion.

8. A manufacturing method of the semiconductor device according to claim 1,
   wherein, in the steps (b) through (e), the second die is disposed under the first die.

9. A manufacturing method of the semiconductor device according to claim 1,
   wherein the first base member and the second base member are wiring substrates having insulating layers, and wiring layers formed at respective surfaces of the insulating layers, and
   wherein the number of the wiring layers of the second base member is larger than the number of the wiring layers of the first base member.

10. A manufacturing method of the semiconductor device according to claim 9, wherein the first wires are formed at the first main surface of the first base member, while no wire is formed at the first back surface.

11. A manufacturing method of the semiconductor device according to claim 1,
wherein the conductive member is made of a solder, and
wherein a plurality of third lands electrically coupled individually to the second electrode pads and to the second lands are formed at the second back surface of the second base member,
the manufacturing method of the semiconductor device, further comprising the step of:
after the step (h), bonding a plurality of solder balls individually to the third lands,
wherein a melting point of the conductive member is higher than a melting point of each of the solder balls.

* * * * *